United States Patent
Fazan et al.

(10) Patent No.: US 7,385,240 B2
(45) Date of Patent: *Jun. 10, 2008

(54) STORAGE CELL CAPACITOR COMPATIBLE WITH HIGH DIELECTRIC CONSTANT MATERIALS

(75) Inventors: Pierre C. Fazan, Boise, ID (US); Viju K. Mathews, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/276,639

(22) Filed: Mar. 8, 2006

(65) Prior Publication Data

US 2006/0138510 A1    Jun. 29, 2006

Related U.S. Application Data

(60) Division of application No. 10/939,928, filed on Sep. 13, 2004, now Pat. No. 7,153,707, which is a continuation of application No. 09/489,954, filed on Jan. 24, 2000, now Pat. No. 6,791,131, which is a division of application No. 08/572,392, filed on Dec. 14, 1995, now Pat. No. 6,030,847, which is a continuation-in-part of application No. 08/390,336, filed on Feb. 17, 1995, now Pat. No. 5,478,772, which is a continuation of application No. 08/044,331, filed on Apr. 2, 1993, now abandoned.

(51) Int. Cl.
*H01L 27/108* (2006.01)
(52) U.S. Cl. .................. 257/298; 257/E21.016; 438/254
(58) Field of Classification Search .......... 257/298, 257/516, E21.016; 438/387, 254

See application file for complete search history.

(56) References Cited

U.S. PATENT DOCUMENTS

| | | | |
|---|---|---|---|
| 3,728,694 A | 4/1973 | Rohrer | |
| 3,939,292 A | 2/1976 | Rohrer | |
| 4,195,355 A | 3/1980 | Rohrer | |
| 4,458,410 A | 7/1984 | Sugaki et al. | |
| 4,623,912 A | 11/1986 | Chang et al. | |
| 4,782,309 A | 11/1988 | Benjaminson | |
| 4,903,110 A | 2/1990 | Aono | |
| 4,910,578 A | 3/1990 | Okamoto | |
| 4,966,868 A | 10/1990 | Murali et al. | |
| 4,982,309 A | 1/1991 | Shepard | |
| 5,005,072 A | 4/1991 | Gonzalez | |
| 5,005,102 A | 4/1991 | Larson | |
| 5,046,043 A | 9/1991 | Miller et al. | |
| 5,049,517 A * | 9/1991 | Liu et al. | 438/397 |
| 5,049,975 A | 9/1991 | Ajika et al. | |
| 5,053,351 A | 10/1991 | Fazan et al. | |
| 5,053,917 A | 10/1991 | Miyasaka et al. | |
| 5,098,860 A | 3/1992 | Chakravorty et al. | |
| 5,099,305 A | 3/1992 | Takenaka | |
| 5,111,355 A | 5/1992 | Anand et al. | |
| 5,116,463 A | 5/1992 | Lin et al. | |
| 5,134,451 A | 7/1992 | Katoh | |
| 5,140,389 A * | 8/1992 | Kimura et al. | 257/309 |
| 5,141,897 A | 8/1992 | Manocha et al. | |
| 5,162,248 A | 11/1992 | Dennison et al. | |
| 5,168,073 A | 12/1992 | Gonzalez et al. | |
| 5,171,713 A | 12/1992 | Matthews | |
| 5,185,689 A | 2/1993 | Maniar et al. | |
| 5,187,638 A | 2/1993 | Sandhu et al. | |
| 5,189,503 A | 2/1993 | Suguro et al. | |
| 5,198,384 A | 3/1993 | Dennison | |
| 5,248,628 A | 9/1993 | Okabe et al. | |
| 5,266,513 A | 11/1993 | Fazan et al. | |
| 5,293,510 A | 3/1994 | Takenaka | |
| 5,321,648 A | 6/1994 | Dennison et al. | |
| 5,335,138 A | 8/1994 | Sandhu et al. | |
| 5,340,765 A | 8/1994 | Dennison et al. | |
| 5,366,920 A | 11/1994 | Yamamichi et al. | |
| 5,381,302 A | 1/1995 | Sandhu et al. | |
| 5,387,532 A | 2/1995 | Hamamoto et al. | |
| 5,391,511 A | 2/1995 | Doan et al. | |
| 5,392,189 A | 2/1995 | Fazan et al. | |
| 5,396,094 A | 3/1995 | Matsuo | |

| | | | |
|---|---|---|---|
| 5,401,680 | A | 3/1995 | Abt et al. |
| 5,422,315 | A | 6/1995 | Kobayashi |
| 5,471,364 | A | 11/1995 | Summerfelt et al. |
| 5,478,772 | A | 12/1995 | Fazan |
| 5,489,548 | A | 2/1996 | Nishioka et al. |
| 5,506,166 | A | 4/1996 | Sandhu et al. |
| 5,523,624 | A | 6/1996 | Chen et al. |
| 5,561,307 | A | 10/1996 | Mihara et al. |
| 5,612,254 | A | 3/1997 | Mu et al. |
| 5,631,804 | A | 5/1997 | New |
| 5,796,136 | A | 8/1998 | Shinkawata |
| 5,973,344 | A | 10/1999 | Ma et al. |
| 6,030,847 | A | 2/2000 | Fazan et al. |
| 6,066,528 | A | 5/2000 | Fazan et al. |
| 6,071,770 | A | 6/2000 | Roh |
| 7,513,707 | | 12/2006 | Fazan et al. |
| 7,253,052 | B2 | 8/2007 | Fazan et al. |
| 2005/0003609 | A1 | 1/2005 | Fazan et al. |
| 2005/0104107 | A1 | 5/2005 | Fazan et al. |
| 2006/0246607 | A1 | 11/2006 | Fazan et al. |
| 2007/0166915 | A1 | 7/2007 | Fazan et al. |

FOREIGN PATENT DOCUMENTS

| | | |
|---|---|---|
| EP | 0494313 | 7/1992 |

OTHER PUBLICATIONS

Fujii, E., et al., "ULSI DRAM technology with Ba/sub 0.7/Sr/sub 0.3/TiO/sub 3/film of 1.3nm equivalent SiO/sub 2/thickness and 10/sup -9/ A/cm/sup 2/leakage current", *International Electron Devices Meeting 1992. Technical Digest*, (1992),267-270.

Kaga, T. et al., "Crown-Shaped Stacked Capacitor Cell for 1.5-V Operation 64-Mb DRAMs", *IEEE Transactions on Electron Devices, 38*, (Feb. 1991),255-261.

Koyama, K., et al., "A Stacked Capacitor with (Ba/sub x/Sr/sub 1-x/)TiO/sub 3/ for 256M DRAM", *Technical Digest, International Electron Devices Meeting*, (Dec. 8-11, 1991),823-826.

Wolf, "Silicon Processing for the VLSI Era", *Process Integration*, vol. I(1989),169-171.

"U.S. Appl. No. 09/362,326 Final office action mailed Jul. 20, 2001", 8 pgs.

"U.S. Appl. No. 09/362,326 Non Final office action mailed Dec. 22, 2000", 10 pgs.

"U.S. Appl. No. 09/362,326 Notice of allowance mailed May 7, 2002", 4 pgs.

"U.S. Appl. No. 09/362,326 Notice of allowance mailed Sep. 24, 2002", 6 pgs.

"U.S. Appl. No. 09/362,326 Response filed Apr. 23, 2001 to Non Final office action mailed Dec. 22, 2000", 10 pgs.

"U.S. Appl. No. 09/362,326 Response filed Oct. 22, 2001 to Final office action mailed Jul. 20, 2001", 3 pgs.

"U.S. Appl. No. 08/314,117 Notice of allowance mailed Mar. 29, 1999", 4 pgs.

"U.S. Appl. No. 08/572,392 Non Final Office Action mailed Apr. 8, 1999", 10 pgs.

"U.S. Appl. No. 08/572,392 Notice of Allowance mailed Sep. 13, 1999", 5 pgs.

"U.S. Appl. No. 08/572,392 Response filed Jul. 8, 1999 to Non Final Office Action mailed Apr. 8, 1999", 3 pgs.

"U.S. Appl. No. 08/572,846 Advisory Action mailed Jul. 10, 1998", 1 pg.

"U.S. Appl. No. 08/572,846 Final office action mailed May 1, 1998", 7 pgs.

"U.S. Appl. No. 08/572,846 Non Final office action mailed Jun. 30, 1997", 6 pgs.

"U.S. Appl. No. 08/572,846 Non Final office action mailed Oct. 8, 1998", 4 pgs.

"U.S. Appl. No. 08/572,846 Notice of allowance mailed Feb. 22, 1999", 2 pgs.

"U.S. Appl. No. 08/572,846 Response filed Jan. 8, 1999 to Non final office action mailed Oct. 8, 1998", 4 pgs.

"U.S. Appl. No. 08/572,846 Response filed Jun. 24, 1998 to Final office action mailed May 1, 1998", 5 pgs.

"U.S. Appl. No. 08/572,846 Response filed Dec. 17, 1997 to Non Final office action mailed Jun. 30, 1997", 6 pgs.

"U.S. Appl. No. 09/357,634 Final office action mailed Mar. 7, 2002", 9 pgs.

"U.S. Appl. No. 09/357,634 Final office action mailed Dec. 20, 2000", 11 pgs.

"U.S. Appl. No. 09/357,634 Non Final office action mailed Jun. 6, 2000", 11 pgs.

"U.S. Appl. No. 09/357,634 Non Final office action mailed Jul. 11, 2001", 12 pgs.

"U.S. Appl. No. 09/357,634 Notice of allowance mailed Jul. 16, 2002", 6 pgs.

"U.S. Appl. No. 09/357,634 Preliminary Amendment filed Jun. 20, 2001", 6 pgs.

"U.S. Appl. No. 09/357,634 Preliminary Amendment filed Oct. 8, 1999", 9 pgs.

"U.S. Appl. No. 09/357,634 Response filed Jun. 7, 2002 to Final office action mailed Mar. 7, 2002", 5 pgs.

"U.S. Appl. No. 09/357,634 Response filed Jun. 19, 2002 to Final Office Action mailed Mar. 7, 2002", 4 pgs.

"U.S. Appl. No. 09/357,634 Response filed Oct. 6, 2000 to Non Final office action mailed Jun. 6, 2000", 8 pgs.

"U.S. Appl. No. 09/357,634 Response filed Oct. 11, 2001 to Non Final office action mailed Jul. 11, 2001", 7 pgs.

"U.S. Appl. No. 09/362,326 Advisory Action mailed Jan. 15, 2002", 2 pgs.

"U.S. Appl. No. 09/362,326 Amendment under 37 CFR 1.116 filed Mar. 22, 2002", 5 pgs.

"U.S. Appl. No. 09/362,326 Preliminary Amendment filed Jul. 27, 1992", 2 pgs.

"U.S. Appl. No. 09/362,326 Preliminary Amendment filed Oct. 25, 1999", 15 pgs.

"U.S. Appl. No. 09/489,954 Final Office action mailed Feb. 1, 2002", 8 pgs.

"U.S. Appl. No. 09/489,954 Final Office action mailed Aug. 1, 2001", 6 pgs.

"U.S. Appl. No. 09/489,954 Final Office action mailed Nov. 6, 2002", 8 pgs.

"U.S. Appl. No. 09/489,954 Non Final Office action mailed May 16, 2002", 7 pgs.

"U.S. Appl. No. 09/489,954 Non Final Office action mailed May 16, 2003", 8 pgs.

"U.S. Appl. No. 09/489,954 Non Final Office action mailed Nov. 18, 2003", 6 pgs.

"U.S. Appl. No. 09/489,954 Non Final Office action mailed Dec. 8, 2000", 9 pgs.

"U.S. Appl. No. 09/489,954 Notice of allowance mailed Apr. 9, 2004", 6 pgs.

"U.S. Appl. No. 09/489,954 Response filed Jan. 6, 2003 to Final Office action mailed Nov. 6, 2002", 5 pgs.

"U.S. Appl. No. 09/489,954 Response filed Feb. 18, 2004 to Non Final Office action mailed Nov. 18, 2003", 10 pgs.

"U.S. Appl. No. 09/489,954 Response filed Apr. 1, 2002 to Final Office action mailed Feb. 1, 2002", 4 pgs.

"U.S. Appl No. 09/489,954 Response filed May 8, 2001 to Non Final Office action mailed Dec. 8, 2000", 9 pgs.

"U.S. Appl. No. 09/489,954 Response filed Aug. 16, 2002 to Non Final Office action mailed May 16, 2002", 8 pgs.

"U.S. Appl. No. 09/489,954 Response filed Aug. 18, 2003 to Non Final Office action mailed May 16, 2003", 11 pgs.

"U.S. Appl. No. 09/488,954 Response filed Nov. 1, 2001 to Final Office action mailed Aug. 1, 2001", 3 pgs.

"U.S. Appl. No. 10/896,442 Amendment filed Mar. 2, 2007", 8 pgs.

"U.S. Appl. No. 10/896,442 Amendment Under 37 CFR 1.312 filed Apr. 21, 2006", 10 pgs.

"U.S. Appl. No. 10/896,442 Amendment Under 37 CFR 1.312 filed Jun. 4, 2007", 7 pgs.

"U.S. Appl. No. 10/896,442 Final Office Action mailed Nov. 4, 2005", 5 pgs.

"U.S. Appl. No. 10/896,442 Non Final Office Action mailed May 18, 2005", 7 pgs.

"U.S. Appl. No. 10/896,442 Notice of Allowance mailed Jan. 24, 2006", 4 pgs.

"U.S. Appl. No. 10/896,442 Notice of Allowance mailed Mar. 9, 2007", 7 pgs.

"U.S. Appl. No. 10/896,442 Preliminary Amendment filed Sep. 10, 2004", 3 pgs.

"U.S. Appl. No. 10/896,442 Response filed Jan. 6, 2006 to Final Office Action mailed Nov. 4, 2005", 12 pgs.

"U.S. Appl. No. 10/896,442 Response filed Oct. 6, 2005 to Non Final Office Action mailed May 18, 2005", 11 pgs.

"U.S. Appl. No. 10/939,928 Non Final Office Action mailed Apr. 19, 2006", 12 pgs.

"U.S. Appl. No. 10/939,928 Notice of Allowance mailed Sep. 26, 2006", 6 pgs.

"U.S. Appl. No. 10/939,928 Response filed Aug. 17, 2006 to Non Final Office Action mailed Apr. 19, 2006", 10 pgs.

"U.S. Appl. No. 11/458,072 Notice of Allowance mailed Oct. 3, 2007", 11 pgs.

"U.S. Appl. No. 11/726,143 Non-Final Office Action mailed Oct. 16, 2007", OARN,14.

\* cited by examiner

*Primary Examiner*—Howard Weiss
*Assistant Examiner*—John C Ingham

(74) *Attorney, Agent, or Firm*—Schwegman, Lundberg & Woessner, P.A.

(57) ABSTRACT

An integrated circuit structure includes a digit line and an electrode adapted to be part of a storage cell capacitor and includes a barrier layer interposed between a conductive plug and an oxidation resistant layer. An insulative layer protects sidewalls of the barrier layer during deposition and anneal of a dielectric layer. The method includes forming the conductive plug recessed in an insulative layer. The barrier layer is formed in the recess and the top layer. An oxidation resistant conductive layer and a further oxide layer are formed in the recess. The conductive layer is planarized to expose the oxide or oxide/nitride layer. The oxide layers are then etched to expose the top surface and vertical portions of the conductive layer. A dielectric layer is formed to overlie the storage node electrode. A cell plate electrode is fabricated to overlie the dielectric layer.

32 Claims, 55 Drawing Sheets

STORAGE CELL CAPACITOR COMPATIBLE WITH HIGH DIELECTRIC CONSTANT MATERIALS

This is a Divisional of application Ser. No. 10/939,928, filed Sep. 13, 2004, now U.S. Pat. No. 7,153,707, which is a Continuation of application Ser. No. 09/489,954, filed Jan. 24, 2000, now U.S. Pat. No. 6,791,131, which is a Divisional of application Ser. No. 08/572,392, filed Dec. 14, 1995, now U.S. Pat. No. 6,030,847, which is a Continuation-In-Part of application Ser. No. 08/390,336 filed on Feb. 17, 1995, now U.S. Pat. No. 5,478,772 which is a continuation of Ser. No. 08/044,331 filed on Apr. 2, 1993, now abandoned.

A continuation of Ser. No. 08/313,677 filed on Sep. 27, 1994, now U.S. Pat. No. 5,506,166 which is a divisional of Ser. No. 08/104,525 filed on Aug. 10, 1993, now U.S. Pat. No. 5,381,302 and which may contain similar material. All of the above applications are incorporated herein by reference.

FIELD OF THE INVENTION

This invention pertains to semiconductor technology, and more particularly to storage cell capacitors for use in dynamic random access memories.

BACKGROUND OF THE INVENTION

As memory devices become more dense it is necessary to decrease the size of circuit components. One way to retain the storage capacity of a dynamic random access memory (DRAM) device and decrease its size is to increase the dielectric constant of the dielectric layer of the storage cell capacitor. In order to achieve the charge storage efficiency needed in 256 megabit(Mb) memories and above, materials having a high dielectric constant, typically greater than 50, can be used as the dielectric layer to insulate the storage node electrode and cell plate electrode of the storage cell capacitor one from the other. A dielectric constant is a value characteristic of a material and is proportional to the amount of charge that can be stored in the material when it is interposed between two electrodes. $Ba_xSr_{(1-x)}TiO_3$ [BST], $BaTiO_3$, $SrTiO_3$, $PbTiO_3$, $Pb(Zr,Ti)O_3$ [PZT], (Pb,La) $(Zr,Ti)O_3$ [PLZT], (Pb,La) $TiO_3$ [PLT], $KNO_3$, and $LiNbO_3$ are among some of the high dielectric constant materials that can be used in this application. These materials have dielectric constant values above 50 and will likely replace the standard $Si_3N_4$, $SiO_2/Si_3N_4$, $Si_3N_4/SiO_2$, or $SiO_2/Si_3N_4/SiO_2$ composite films used in 256 kilobits (Kb) to 64 megabits (Mb) generations of DRAMs. $Si_3N_4$ and $SiO_2/Si_3N_4$ composite films have dielectric constant values of 7 or less. The storage node and cell plate electrodes are also referred to as first and second electrodes.

Unfortunately BST is incompatible with existing processes and can not be simply deposited on a polysilicon electrode as was the case for the lower dielectric constant materials, such as $Si_3N_4$ and $SiO_2/Si_3N_4$ composite layers. In the storage cell capacitor incorporating BST, described in the IDEM-91 article entitled, A STACKED CAPACITOR WITH $(Ba_xSr_{1-x})$ $TiO_3$ FOR 256M DRAM by Koyama et al., the storage node electrode typically comprises a layer of platinum overlying a tantalum layer which, in turn, overlies a polysilicon plug. Platinum is used as the upper portion of the first electrode since it will not oxidize during a BST deposition or subsequent anneal. An electrode that oxidizes would have a low dielectric constant film below the BST, thereby negating the advantages provided by the high dielectric constant material. The tantalum layer is introduced to avoid Si and Pt interdiffusion and to prevent the formation of $SiO_2$ on top of the platinum surface. In addition, the platinum protects the top surface of the tantalum from strong oxidizing conditions during the BST deposition. FIG. 1 depicts the stacked storage node electrode comprising tantalum 1, platinum 2 (Ta/Pt) overlying the polysilicon plug 3.

However, the sidewalls 4 of the tantalum 1 formed during this process are subject to oxidation during the subsequent deposition of the BST layer. Since the tantalum 1 oxidizes the polysilicon plug 3 is also susceptible to oxidation. When portions of the polysilicon plug 3 and tantalum 1 are consumed by oxidation the capacitance of the storage cell capacitor is decreased since the storage node electrode is partially covered by a low dielectric constant film. Therefore the memory device cannot be made as dense. In addition, the storage node contact resistance increases drastically.

SUMMARY OF THE INVENTION

The invention is a storage node capacitor having a storage node electrode comprising a barrier layer interposed between a conductive plug and an oxidation resistant conductive layer and the method for fabricating the same. A thick insulative layer protects the sidewalls of the barrier layer during the deposition and anneal of a dielectric layer having a high dielectric constant.

The method comprises forming the conductive plug in a thick layer of insulative material such as oxide or oxide/nitride. The conductive plug is recessed from a planarized top surface of the thick insulative layer. The barrier layer is formed in the recess. The process is then continued with a formation of an oxidation resistant conductive layer and the patterning thereof to complete the formation of the storage node electrode.

Next a dielectric layer having a high dielectric constant is formed to overly the storage node electrode and a cell plate electrode is then fabricated to overly the dielectric layer.

Since the barrier layer is protected during the formation of the dielectric layer by both the oxidation resistant conductive layer and the thick insulative layer there is no oxidation of the barrier layer or the contact plug thereby maximizing capacitance of the storage node and reducing high contact resistance issues.

The invention includes a storage node capacitor having a storage node electrode comprising a barrier layer interposed between a conductive plug and an oxidation resistant conductive layer and the method for fabricating the same. A thick insulative layer protects the sidewall of the barrier layer during the deposition and anneal of a dielectric layer having a high dielectric constant.

In one preferred implementation the method comprises forming the conductive plug in a thick layer of insulative material such as oxide or oxide/nitride. The conductive plug is recessed from a planarized top surface of the thick insulative layer. The barrier layer and the oxidation resistant layer are formed in the recess. A portion of the thick insulative material is removed to expose portions of the oxidation resistant layer. Remaining portions of the thick insulative material continue to encompass the barrier layer.

Next a dielectric layer having a relatively high dielectric constant is formed to overlie the storage node electrode and a cell plate electrode is then fabricated to overlie the dielectric layer. In this preferred implementation, since the barrier layer is protected during the formation of the dielectric layer by both the oxidation resistant conductive layer and the thick insulative layer there is little or no oxidation of the barrier layer or the contact plug, thereby maximizing capacitance of the storage node and reducing high contact resistance issues.

In one particular preferred embodiment, the barrier layer is tantalum or another material which experiences no oxidation during the formation of the storage cell capacitor. The oxidation resistant conductive layer is preferably a non-oxidizing conductive material such as platinum. The dielectric layer is preferably $Ba_xSr_{(1-x)}TiO_3$ [BST].

The insulative layer and the oxidation resistant layer protect the barrier layer from oxidizing during the deposition and anneal of the BST thereby also eliminating oxidization of the conductive plug. By minimizing or eliminating oxidization of the barrier layer and the conductive plug capacitance is maximized.

An embodiment of the invention is a product and method for forming same comprising a storage contact capacitor of a dynamic random access memory (DRAM) device wherein the lower storage node capacitor plate comprises tungsten and TiN portions. An initial TiN region is self-aligned to and in contact with the contact area of the substrate. The initial tungsten portion is embedded in the TiN region. The storage contact capacitor of the invention utilizes the vertical portion of the DRAM by fabricating at least a portion of the storage node capacitor plate vertically in the DRAM. The vertical fabrication increases capacitor area while maximizing die space.

The capacitor area of an embodiment is increased by forming at least one cavity surrounding at least one upper portion of the tungsten. The cavity is formed by controllably etching portions of the TiN. The fabrication of the storage capacitor is complete following the deposition of a dielectric layer to overlie exposed TiN and tungsten portions and a previously fabricated oxide portion. Cell polysilicon is deposited to overlie the dielectric layer, the cell polysilicon forming the cell plate. A conductive material is then deposited to overlie the cell plate and function as a cell plate contact.

In an embodiment only one layer of TiN and one layer of tungsten is deposited. In another embodiment, at least two more layers, at least one of TiN and at least one of tungsten are alternately deposited. In the second embodiment, etching the TiN layers effects an elevationally stacked fin structure of tungsten. The height of the structure is dependent on the number of alternatively layers and the thickness of the layers. TiN retained after the etch provides electrical communication between the tungsten layers as well as between the contact area of the substrate and the first deposited TiN layer.

A self-aligned opening exposing a contact region of silicon substrate is created by masking and etching previously fabricated layers of the semiconductor device. An initial TiN layer is deposited to overlie the exposed substrate and previously fabricated layers. A tungsten fill is deposited to overlie the TiN layer. At this juncture, alternating layers of TiN and tungsten may be deposited. An upper portion of the TiN is etched forming a cavity surrounding each upper portion of the tungsten layer. The tungsten and TiN comprise the storage node capacitor plate. A dielectric layer is deposited to overlie the tungsten and TiN and the previously fabricated layers. Cell polysilicon is deposited to overlie the dielectric layer and forms the cell plate.

Embodiments of the invention allow the vertical portion of a DRAM device to be utilized as the storage cell thus maximizing die space in the horizontal direction, and reducing the stack capacitor height prior to contacts. The TiN etch maximized the cell size by increasing the area of the storage node plate. The cell plate contact and the cell plate are self-aligned. A mask step is eliminated over previous methods since there is no cell polysilicon mask. The process facilitates the effective use of a buried digit line configuration. In addition there are no bit line stringers, thus yield is increased.

BRIEF DESCRIPTION OF THE DRAWINGS

FIGS. 2-11 are cross-sectional views of a portion of a partially processed semiconductor wafer depicting the steps of the invention for fabricating a storage cell capacitor.

FIG. 2 depicts field-effect transistors overlying a silicon substrate and wordlines overlying field oxide.

FIG. 3 is the wafer portion of FIG. 2 following the deposit of an undoped thick oxide layer and planarization thereof.

FIG. 4 is the wafer portion of FIG. 3 following the masking and subsequent etching of the deposited oxide layer to form self-aligned openings.

FIG. 5 is the wafer portion of FIG. 4 following the formation of polysilicon plugs in the openings and the removal of the mask shown in FIG. 4.

FIG. 6 is the wafer portion of FIG. 5 following the recessing of the polysilicon plug in the thick oxide layer.

FIG. 18 is the cross sectional view of FIG. 17 following formation of a dielectric layer and cell plate layer.

FIG. 40 also depicts the oxidation of the polysilicon and silicide exposed during the etch.

FIG. 40 also depicts the oxidation of the polysilicon and silicide exposed during the etch.

DETAILED DESCRIPTION

The method for fabricating the storage cell capacitor of the invention is shown pictorially in FIGS. 2-11.

Figure 1:
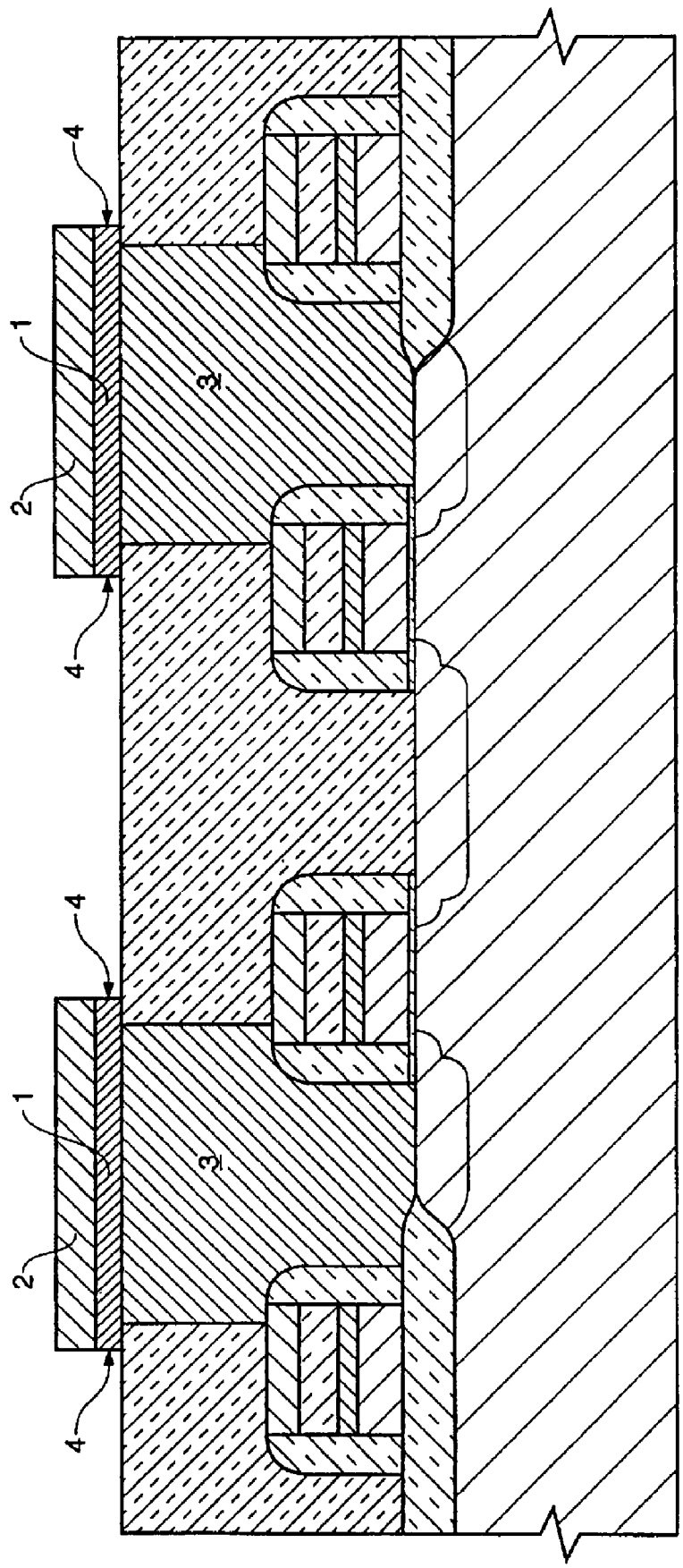
FIG. 1 is a cross-sectional view of a portion of a partially processed semiconductor wafer of the related art.
Figure 2:
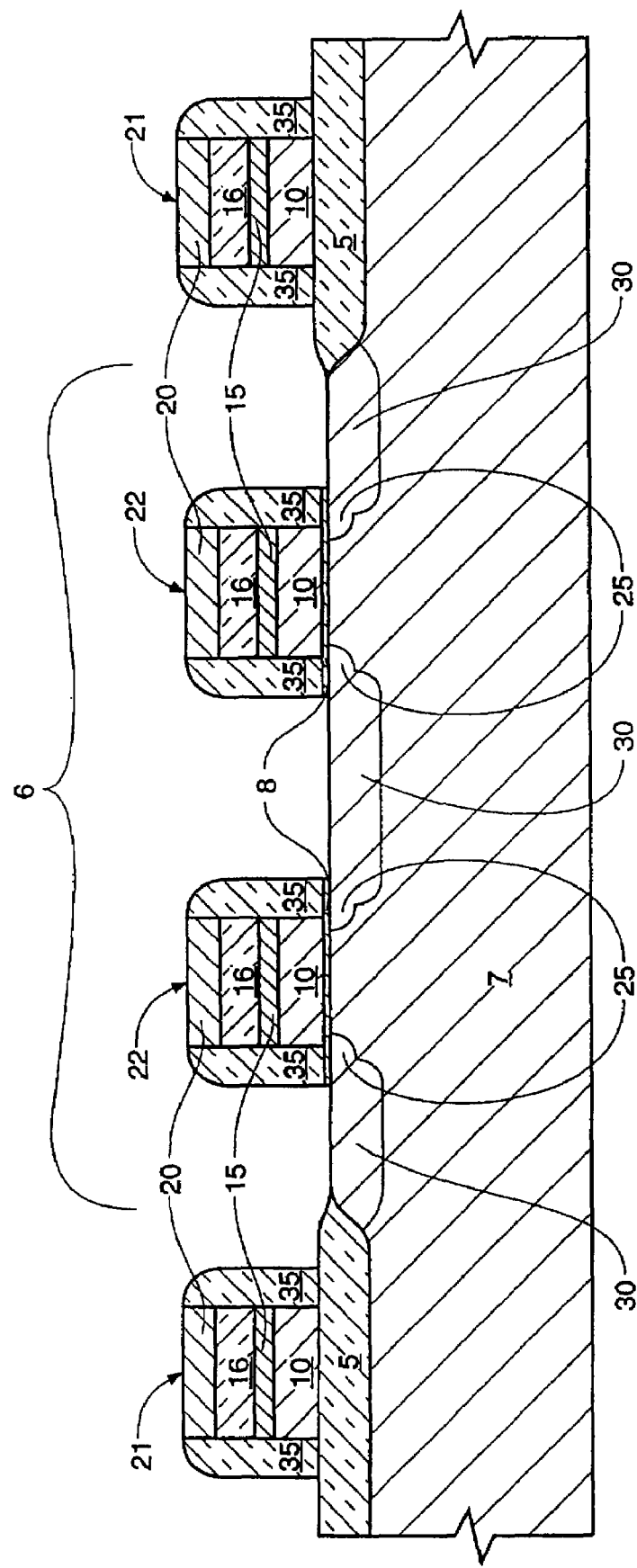

Referring to FIG. 2, a cross-sectional view of an in-process dynamic random access memory (DRAM) cell is shown following conventional local oxidation of silicon (LOCOS) or special LOCOS processing which creates substantially planar field oxide regions 5 (created using modified LOCOS or trench isolation processes) and future active areas 6 (those regions of the substrate not covered by field oxide) on a silicon substrate 7. The creation of the field oxide is preceded or followed by a thermally grown dielectric layer 8 of silicon oxide. The depicted cell is one of many cells that are fabricated simultaneously and comprise a memory array. Following the creation of the field oxide region 5 and dielectric layer 8 a first conductively doped polysilicon layer 10, a metal silicide layer ($Wsi_x$) 15, an oxide layer 16, and a thick nitride layer 20 are deposited. The thick nitride layer 20 will function as an etch stop during the storage node buried contact etch, thus allowing self-alignment if desired. The layers are patterned and etched to form wordlines 21 and N-channel (NCH) field effect transistors 22. The polysilicon layer 10 forms the gate regions of the FETs and is insulated from lightly-doped source/drain regions 25 by the dielectric layer 8. The lightly-doped regions 25 are created utilizing a phosphorus or arsenic implant. Deposition, densification and a reactive ion etch (RIE) of a silicon-nitride spacer layer has created principal spacers 35 which offset an arsenic implant used to create the heavily-doped source/drain regions 30. Principal spacers 35 insulate the wordlines and FETs from subsequent digit line and capacitor fabrications. Eventually the wordlines are connected to periphery contacts. The periphery contacts are located at the end of the array and are capable of being in electrical communication with peripheral circuitry.

The formation of the FETs 22 and wordlines 21 as described are exemplary of one application to be used in conjunction with the present embodiment of the invention. Other methods of fabrication and other applications are also feasible and perhaps equally viable.

Figure 3:
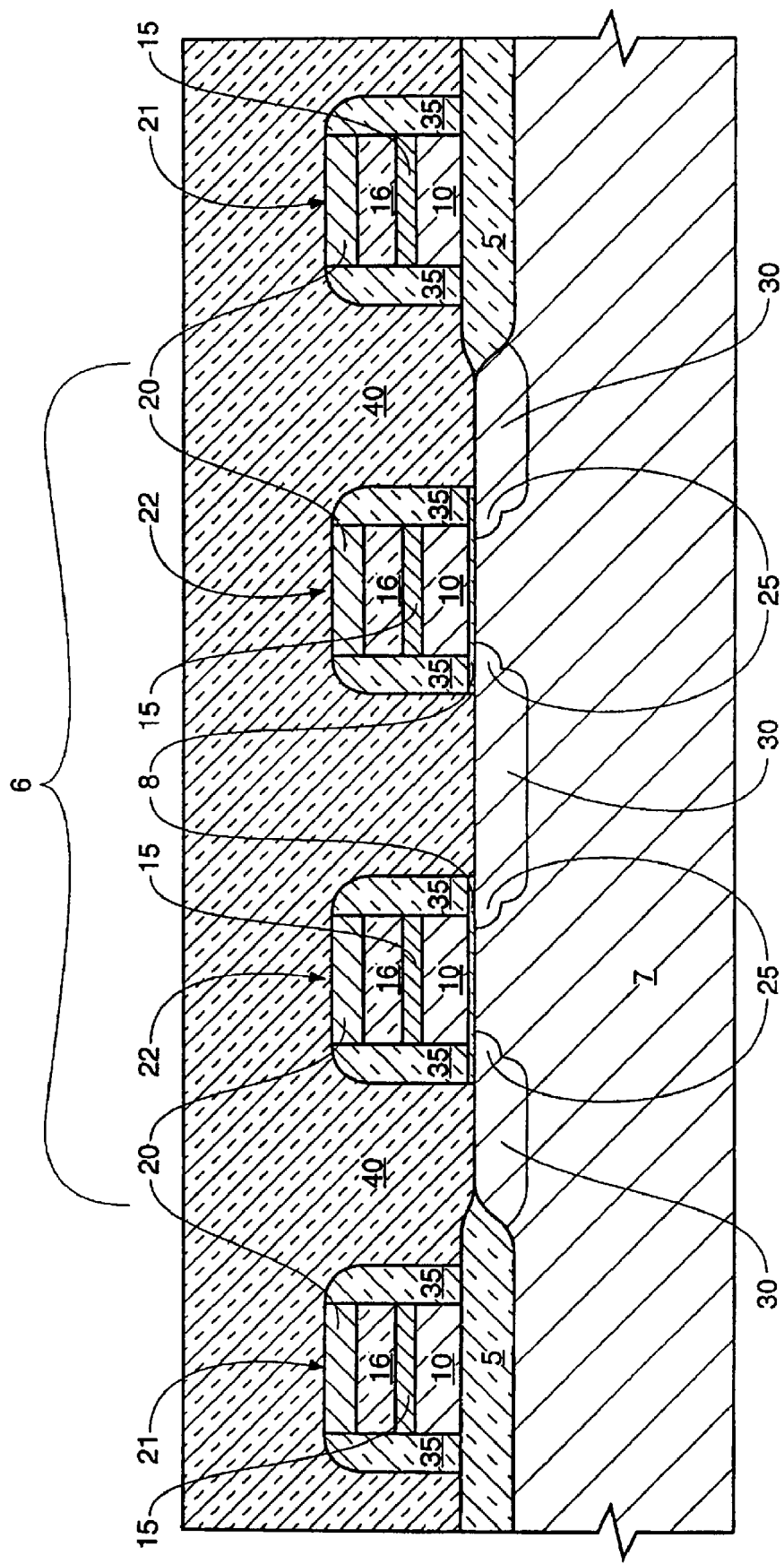

In FIG. 3 a thick insulative conformal layer of undoped oxide 40 is blanket deposited to fill the storage node areas and overlie the FETS 22 and wordlines 21. The oxide is undoped to minimize dopant out diffusion from the oxide 40 to the doped regions of the substrate. The oxide is planarized, preferably chemical mechanically planarized (CMP), in order to provide a uniform height. Optionally nitride, oxynitride or another suitable material may be deposited as the insulative layer.

At this juncture buried digit lines may be fabricated as described in U.S. Pat. No. 5,168,073 herein incorporated by reference. The subject matter of U.S. Pat. No. 5,168,073 is now explicitly described herein with respect to FIGS. 29-50 of the present application. In the case where the buried digit lines are formed by the method described in U.S. Pat. No. 5,168,073 the oxide 40 is deposited in two steps, one deposit prior to the digit line formation and one deposit subsequent to the digit line formation. In this case, an initial thick oxide layer is deposited and planarized and then overlaid with a relatively thick $Si_3N_4$ layer. The $Si_3N_4$ layer is then planarized. When the thick insulative layer is comprised only of oxide it is possible for oxygen to diffuse through the oxide. By overlying the oxide with $Si_3N_4$ it is possible to prohibit oxygen diffusion though the oxide.

Figure 4:
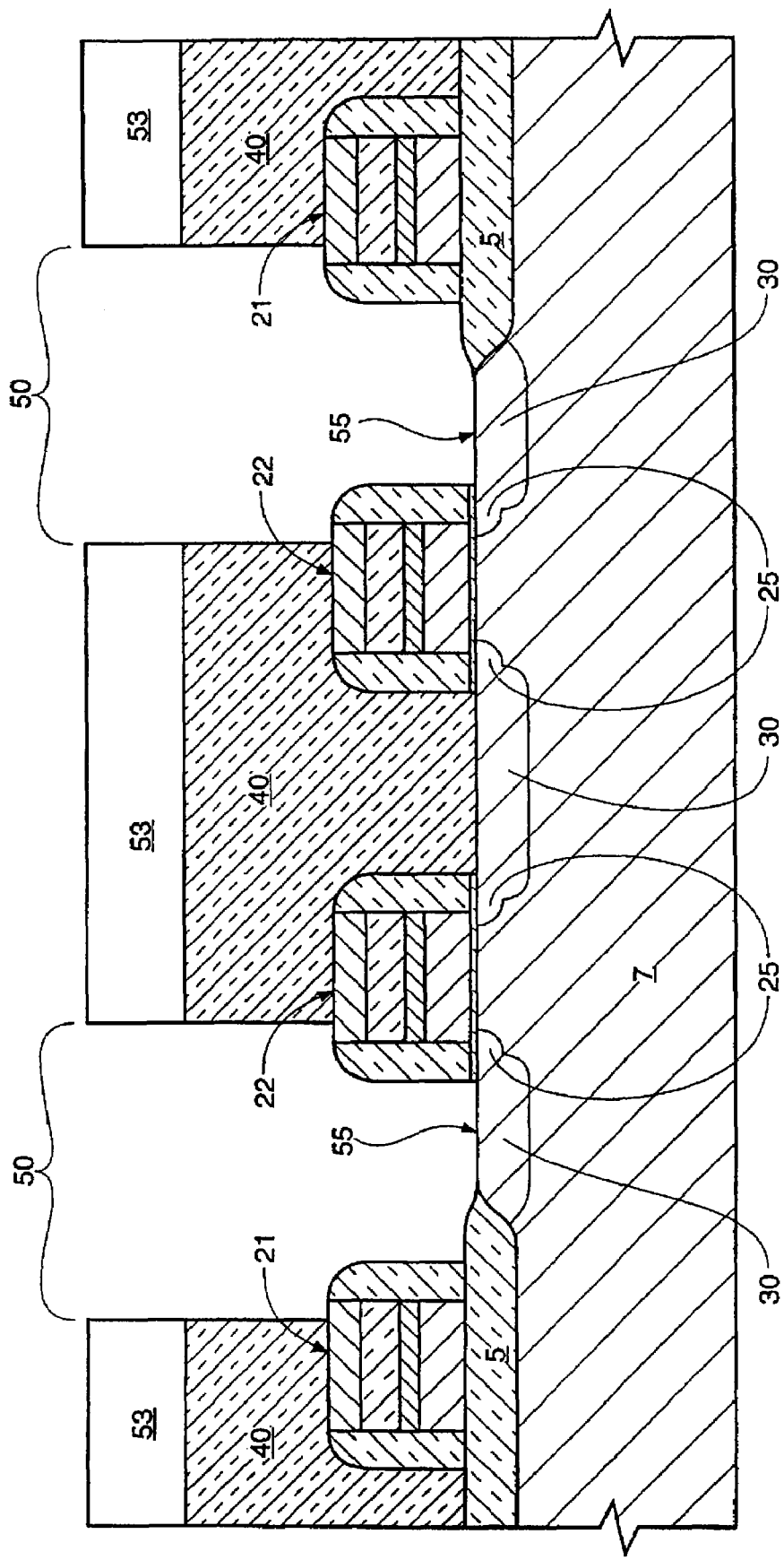

Referring to FIG. 4, mask 53 defines self-aligned substrate contact area 55. The oxide 40 is etched to form a self-aligned openings 50 exposing the contact areas 55 of the substrate 7.

Figure 5:
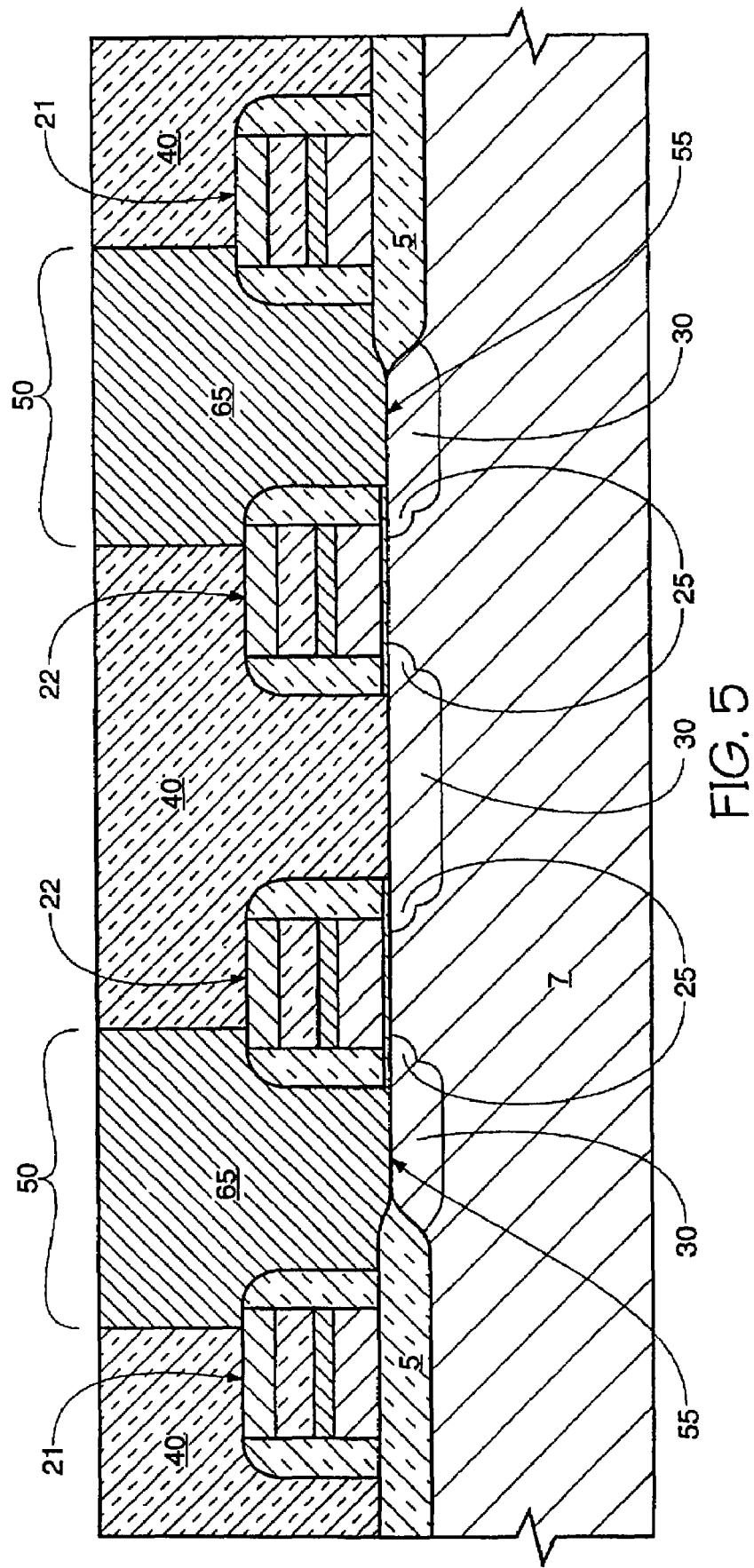

Referring to FIG. 5, in order to provide electrical communication between the substrate 7 and the storage cell capacitor a polysilicon plug 65 is formed in each opening 50. The actual method used to form the polysilicon plugs 65 is not critical, two options being a selective silicon growth from the contact area 55 or a doped polysilicon deposition and subsequent etch back or CMP back.

Figure 6:
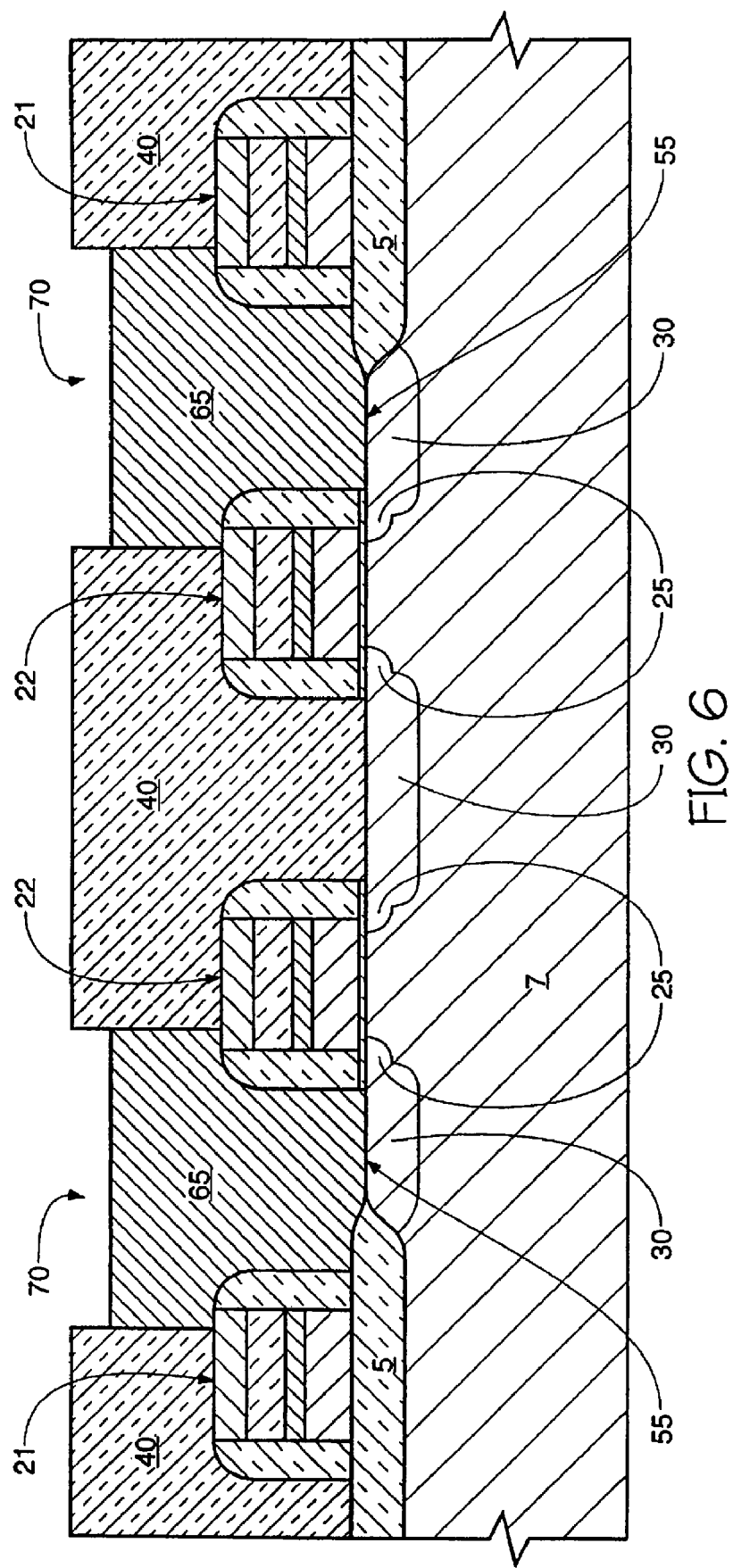

Referring now to FIG. 6, an upper portion of the polysilicon plugs 65 is removed during a dry etch in order to form a recesses 70, Typically, this etch back is 50 to 400 nano meters (nm). In a case where the polysilicon plugs 65 are formed during a selective silicon growth it is possible to form the recess 70 by controlling the growth.

Figure 7A:
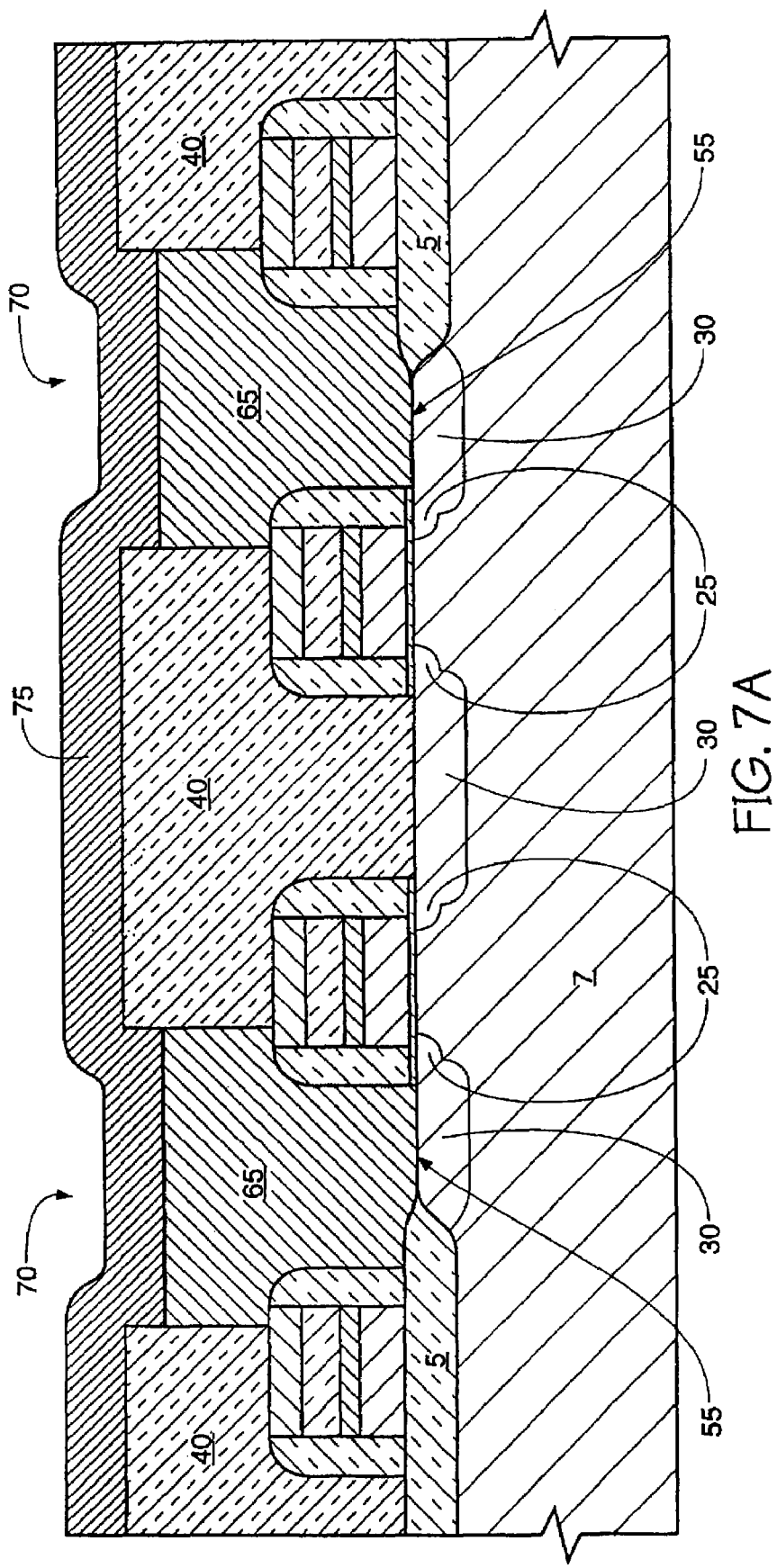
FIGS. 7a and 7b are wafer portions of FIG. 6 following the deposition of a tantalum layer.
Figure 7B:
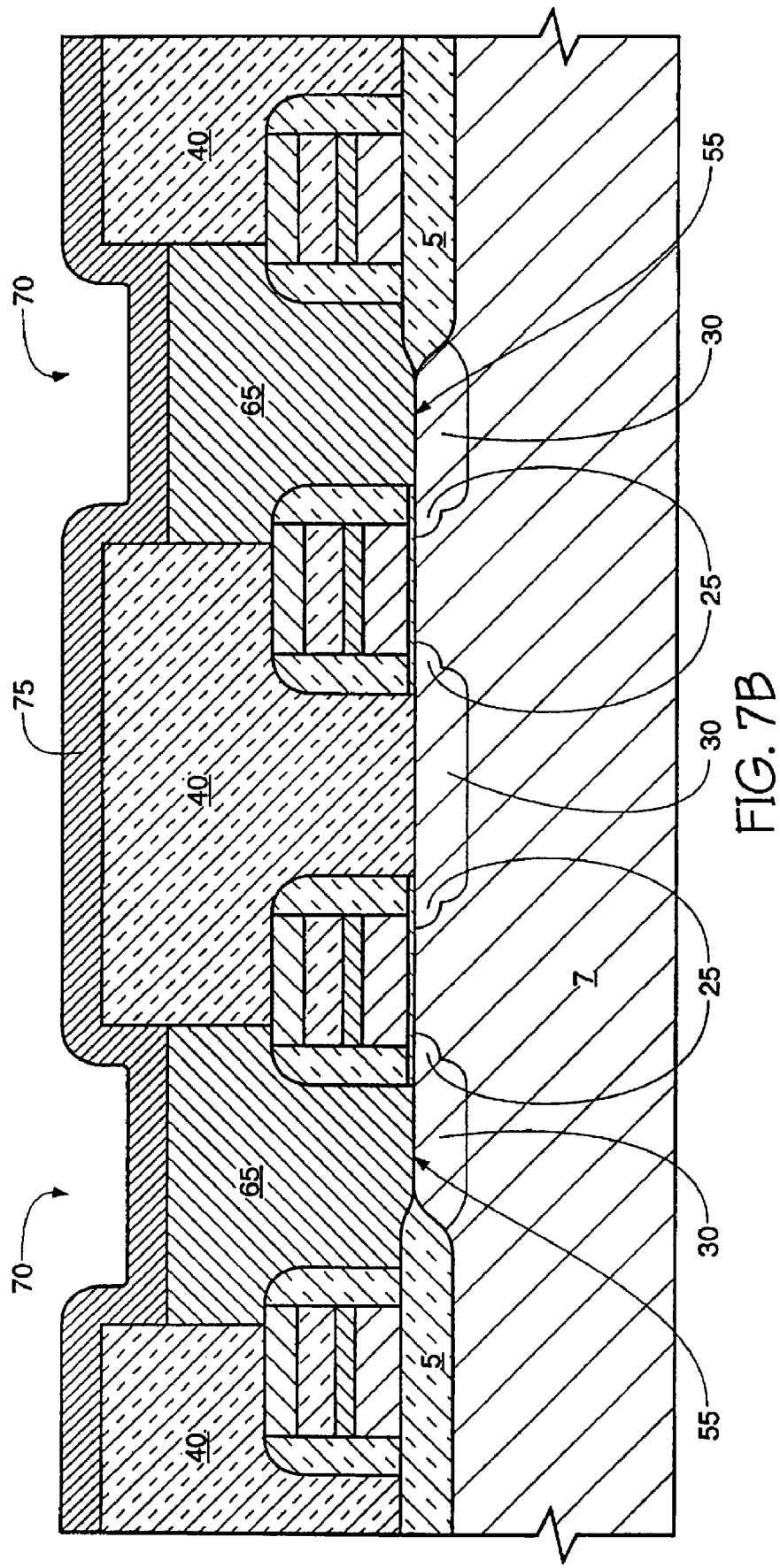

Referring to FIG. 7a, a tantalum layer 75, with a thickness larger than the depth of the recesses 70, is formed by a chemical vapor deposition (CVD) or a sputtering process performed at room temperature. The tantalum layer 75 provides a barrier against silicon diffusion, of the polysilicon plug during subsequent high temperature anneals and other materials capable of prohibiting silicon diffusion may be used in place of tantalum. For example, titanium and titanium nitride may be used as well as other materials. Alternately, a tantalum layer 75 may be formed wherein the thickness is less than or equal to the depth of the recess. FIG. 7b depicts the latter case. In this particular case the storage cell capacitor gains more vertical area thereby increasing capacitance.

Figure 8A:
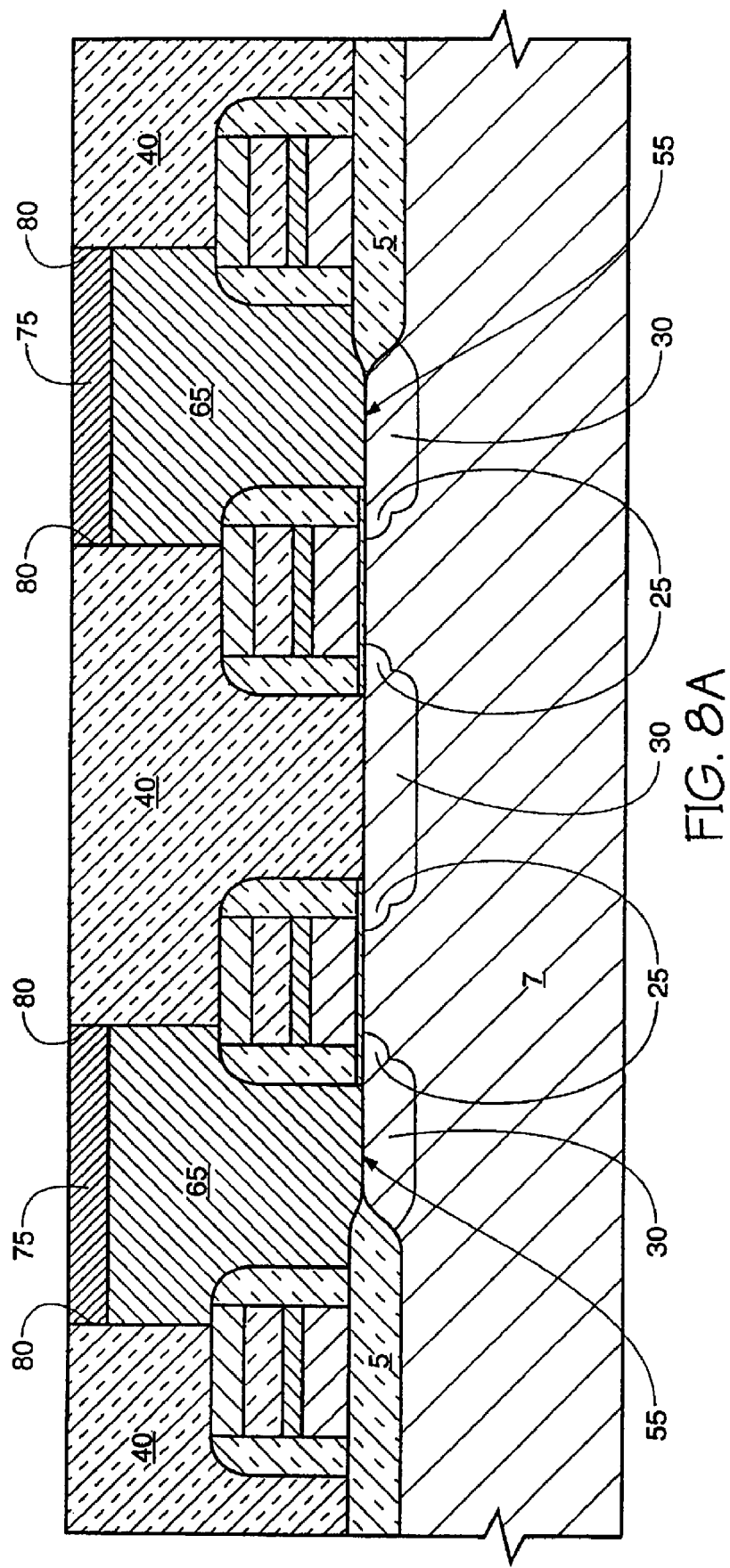
FIGS. 8a and 8b are wafer portions of FIGS. 7a and 7b following the planarization of the tantalum layer.
Figure 8B:
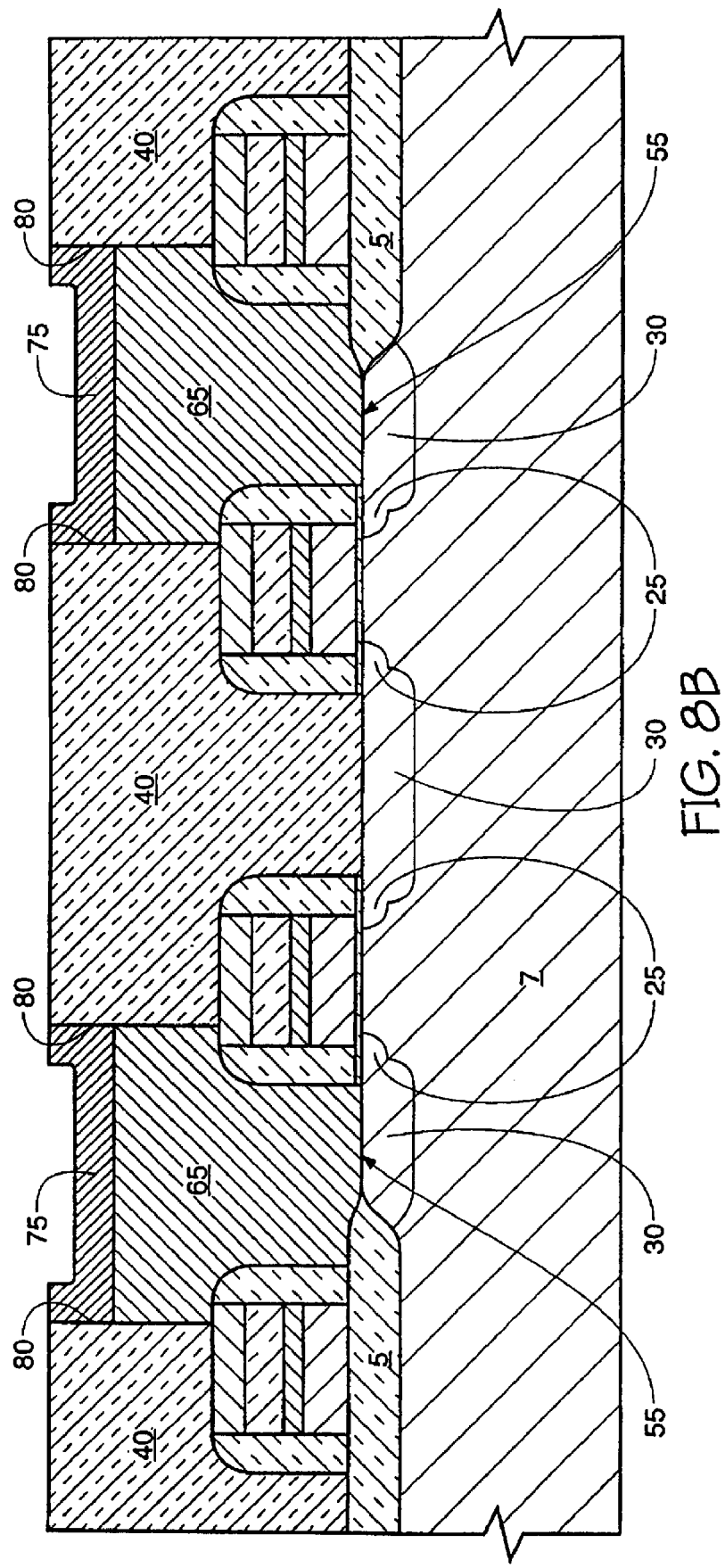

Referring to FIGS. 8a and 8b, the tantalum layer 75 of FIGS. 7a and 7b, respectively, is planarized, preferably by CMP, in order to expose at least the oxide layer 40 and in order to retain tantalum 75 in recesses 70 overlying the polysilicon plugs 65. Portions of the oxide layer 40 may be planarized during this step. It is important, of course to retain a sufficient depth of tantalum 75 in order to inhibit silicon diffusion of the polysilicon plugs 65. It can be seen that only the upper surface of the tantalum layer 75 is exposed and that the tantalum sidewalls 80 are protected by the oxide layer 40.

Figure 9A:
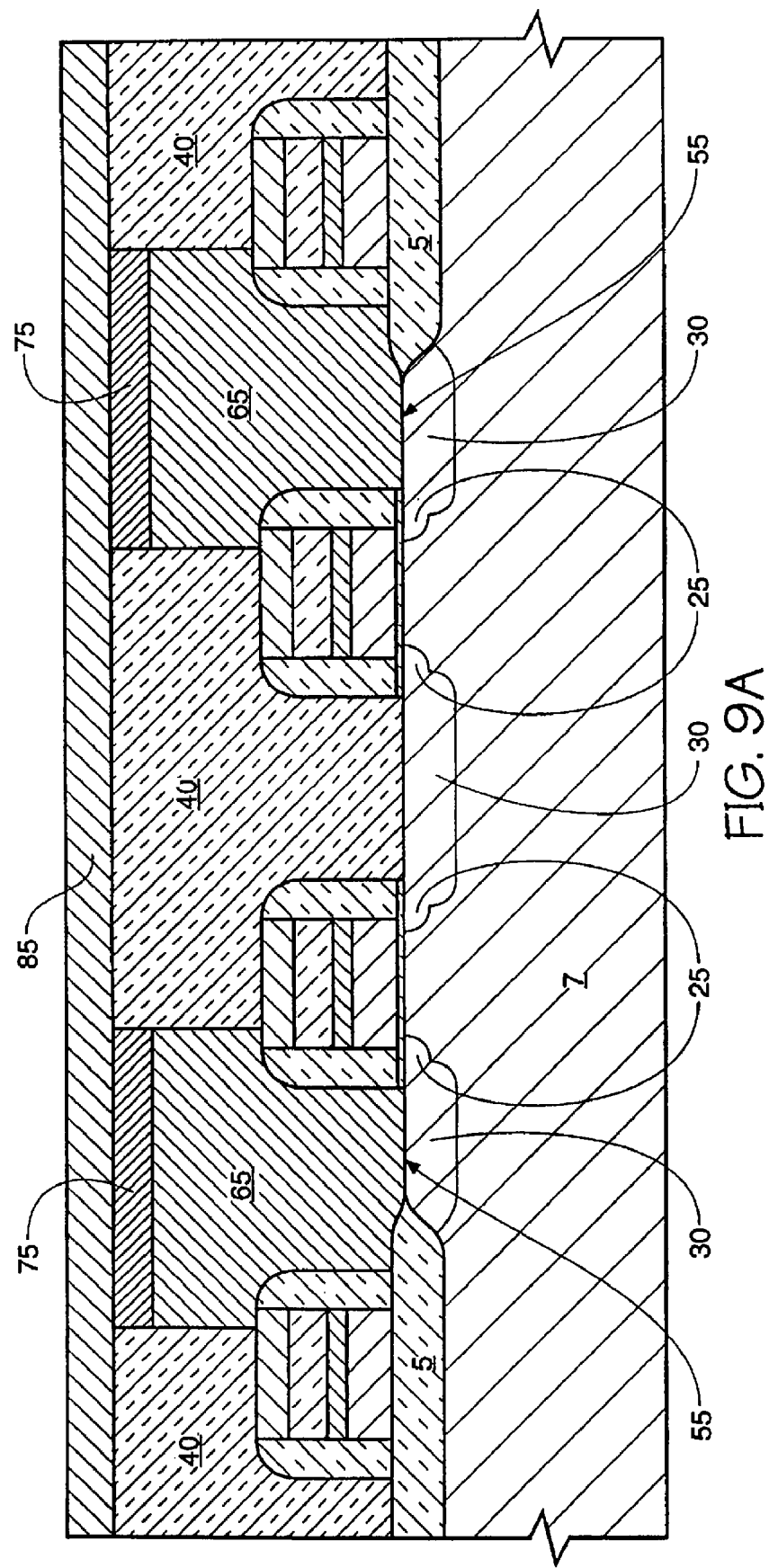
FIGS. 9a and 9b are wafer portions of FIGS. 8a and 8b following the deposition of a platinum layer.
Figure 9B:
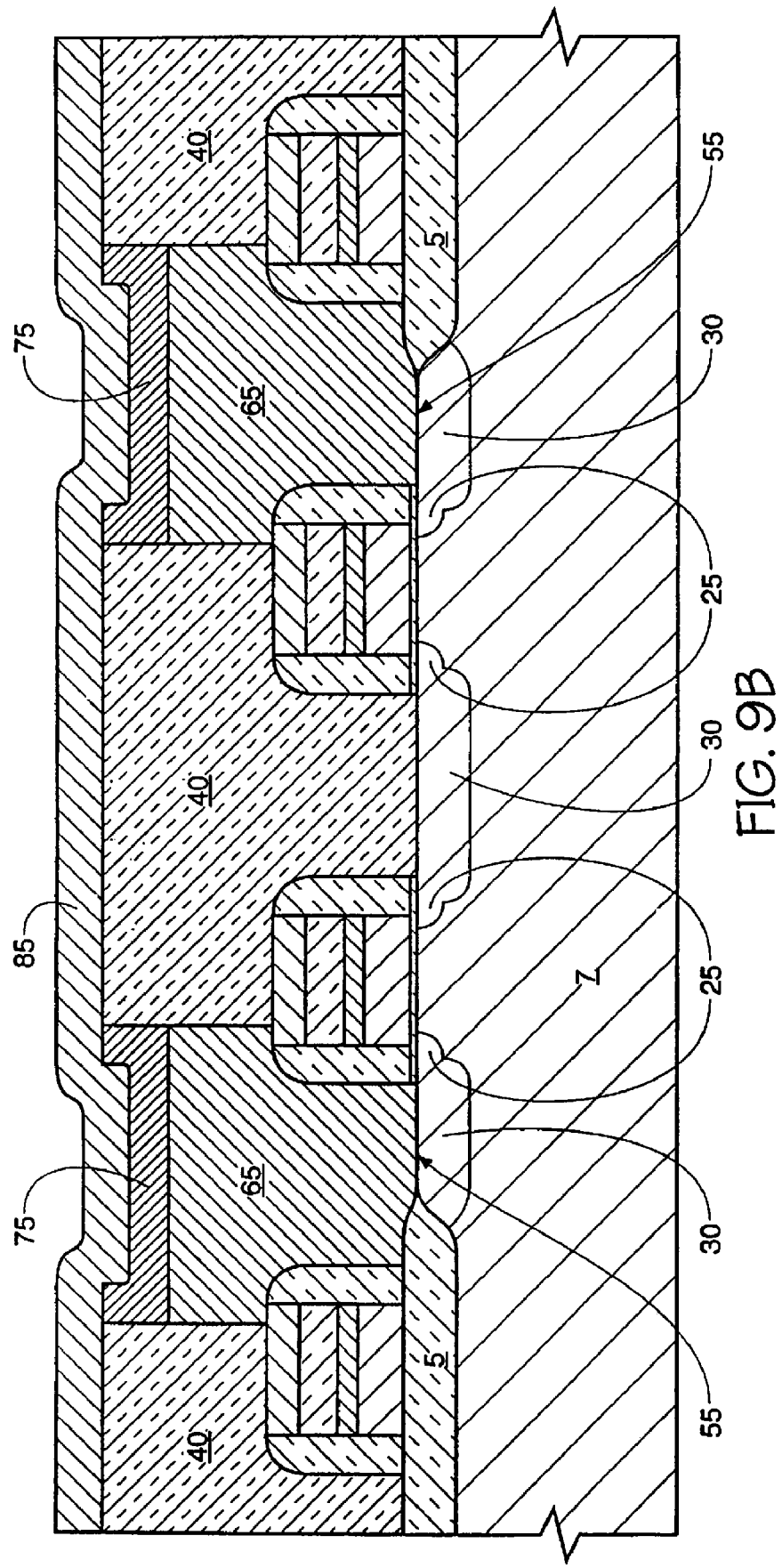

Referring to FIGS. 9a and 9b a platinum layer 85 is formed by CVD or a sputtering technique. The platinum layer 85 overlies the tantalum layer 75 shown in FIGS. 8a and 8b, respectively. Since the platinum layer 85 is resistant to oxidation it provides an excellent surface for the deposition of the high dielectric constant material. Other materials which are resistant to oxidation may be used in place of the platinum. For example, $RuO_2$ and TiN, as well as other non-oxidizing materials may be used. Since the tantalum layer is recessed below the oxide layer 40, a thick layer of platinum may be deposited without decreasing the density of the device. By using very thick platinum electrodes, the capacitance area is increased by the sidewall area contribution. Therefore, the platinum is deposited from at least a thickness of 50 nm to a thickness of 1 micro meter($\mu$m).

Figure 10A:
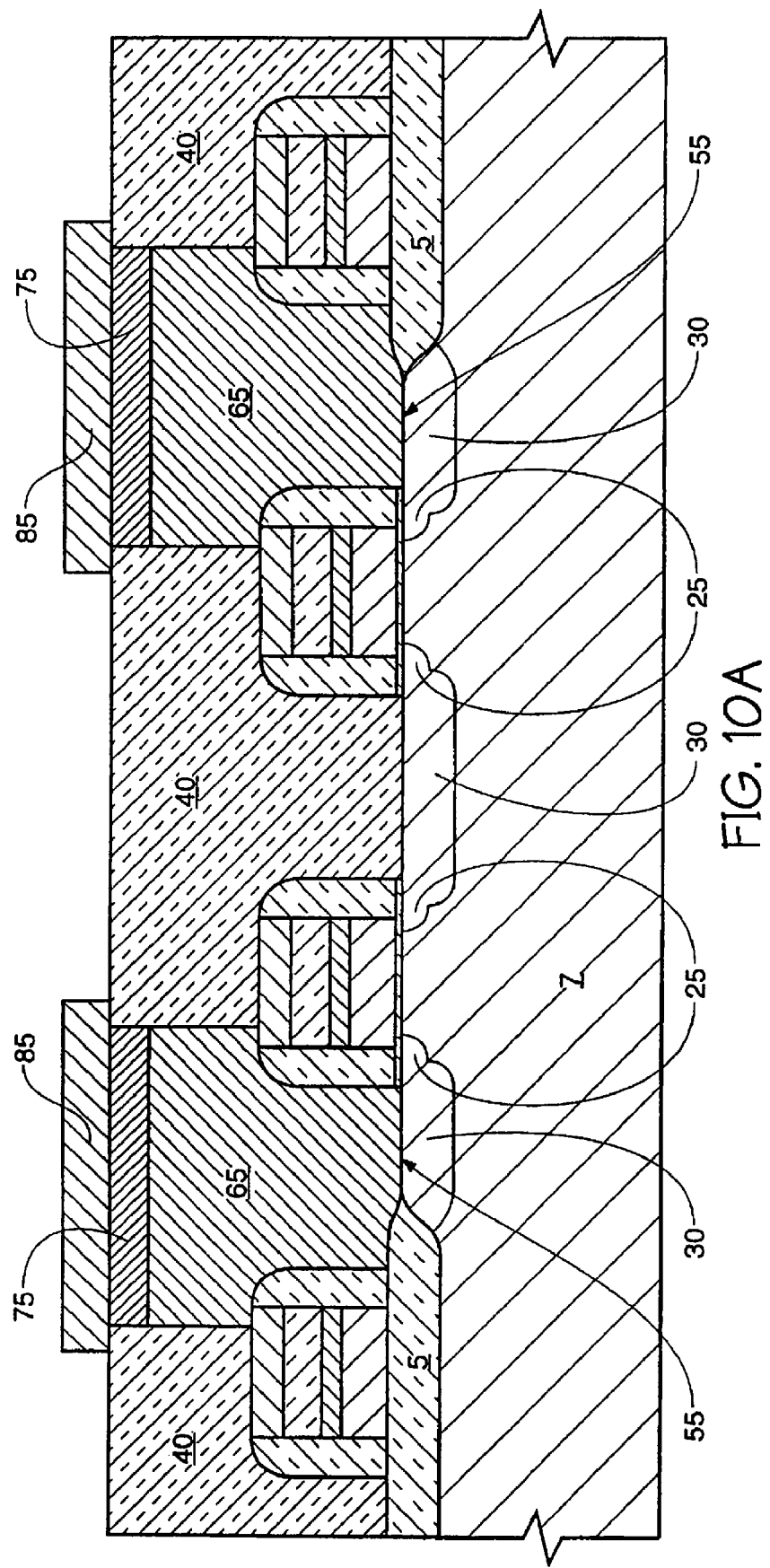
FIGS. 10a and 10b are the wafer portions of FIG. 9a and 9b following the etching of the platinum layer to complete the formation of the storage node.
Figure 10B:
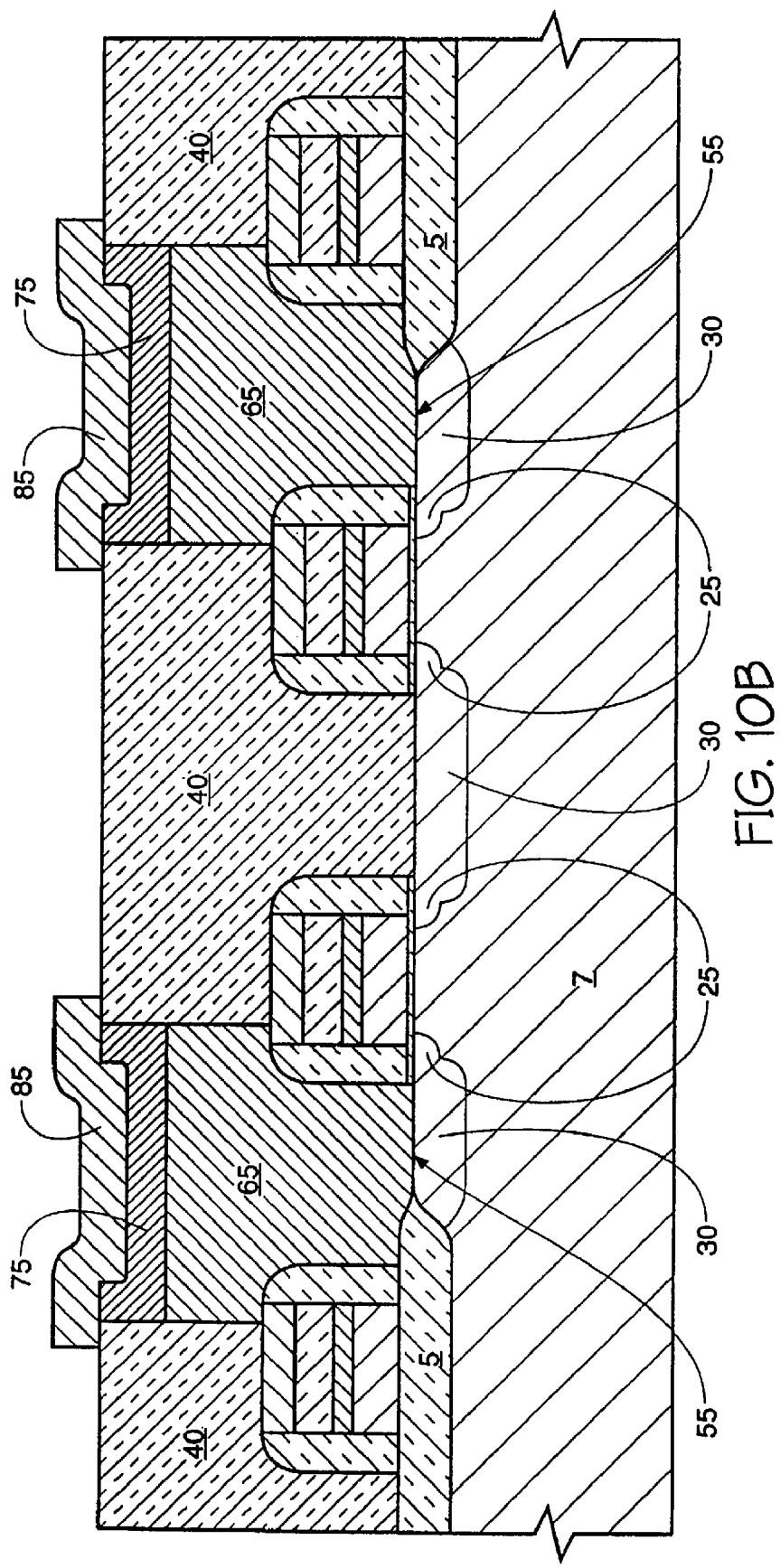

FIGS. 10a and 10b depict the structure following the masking of the platinum layer 85 overlying the tantalum and the removal of unmasked portions of the platinum layer 85 to form the completed storage node electrode of the storage cell capacitor. Typically the storage node electrode is thought of as comprising the tantalum layer 75 and the platinum layer 85. The polysilicon plug 65 is often thought of as an electrical interconnect interposed between the substrate and the storage node electrode, although it can be thought of as a portion of the storage node itself.

Figure 11A:
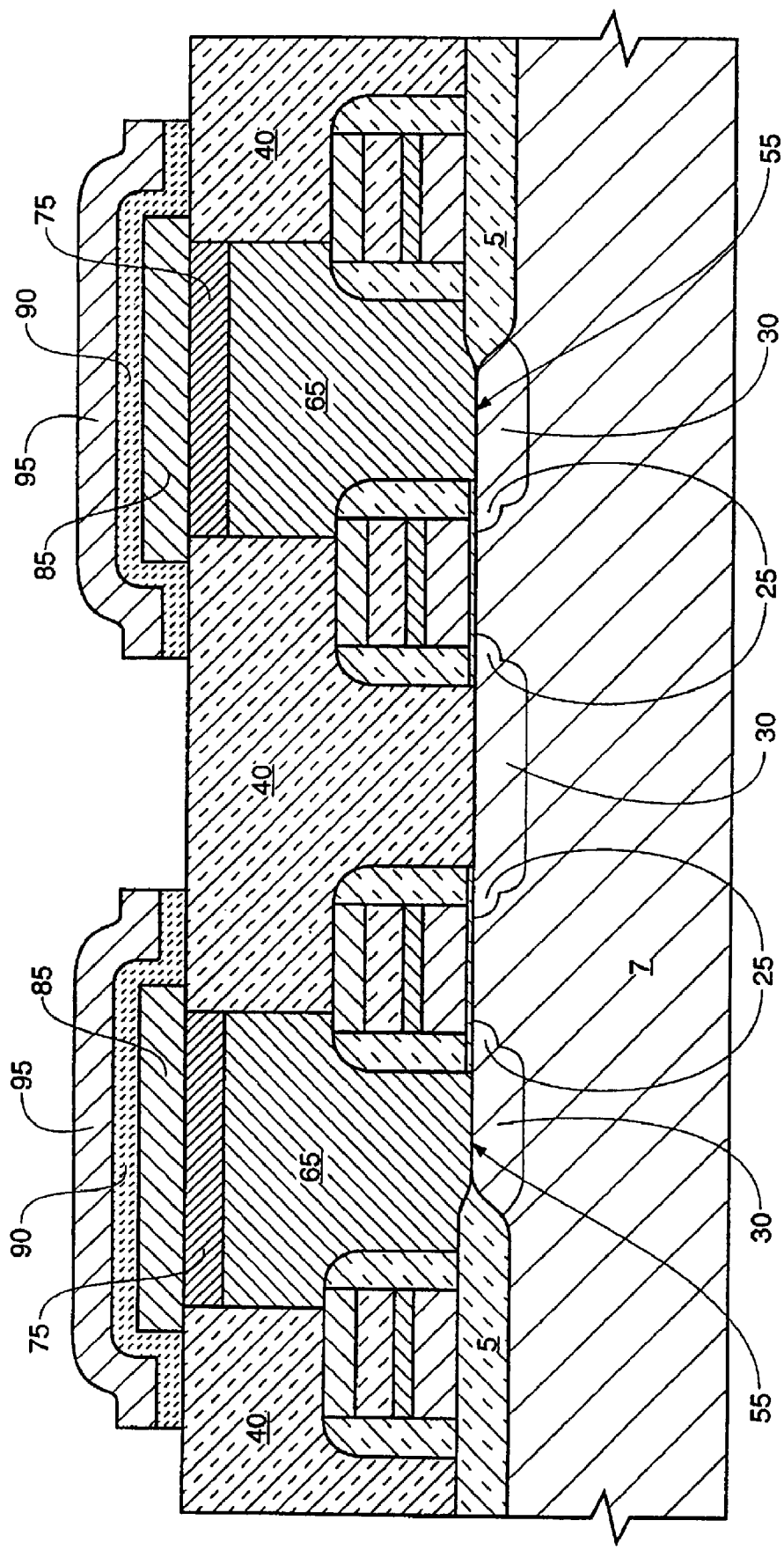
FIGS. 11a and 11b are wafer portions of FIGS. 10a and 10b following the deposition of a BST dielectric layer and a cell plate layer and patterning of these layers to complete the formation of the storage cell capacitor.
Figure 11B:
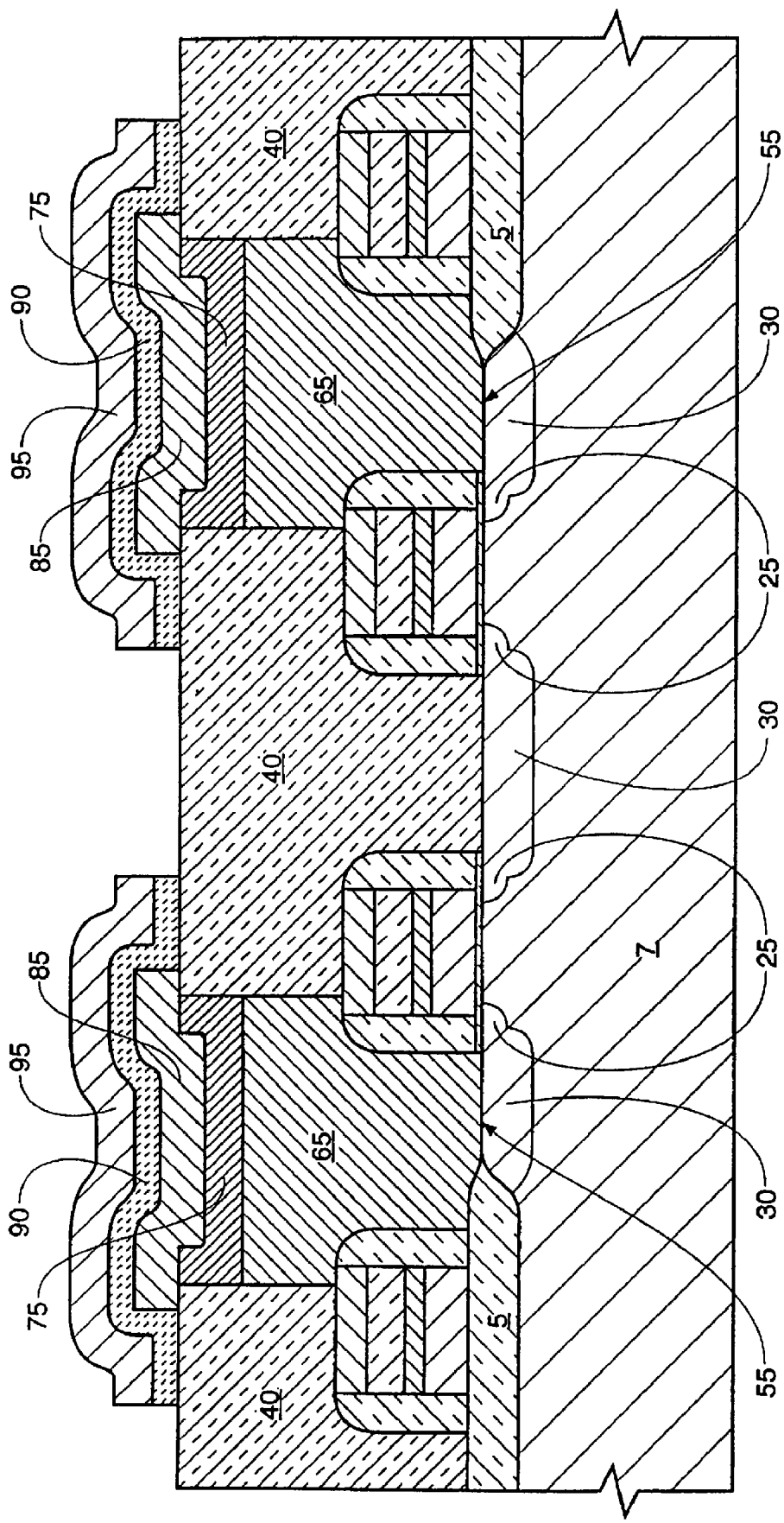

FIGS. 11a and 11b depict the storage cell capacitor following a deposition and anneal of a dielectric layer 90 overlying the platinum layer 85 of FIGS. 10a and 10b, respectively. The dielectric layer is typified as having a high dielectric constant. The storage cell capacitor fabrication is completed with the sputter or CVD of a 50 to 200 nm thick cell plate layer 95 to form a cell plate electrode. The cell plate layer 95 is typically Platinum, TiN or some other conductive material.

Among the suitable materials for a dielectric layer having a high dielectric constant are $Ba_xSr_{(1-x)}TiO_3$ [BST], $BaTiO_3$, $SrTiO_3$, $PbTiO_3$, $Pb(Zr,Ti)O_3$ [PZT], (Pb,La) $(Zr,Ti)O_3$ [PLZT], (Pb,La) $TiO_3$ [PLT], $KNO_3$, and $LiNbO_3$. In the applicant's invention BST is the preferred material and is deposited at a thickness range of 30 nm-300 nm by RF-magnetron sputtering or CVD. The tantalum layer 75 is not oxidized during the application of a high temperature anneal due to the fact that it is protected on its sidewalls 80 by the oxide layer 40 and that it is protected on its upper surface by the platinum layer 85, see FIG. 11. Therefore even after the formation of the dielectric layer the recess retains the original tantalum 75 formed therein and capacitance is not sacrificed as it would be when portions of the tantalum 75 are consumed by oxidation. Therefore capacitance is effectively increased over methods where portions of tantalum are oxidized.

The process can be continued or modified to accommodate the steps described in U.S. Pat. No. 5,168,073, previously incorporated by reference, for providing electrical interconnection between a plurality of capacitors thus formed.

By utilizing the method of the preferred embodiments of the invention, a high density memory device is provided featuring a stacked capacitor formed in a compact area as a result of a dielectric layer having a high dielectric constant and retention of storage node integrity during an anneal of the dielectric layer and the capability of depositing a very thick platinum layer as a portion of the first electrode.

Although a process and an alternate process have been described for forming the storage cell capacitor it is apparent the process is equally applicable for the fabrication of other types of capacitors used in integrated circuits. It should also be apparent to one skilled in the art that changes and modifications, such as deposition depths, may be made thereto without departing from the spirit and scope of the invention as claimed.

In the crown embodiment of the invention the initial formation of the capacitor is accomplished according to the steps depicted in FIGS. 2-5 and described in reference to FIGS. 2-5. The process continues with steps 12-19. Layers corresponding to similar layers of the previous embodiments shall be numbered the same.

Figure 12:
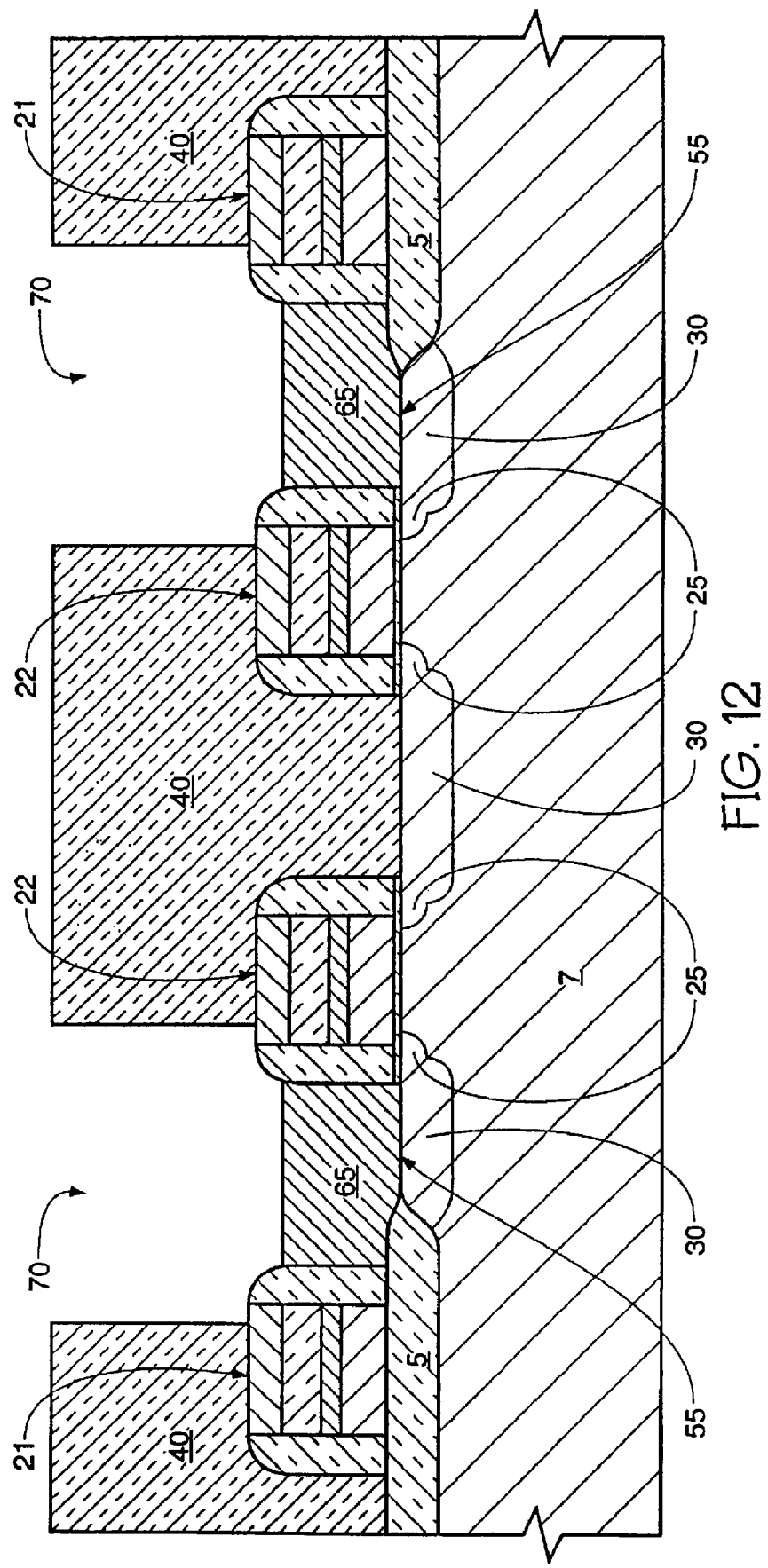
FIG. 12 is the cross sectional view of FIG. 5 following the formation of a recess in the oxide layer.

Referring now to FIG. 12, an upper portion of each polysilicon plug 65 is removed during a dry etch in order to form recesses 70. Typically, this etch back is 50 to 400 nano meters (nm). In a case where the polysilicon plugs 65 are formed during a selective silicon growth it is possible to form the recess 70 by controlling the growth.

Figure 13:
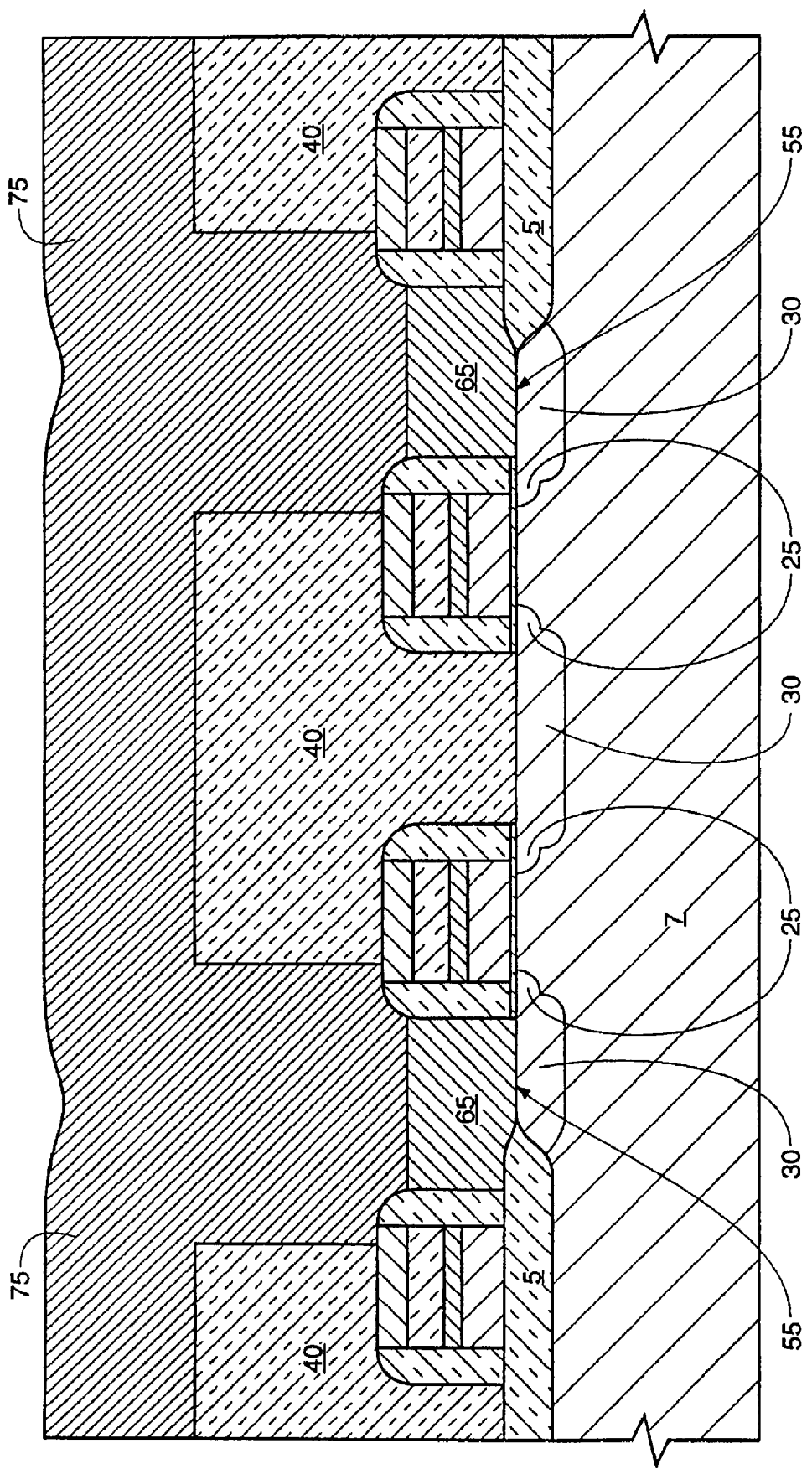
FIG. 13 is the cross sectional view of FIG. 12 following the deposition of a barrier layer.

Referring to FIG. 13, a tantalum layer 75 is formed by a chemical vapor deposition (CVD) or a sputtering process, which may be performed at room temperature. The tantalum layer 75 provides a barrier against silicon diffusion of the polysilicon plug during subsequent high temperature anneals. Other materials capable of prohibiting silicon diffusion may be used in place of tantalum such as, for example: titanium nitride, TaN, Ti, $RuO_2$, and Ru.

Figure 14:
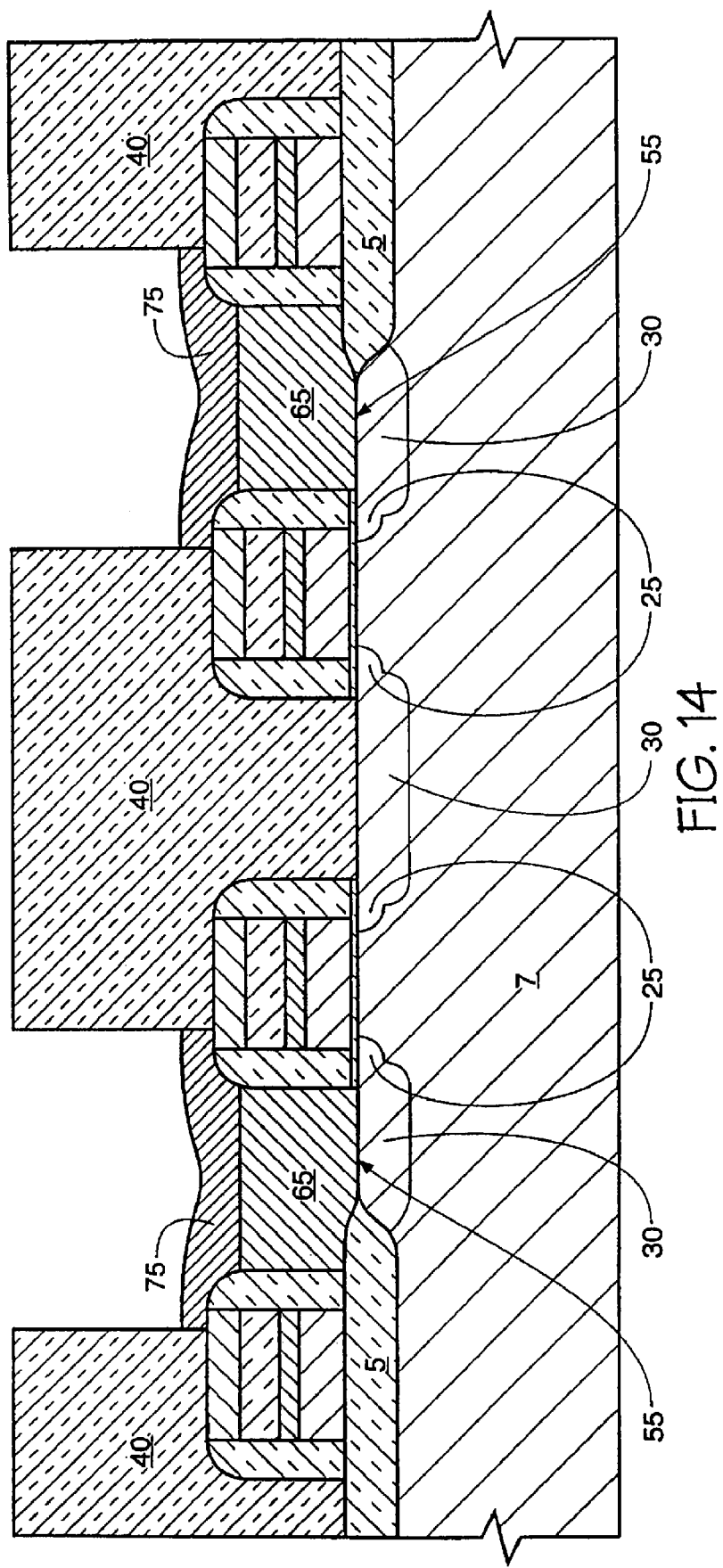
FIG. 14 is the cross sectional view of FIG. 13 following an etch back of the barrier layer.

Referring to FIG. 14, the tantalum layer 75 shown in FIG. 7 is etched back in order to expose the oxide layer 40 and in order to retain tantalum 75 in recesses 70 overlying the polysilicon plugs 65. The tantalum layer 75 should be recessed below a top surface of the exposed oxide layer 40. The etch back may be preceded by a planarization to remove the tantalum overlying the oxide layer 40. Portions of the oxide layer 40 may be planarized during this step. The thickness of the initial tantalum layer 75 is preferably such that after the etch back/planarization or the etch back the portion of the tantalum layer 75 retained in the recess 70 has a depth sufficient to inhibit silicon diffusion of the polysilicon plugs 65. It can be seen that at this juncture of the process only the upper surface of the tantalum layer 75 is exposed and the tantalum sidewall 80 is protected by the oxide layer 40.

Figure 15:
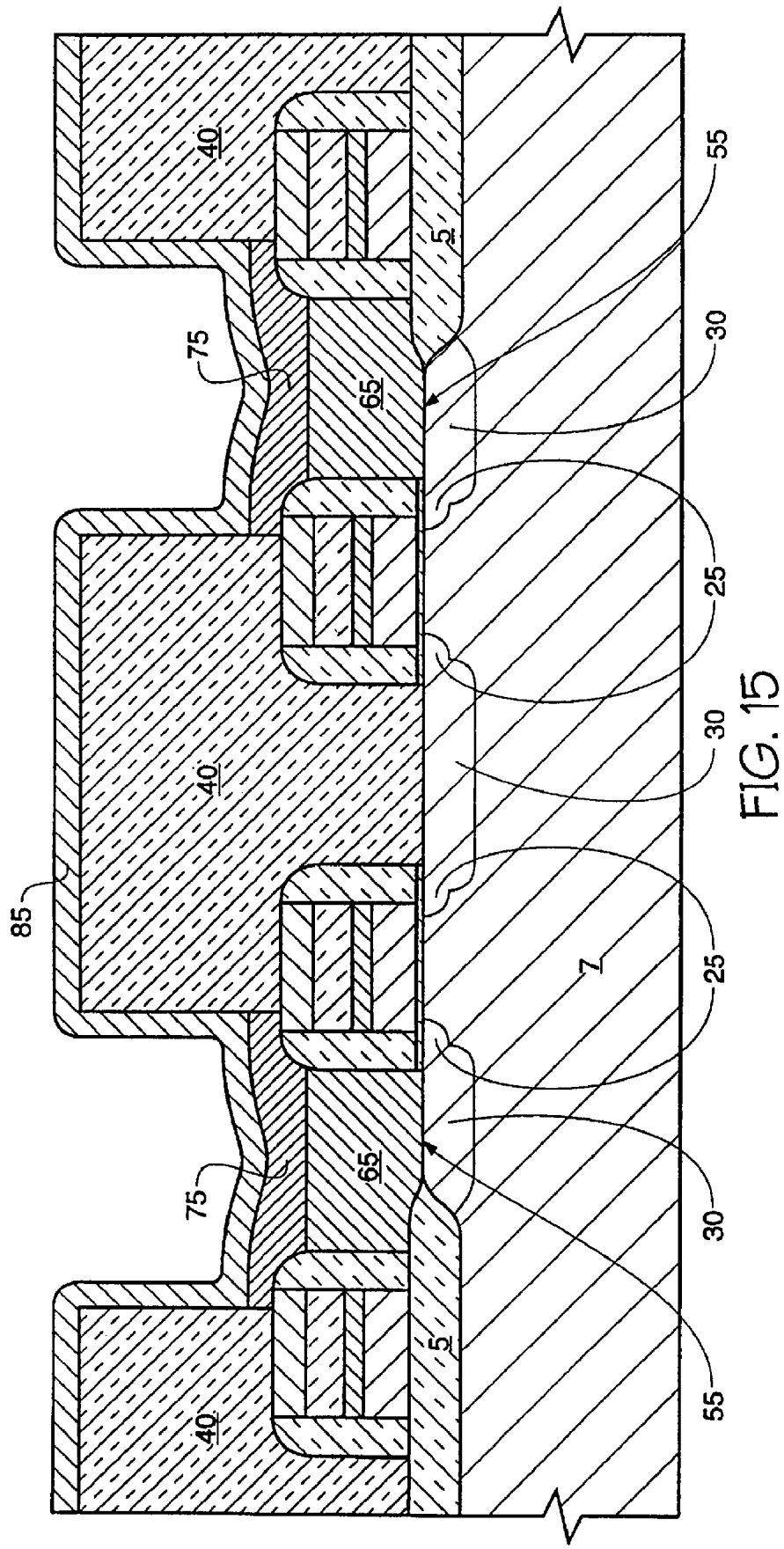
FIG. 15 is the cross sectional view of FIG. 14 following a deposition of an oxidation resistant layer.

Referring now to FIG. 15, a platinum layer 85 is formed by CVD or a sputtering technique. The platinum layer 85 overlies the tantalum layer 75. Since the platinum layer 85 is resistant to oxidation it provides an excellent surface for the deposition of the high dielectric constant material. Other materials which are resistant to oxidation may be used in place of the platinum. For example, $RuO_2$ and TiN, as well as other non-oxidizing materials may be used. In this embodiment of the invention the platinum layer 85 is relatively thin, approximately 50 nm thick, although other thicknesses may be used without departing from the spirit and scope of the invention. The thickness of the platinum should be great enough to substantially protect the tantalum layer 75 against oxidation during BST deposition.

Figure 16:
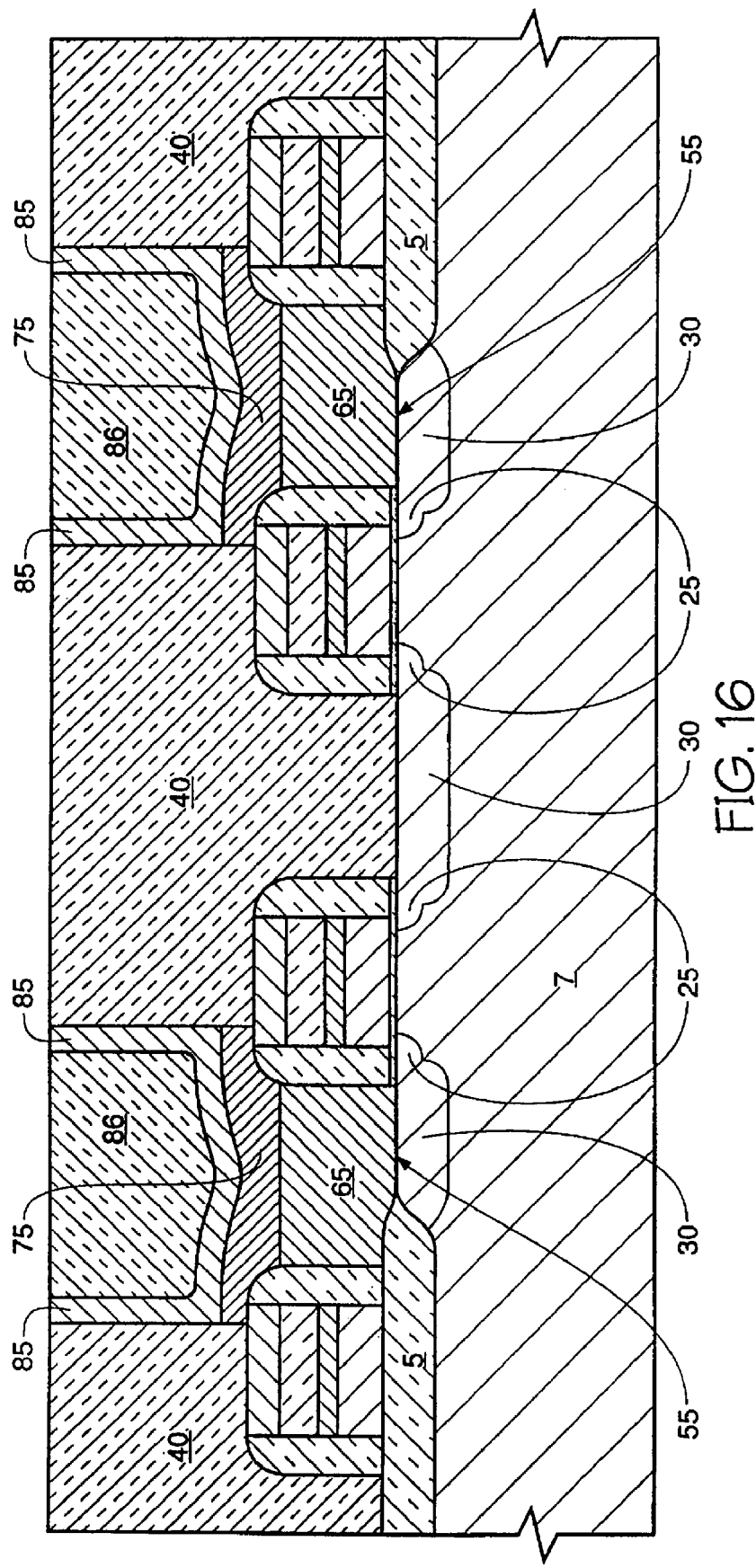
FIG. 16 is the cross sectional view of FIG. 15 following a further oxide deposit and the planarization of the oxide and the oxidation resistant layer.

In FIG. 16 oxide 86 is deposited into the recess 70, and the structure is planarized to remove portions of the platinum layer 85 overlying the oxide layer 40.

Figure 17:
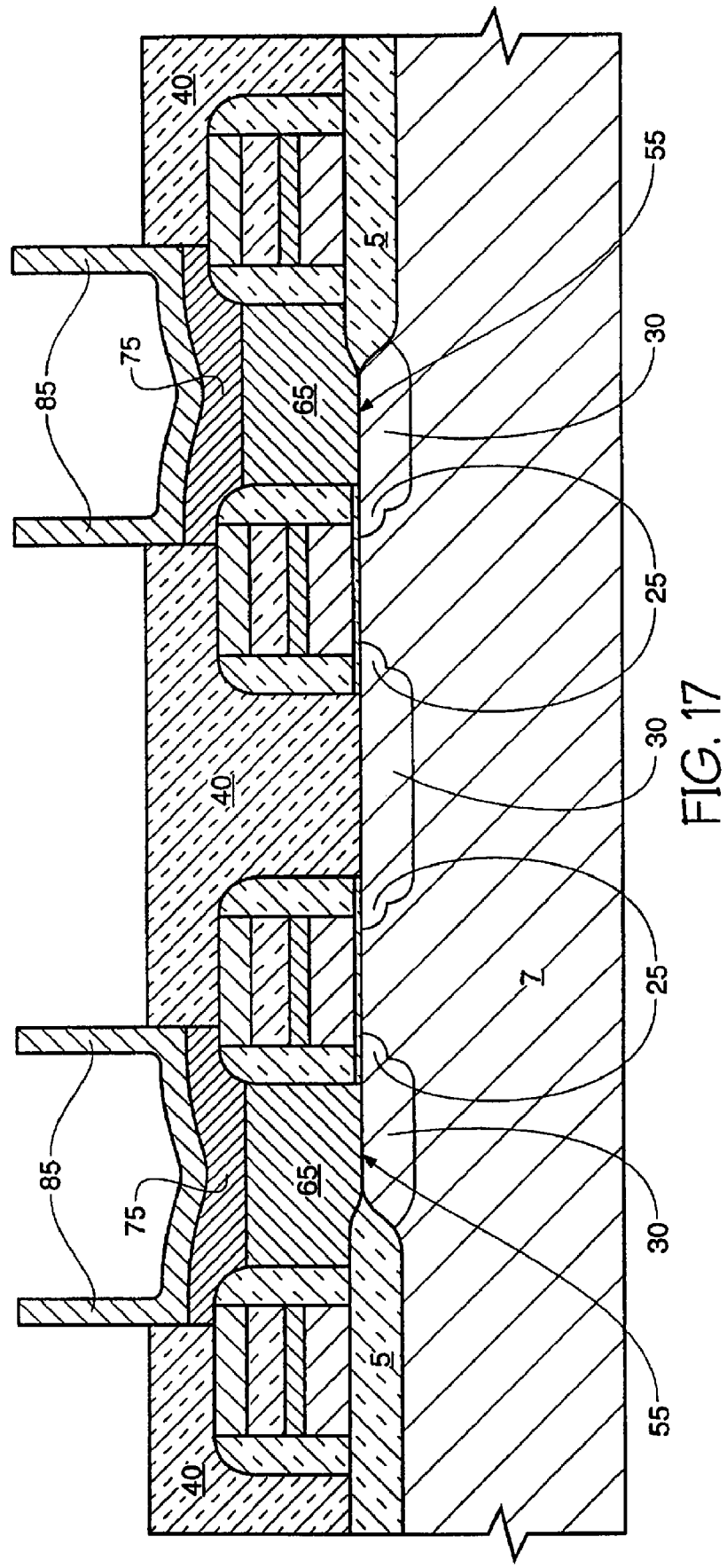
FIG. 17 is the cross sectional view of FIG. 16 following an etch back of the oxide deposits.
Figure 1B:
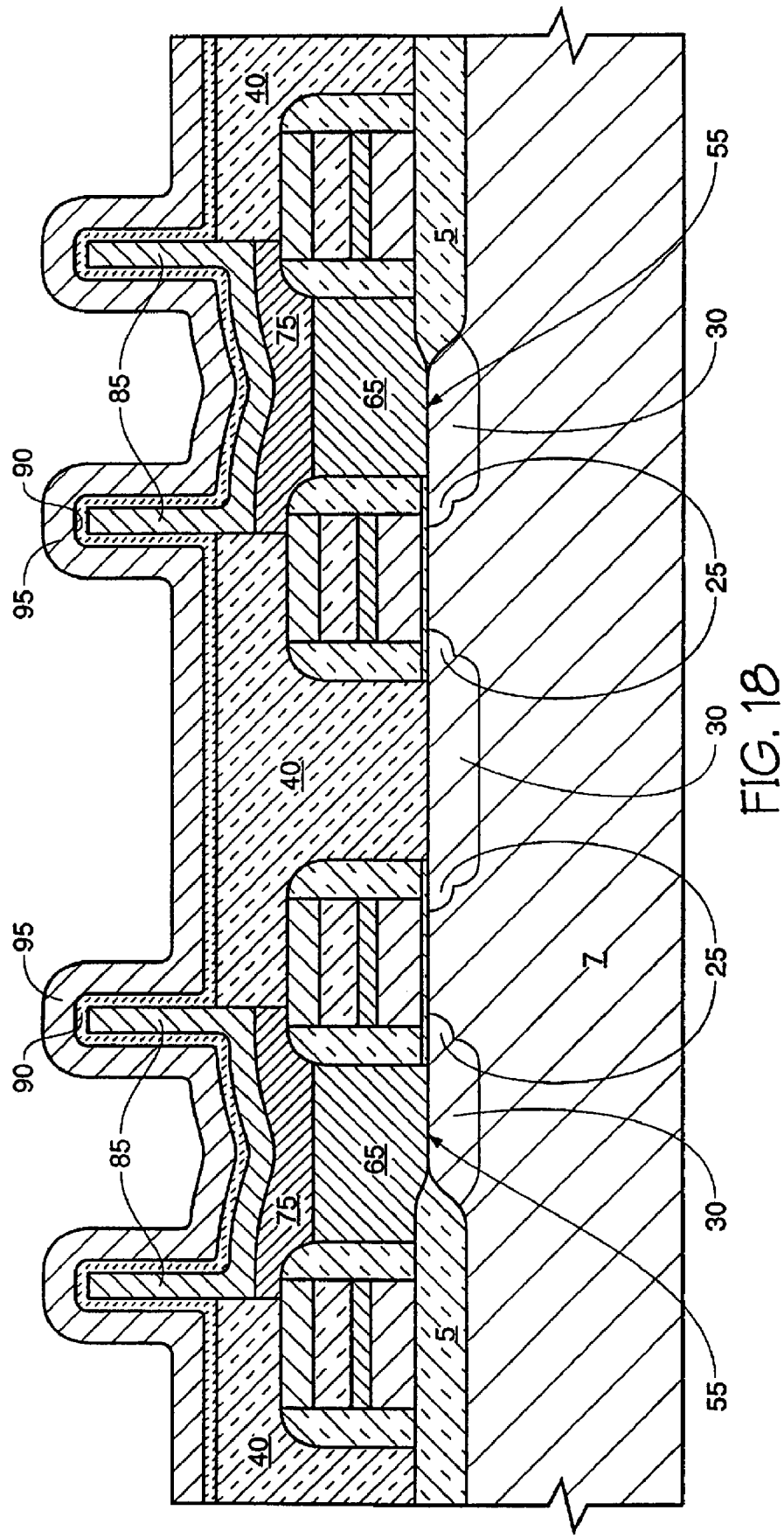

In FIG. 17 the oxide layers 40 and 86 have been etched to expose a vertical sidewall of the platinum layer 85 and the upper surface of the platinum layer 85. It is necessary to retain a sufficient quantity of oxide 40 at the lower sidewall of platinum layer 85 to eliminate the possibility of oxidizing the tantalum layer 75. In order to retain sufficient oxide 40 while at the same time exposing the upper surface of the platinum layer 85 the densification of the oxide 86 must be less than the densification of oxide 40 in order for the oxide layer 86 to etch at a faster rate than the oxide layer 40.

Now the fabrication of the crown embodiment the storage node electrode is complete. Although the polysilicon plug 65 is often thought of as an electrical interconnect interposed between the substrate and the storage node electrode, it can be thought of as a portion of the storage node electrode itself.

FIG. 18 depicts initial formation of the storage cell capacitor following a deposition and anneal of a dielectric layer 90 overlying the platinum layer 85. The dielectric layer 90 is typified as having a high dielectric constant. The storage cell capacitor fabrication is completed with the sputter or CVD of a 50 to 200 nm thick cell plate layer 95 to form a cell plate electrode. The cell plate layer 95 is typically platinum, TiN or some other conductive material.

Figure 19:
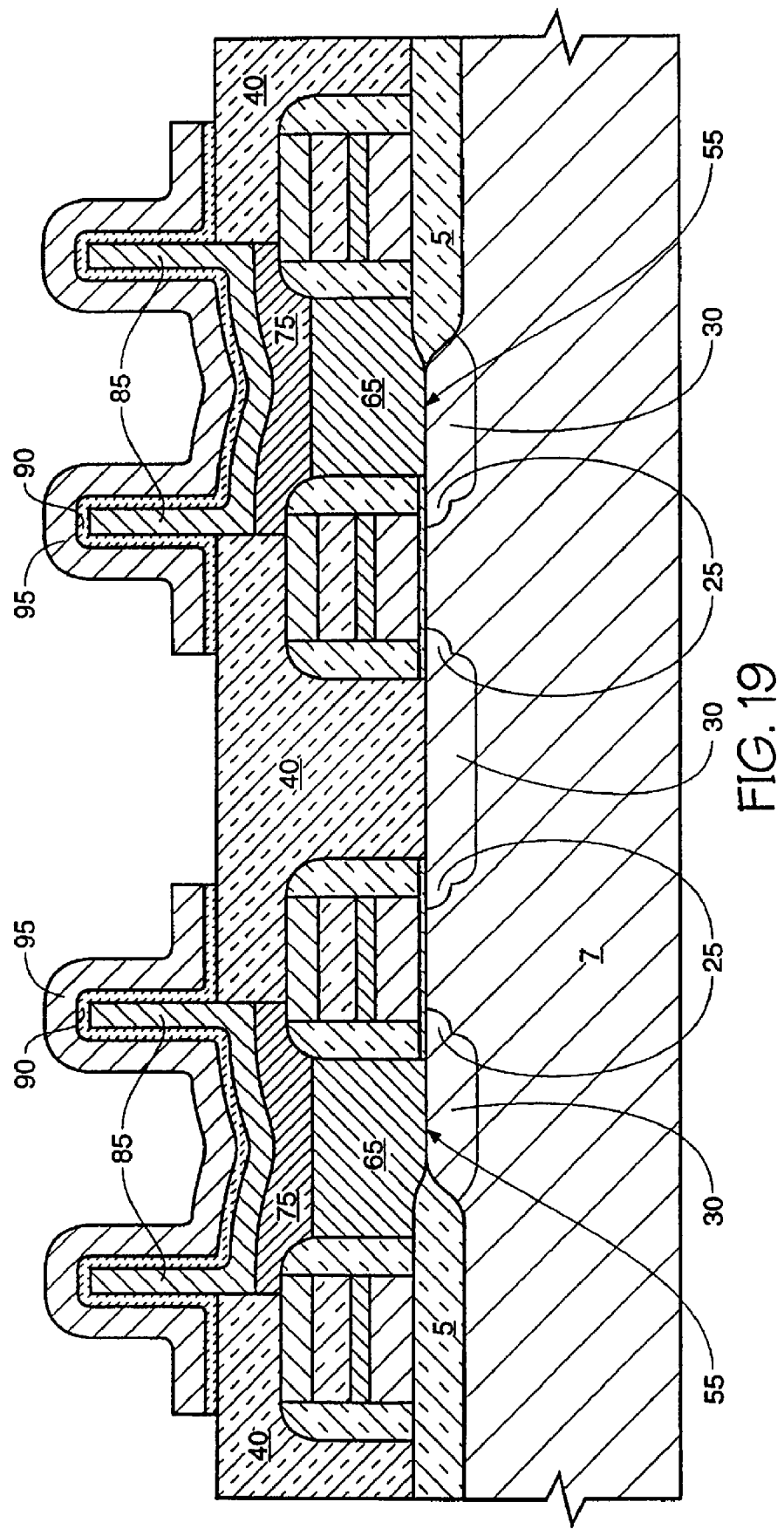
FIG. 19 is the cross sectional view of the capacitor made by the process described in steps 2-5 and 12-19.

Following the deposition of the dielectric layer 90 and the cell plate layer 95 the storage cell capacitor is patterned and the cell plate layer 95 and the dielectric layer 90 are etched to complete the fabrication of the storage cell capacitor as shown in FIG. 19.

Among the suitable materials for a dielectric layer having a high dielectric constant are $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$. In currently envisioned embodiments BST is the preferred material and is deposited at a thickness range of 30 nm-300 nm by RF-magnetron sputtering or CVD. The tantalum layer 75 is not oxidized during the application of a high temperature anneal due to the fact that it is protected on its sidewall by the oxide layer 40 and that it is protected on its upper surface by the platinum layer 85.

The process can be continued or modified to accommodate the steps described in U.S. Pat. No. 5,168,073, previously incorporated by reference, for providing electrical interconnection between a plurality of capacitors thus formed.

By utilizing the method of the invention, a high density memory device is provided featuring a stacked capacitor formed in a compact area as a result of a dielectric layer having a high dielectric constant. The stacked capacitor of the invention retains storage node integrity during an anneal of the dielectric layer.

Figure 20:
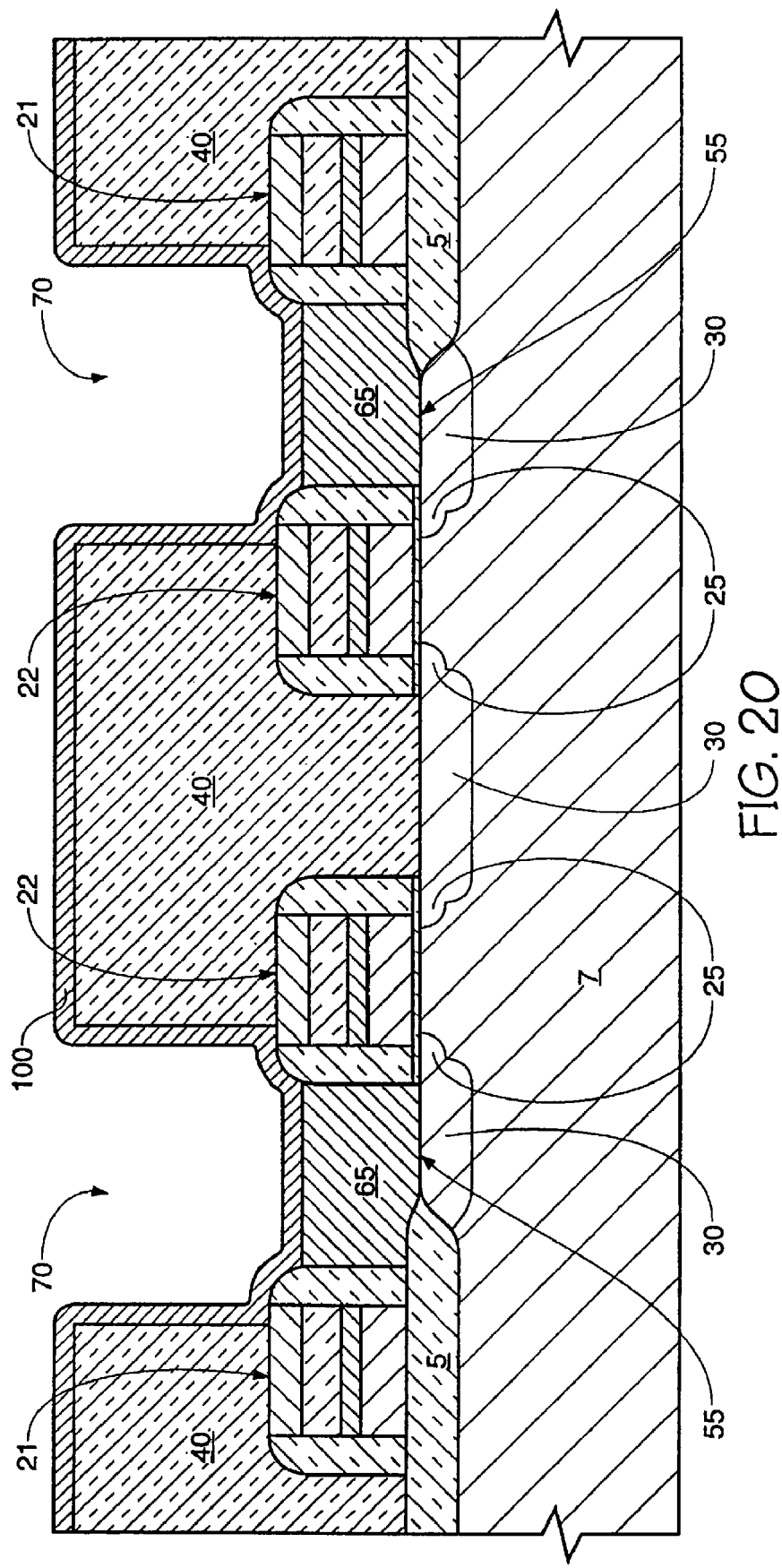
FIG. 20 is the cross sectional view of FIG. 12 following the formation of a conductive layer.

In an alternate embodiment of the crown embodiment, the deposition of the tantalum layer is preceded by a deposition of a titanium barrier layer 100, see FIG. 20. A thermal anneal is performed. The titanium in contact with the polysilicon plug reacts with the polysilicon to form titanium silicide during the anneal. It is possible to perform the anneal in nitrogen. In this case the titanium still reacts with the polysilicon to form titanium silicide, and the titanium which is not in contact with the polysilicon plug reacts with the nitrogen to form TiN. In addition a thin layer of nitrogen is formed overlying the titanium silicide.

In addition to titanium, other metals including refractory metals may be used. These refractory metals may include W, Co, Ta, and Mo.

Alternately a metal nitride, such as TiN, may be deposited instead of a refractory metal. The refractory metal and the metal nitride are both capable of reacting with the polysilicon plug to form a silicide during an anneal.

Figure 21:
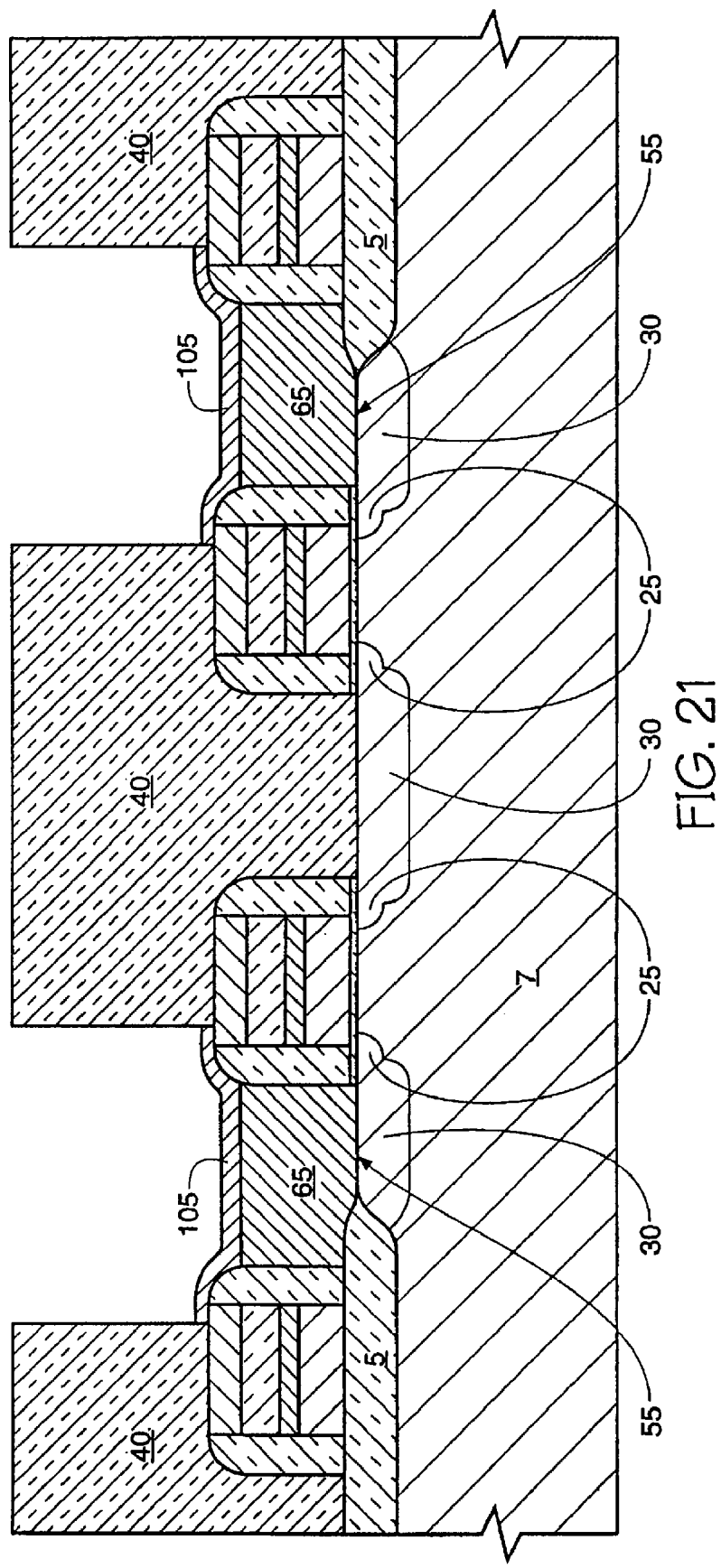
FIG. 21 is the cross sectional view of FIG. 20 following removal of non silicide portions of the refractory metal (or metal nitride) layer.
Figure 22:
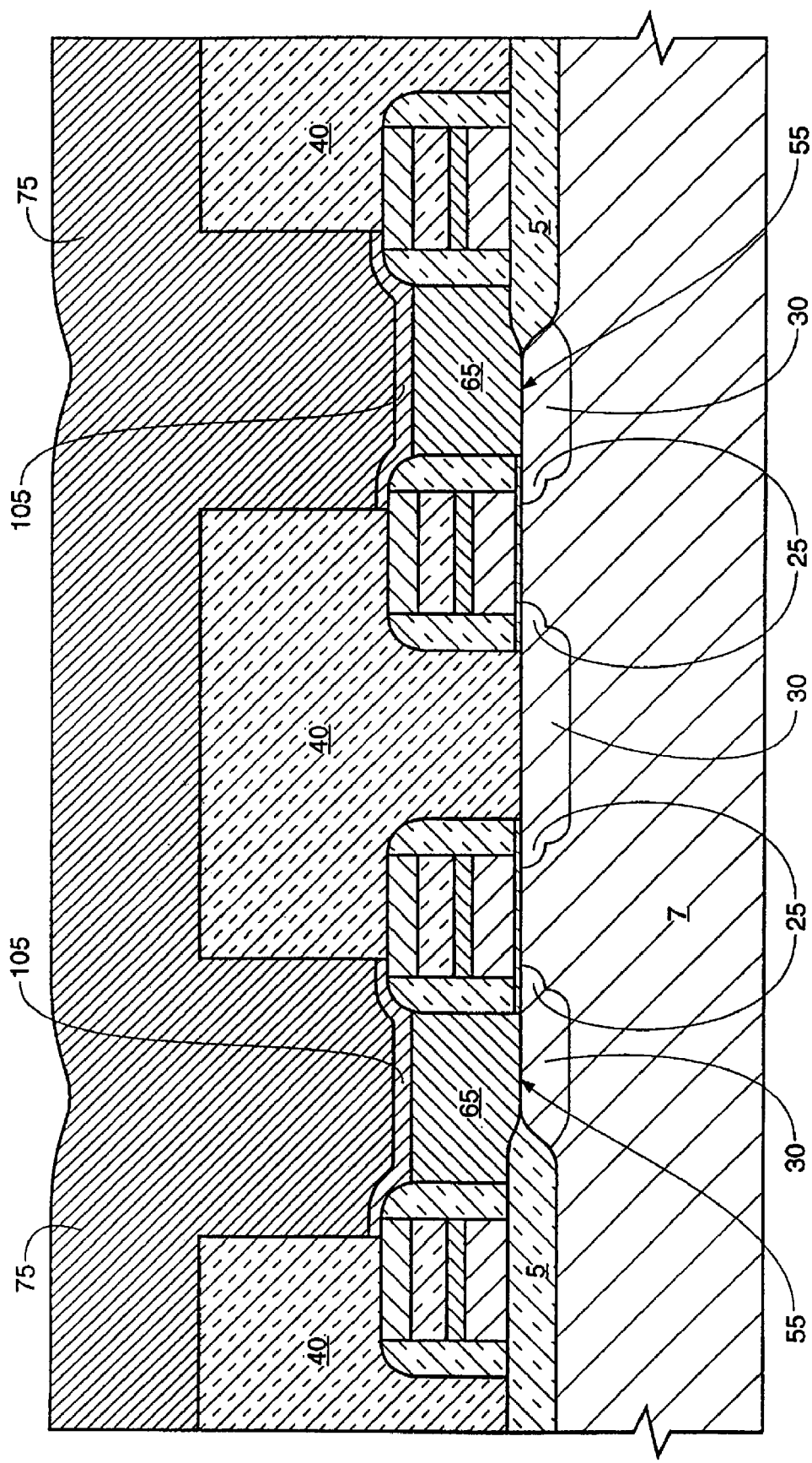
FIG. 22 is the cross sectional view of FIG. 21 following the formation of a barrier layer.
Figure 23:
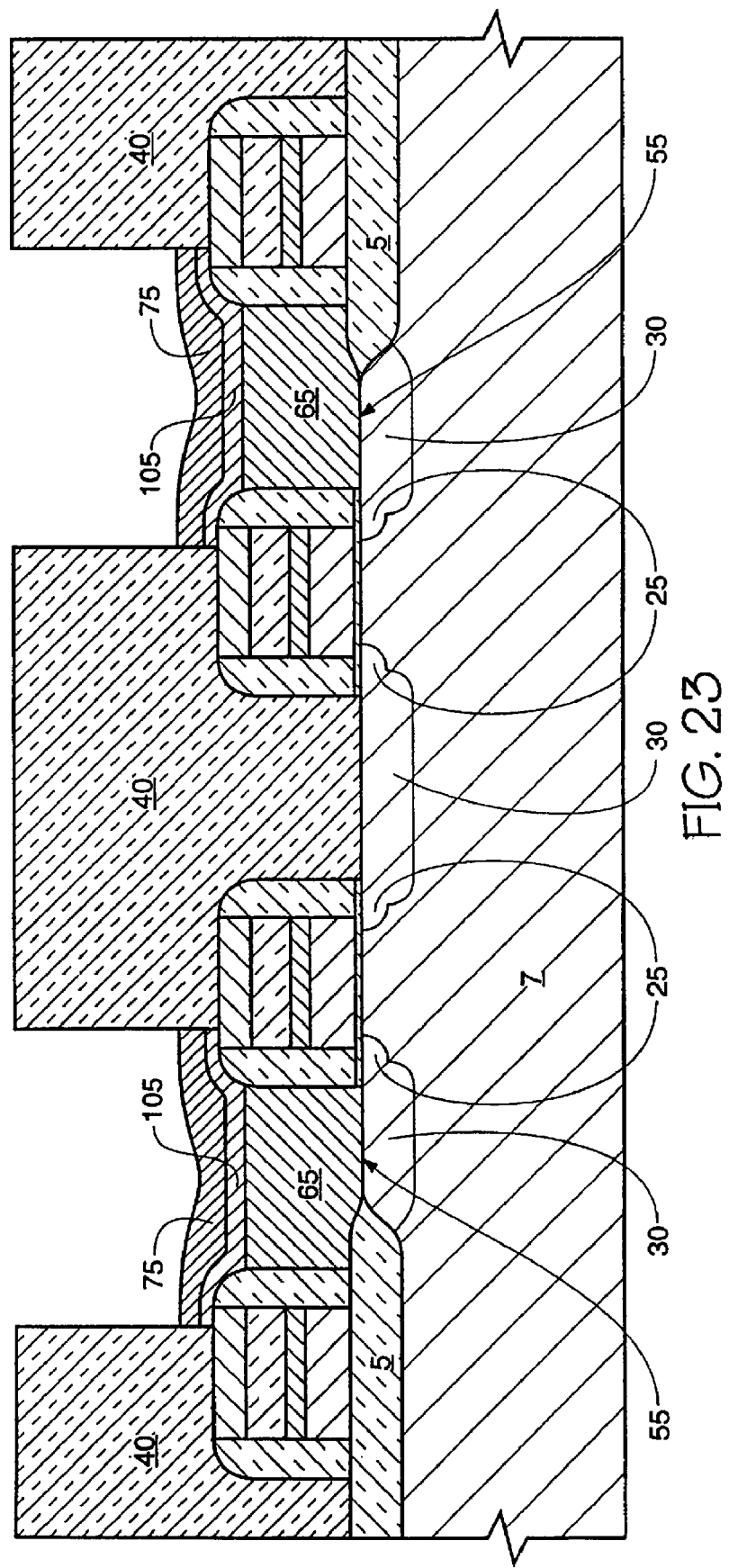
FIG. 23 is the cross sectional view of FIG. 22 following an etch back of the barrier layer.
Figure 24:
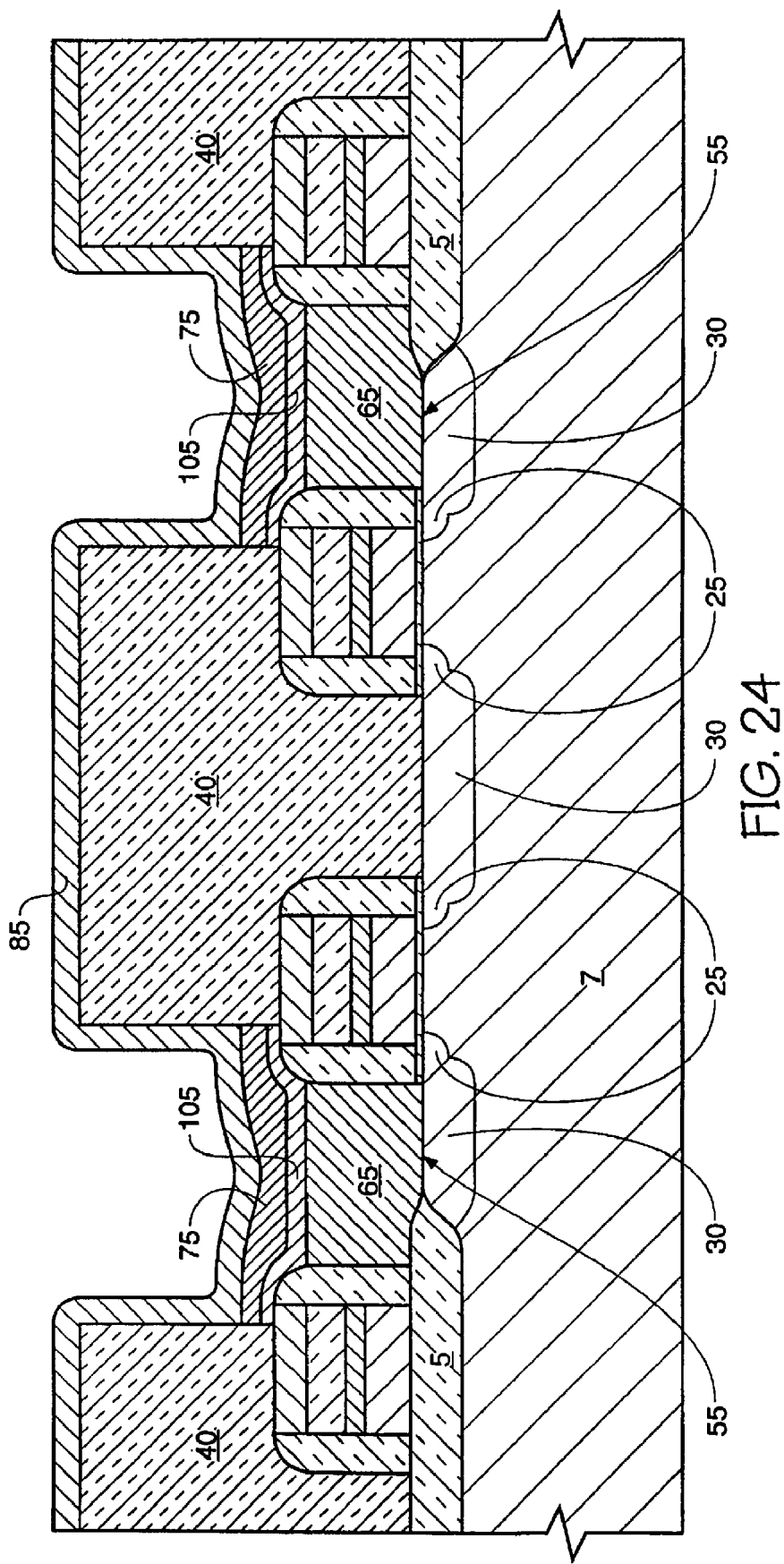
FIG. 24 is the cross sectional view of FIG. 23 following a deposition of an oxidation resistant layer.
Figure 25:
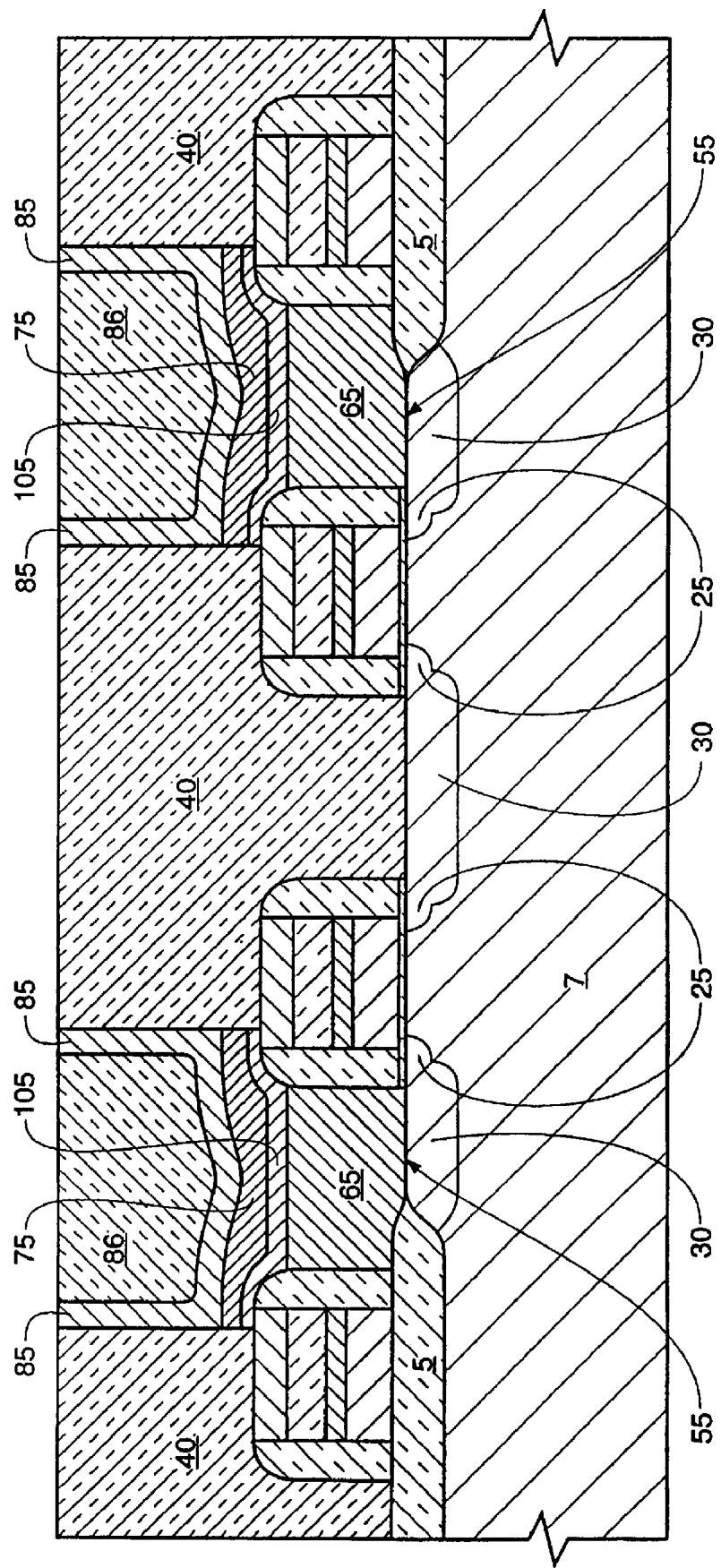
FIG. 25 is the cross sectional view of FIG. 24 following a further oxide deposit and the planarization of the oxide and the oxidation resistant layer.
Figure 26:
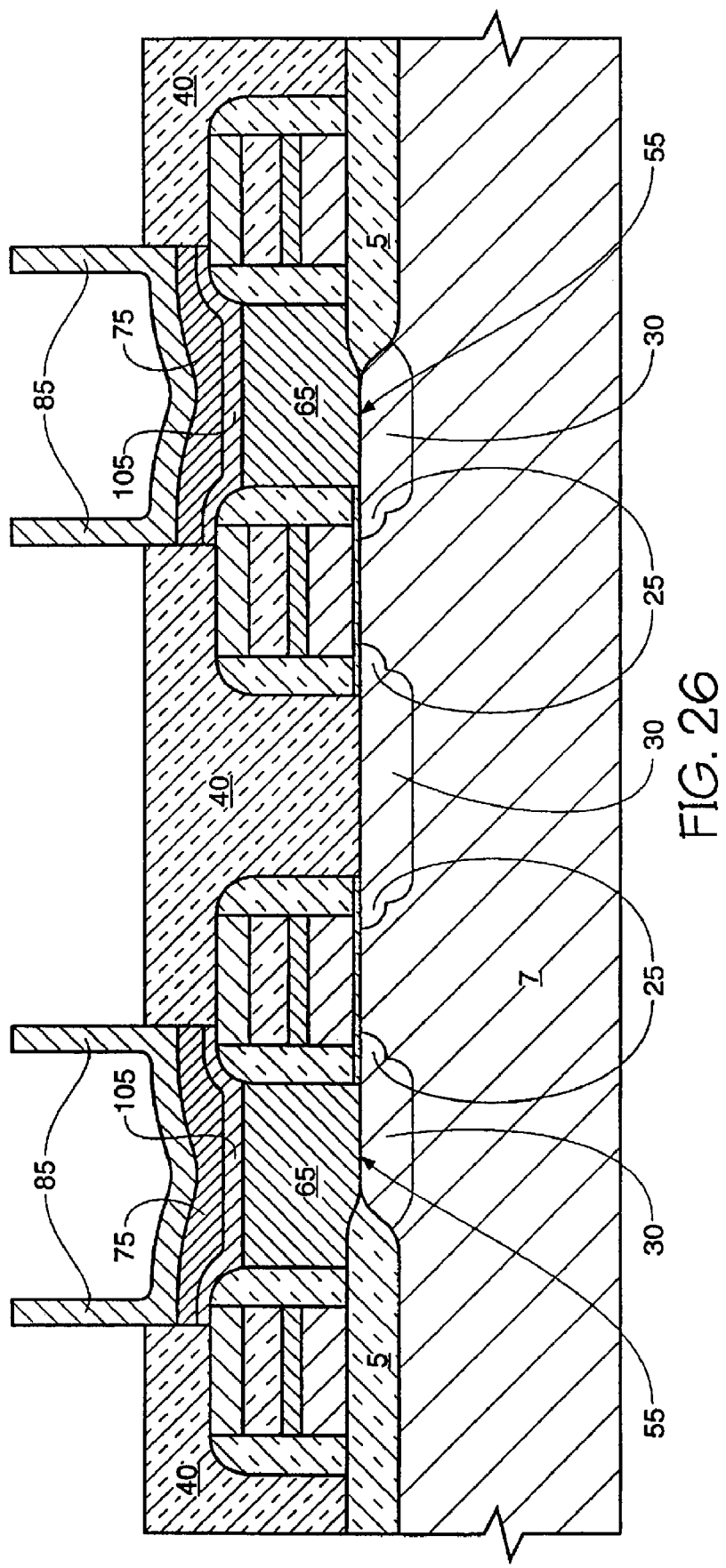
FIG. 26 is the cross sectional view of FIG. 25 following an etch back of the oxide deposits.
Figure 27:
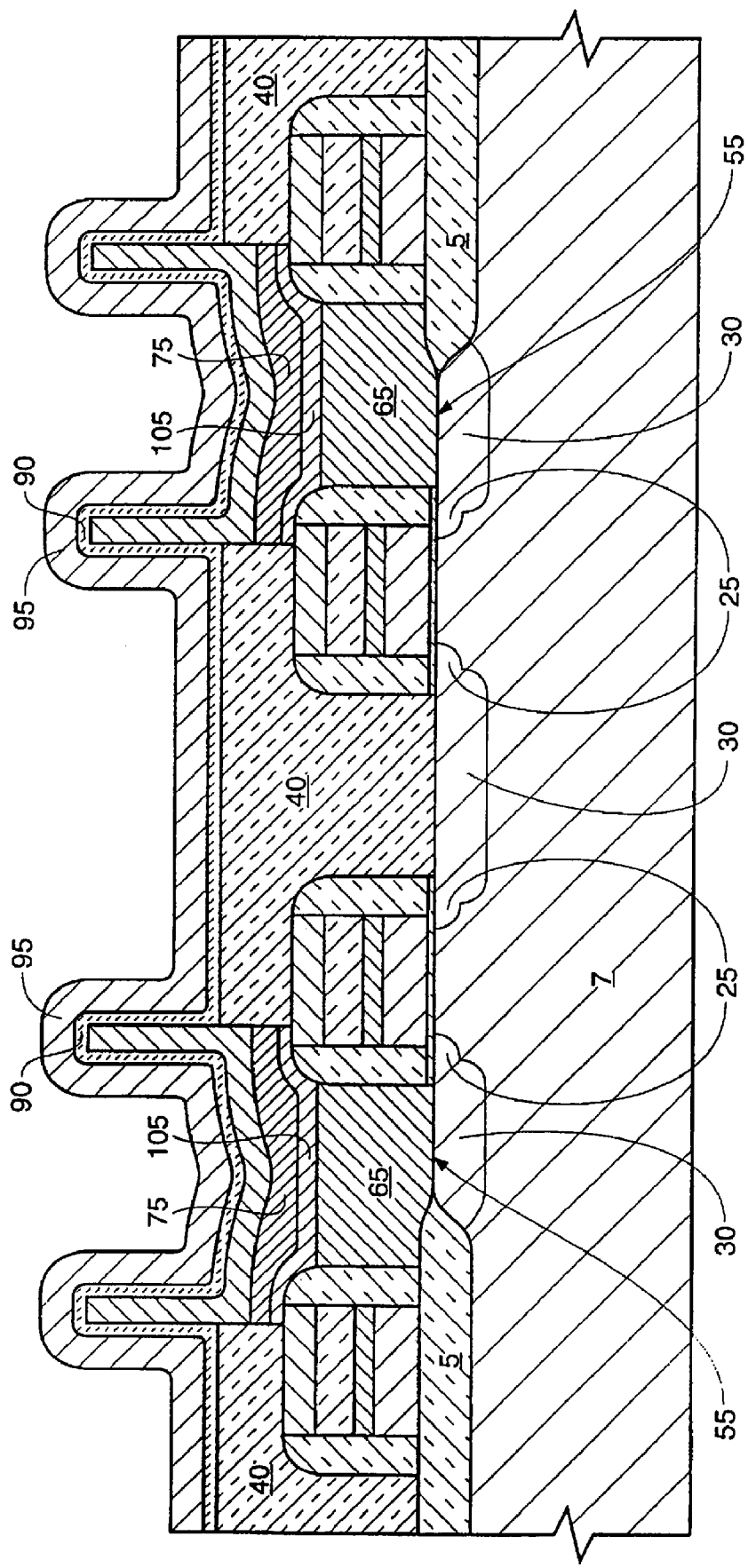
FIG. 27 is the cross sectional view of FIG. 26 following formation of a dielectric layer and cell plate layer.
Figure 28:
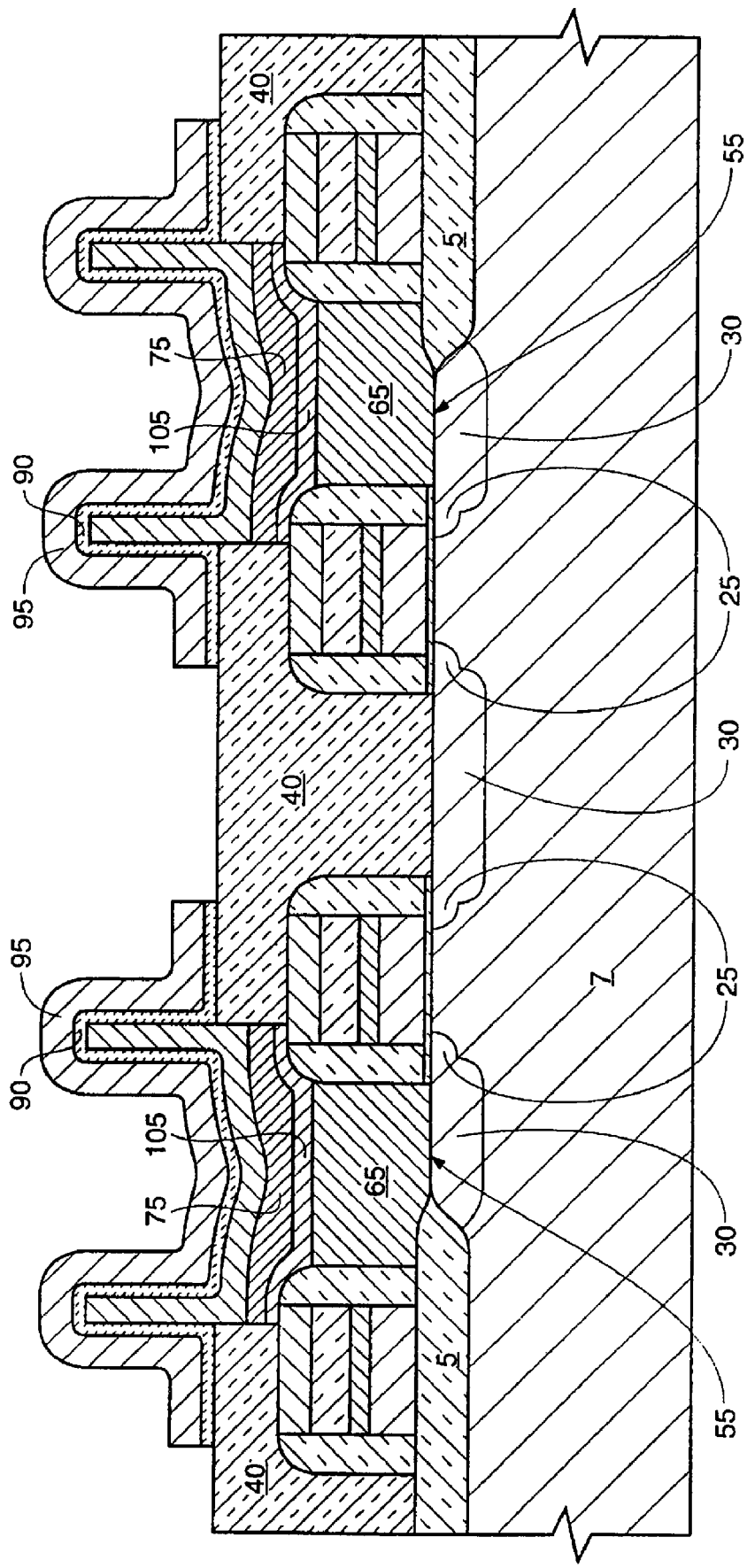
FIG. 28 is the cross sectional view of the capacitor made by the process described in steps 2-5, 12, and 20-28.

Referring now to FIG. 21, the non-silicide layer (the unreacted titanium, in the case of a non-nitrogen anneal, or TiN formed during the nitrogen anneal) and the thin layer of nitrogen formed overlying the titanium silicide 105 have been removed during a wet etch. The titanium silicide 105 overlying the polysilicon plug is retained during the etch.

The process is continued as shown in FIGS. 22-28 and the process corresponds to the process described with respect to FIGS. 13-19, respectively, of the previous embodiment with the exception that the barrier layer 75 is TiN in the present embodiment rather than tantalum which was used in the previous embodiment. However, tantalum, TaN, Ti, $RuO_2$, and Ru may be used.

The titanium silicide layer 105 lowers a contact resistance between the polysilicon plug 65 and the TiN layer 75.

The TiN layer 75 provides a barrier against silicon diffusion of the polysilicon plug and the titanium silicide layer during subsequent high temperature anneals.

An embodiment includes a storage cell capacitor and methods relating to fabrication of the components of the capacitor and related structures. Two embodiments of the invention are directed to maximizing storage cell capacitance utilizing minimal masking steps. The capacitor of each cell makes a self-aligned contact with a buried contact within the cell, while the capacitor extends to the active area of an adjacent cell. The active areas can be arranged in interdigitated columns and noninterdigitated rows or simply parallel and in line to one another in both the vertical and horizontal directions.

The rows are referred to as wordlines, and the columns are referred to as digit lines or bit lines. The active areas are used to form active metal-oxide semiconductor (MOS) transistors that can be doped as NMOS or PMOS type FETs depending on the desired use. The invention is a storage contact capacitor utilizing the vertical portion of the DRAM in which to fabricate a tungsten and TiN storage node capacitor plate and the invention is the method for fabricating the same.

The process steps of the invention are shown pictorially in FIGS. 29-46. FIGS. 29-34 are pertinent to both embodiments of the invention. FIGS. 35-40 are pertinent to the first embodiment, and FIGS. 41-46 are pertinent to the second embodiment.

Figure 29:
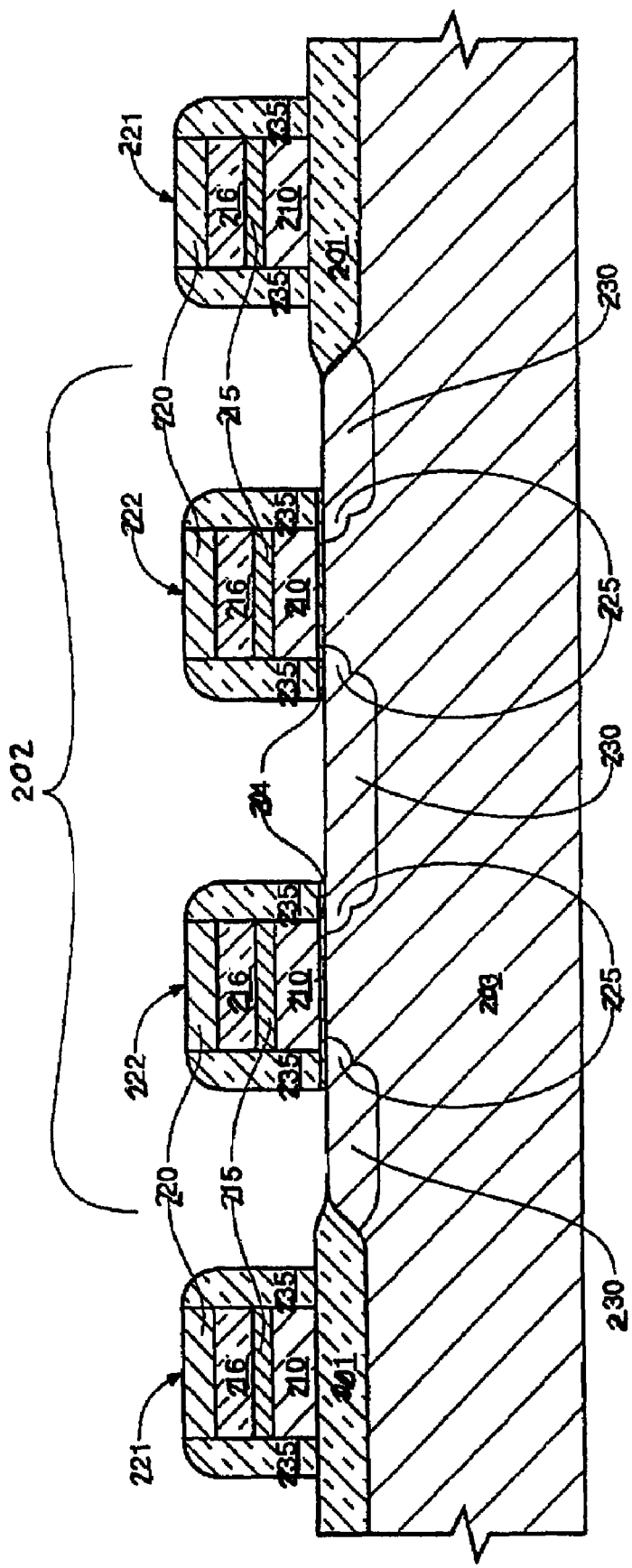
FIG. 29 is a cross-sectional view of a portion of a partially-processed semiconductor wafer which depicts field-effect transistors (FETs) overlying a silicon substrate and wordlines overlying field oxide.

Referring now to FIG. 29, a cross-sectional view of two in-process DRAM cells is shown following conventional local oxidation of silicon (LOCOS) or special LOCOS processing which creates substantially planar field oxide regions 201 (created using modified LOCOS process) and future active areas 202 (those regions of the substrate not covered by field oxide) on a silicon substrate 203. The creation of the field oxide is preceded by a thermally grown dielectric layer 204 of silicon oxide. The depicted cells are two of many cells that are fabricated simultaneously and comprise a memory array. Following the creation of the field oxide region 201 and dielectric layer 204 a first conductively doped polysilicon layer 210, a metal silicide layer (WSi$_x$) 215, an oxide layer 216, and a thick nitride layer 220 are deposited. The thick nitride layer 220 will function as an etch stop during the storage node buried contact etch, thus allowing self-alignment. The layers are patterned and etched to form wordlines 221 and N-channel (NCH) field effect transistors 222. The polysilicon layer 210 forms the gate regions of the FETs and is insulated from lightly-doped source/drain regions 225 by the dielectric layer 204. The lightly-doped regions 225 are created utilizing a phosphorus implant. Deposition, densification and a reactive ion etch (RIE) of a silicon dioxide spacer layer has created principal spacers 235 which offset an arsenic implant used to create the heavily-doped source/drain regions 230. Principal spacers 235 insulate the wordlines and FETs from subsequent digit line and capacitor fabrications. Eventually the wordlines are connected to periphery contacts. The periphery contacts are located at the end of the array and are capable of being in electrical communication with peripheral circuitry.

After the RIE etch the punchthrough improvement implant is processed to improve breakdown voltage of drain to source when $V_{Gate}$ equals zero volts (BVDSS) and to reduce subthreshold leakage. The gate oxide 204 remains intact and the field oxide is not etched.

Although the formation of the FETs 222 and wordlines 221 as described are preferred, other methods of fabrication are also feasible and perhaps equally viable. The following steps represent the methods of the two embodiments of the invention.

Figure 30:
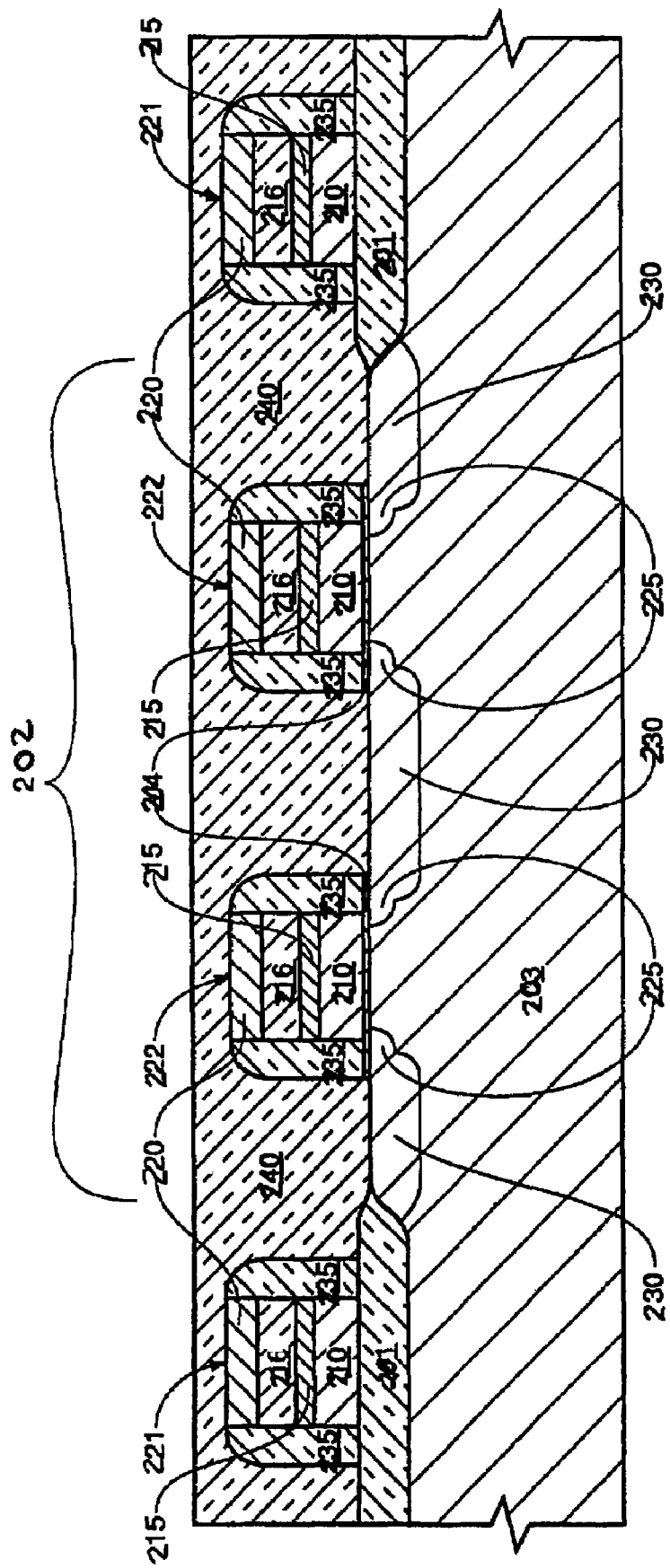
FIG. 30 is a cross-sectional view of the wafer portion of FIG. 29 following the deposit of an undoped thick oxide layer and planarization thereof.

In FIG. 30 a conformal layer of undoped oxide 240 is blanket deposited to fill the storage node areas and overlie the FETS 222 and wordlines 221. The oxide is undoped to minimize dopant out diffusion from the oxide 240 to the doped regions of the substrate. The oxide is planarized in order to provide a uniform height.

Figure 31:
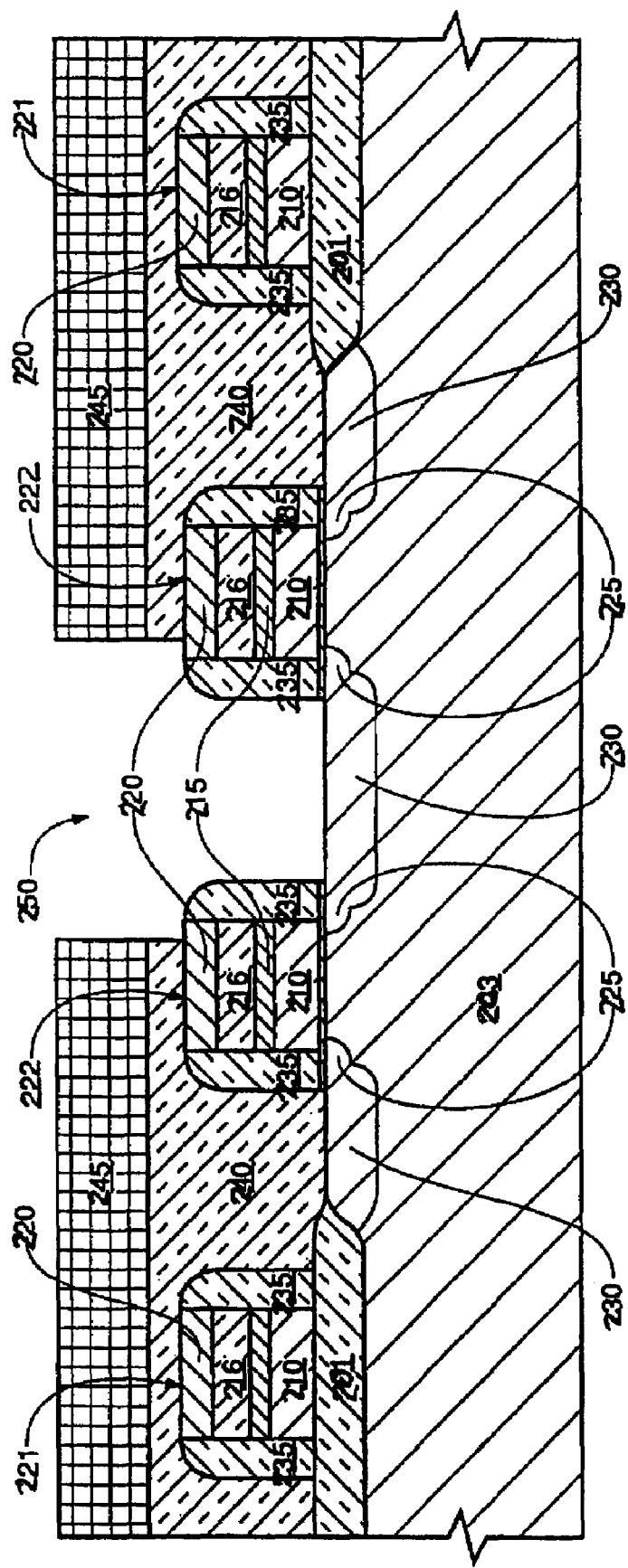
FIG. 31 is a cross-sectional view of the wafer portion of FIG. 30 following the masking and subsequent etching of the deposited oxide layer to form a self-aligned opening.

In FIG. 31 a photoresist digit line contact 245 is used as an etch mask to create an opening 250 in which buried digit lines will be fabricated. The nitride layers 220 and principal spacers 235 protect the transistor polysilicon layer 210 from the RIE oxide etch employed to form opening 250. The protection afforded by the nitride layers 220 and principal spacers 235 effect self-alignment of the opening.

Figure 32:
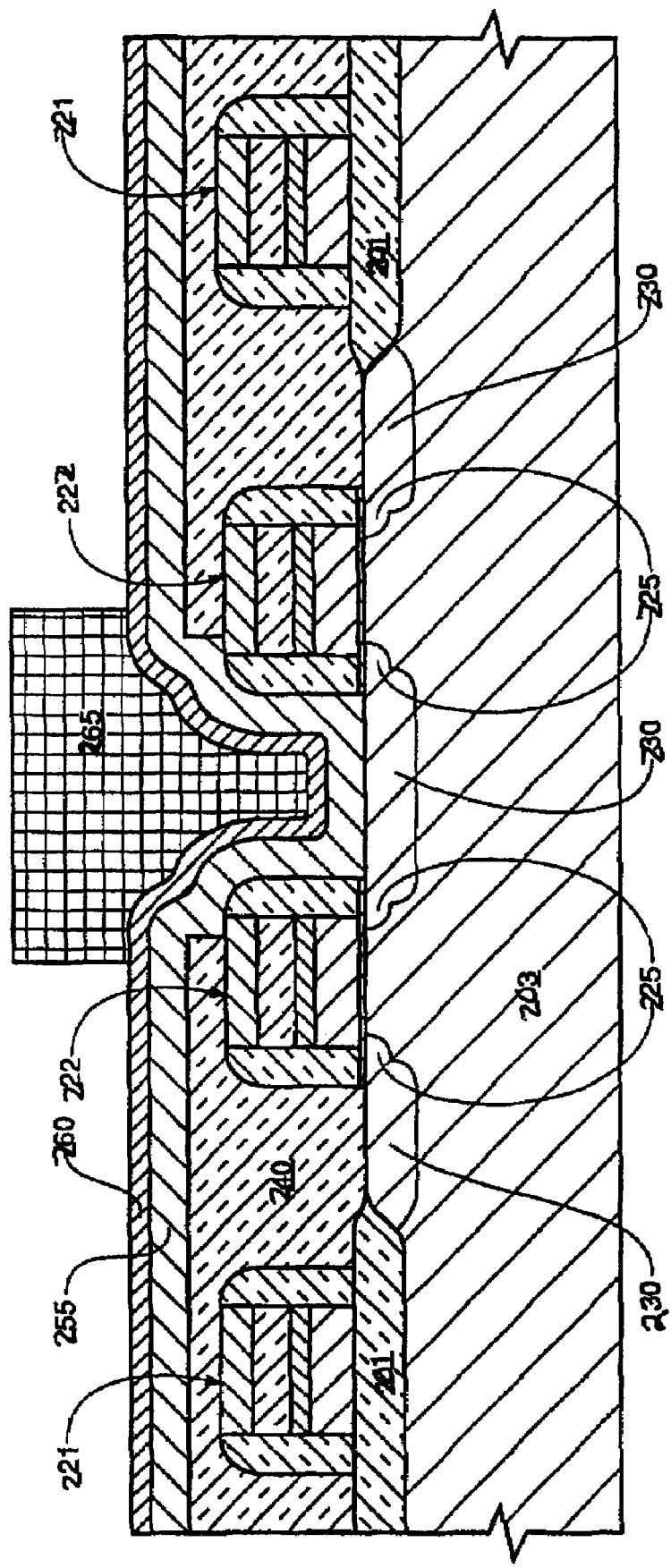
FIG. 32 is a cross-sectional view of the wafer portion of FIG. 31 following the masking of deposited layers of polysilicon and WSi.sub.x.

In FIG. 32 the photoresist shown in FIG. 31 has been removed, and the previously defined structures are overlaid with a blanket deposition of polysilicon 255 which in turn is overlaid with a blanket deposition of strapping material 260 comprising WSi$_x$ or TiN. The area defined as the digit line is masked with photoresist 265.

Figure 33:
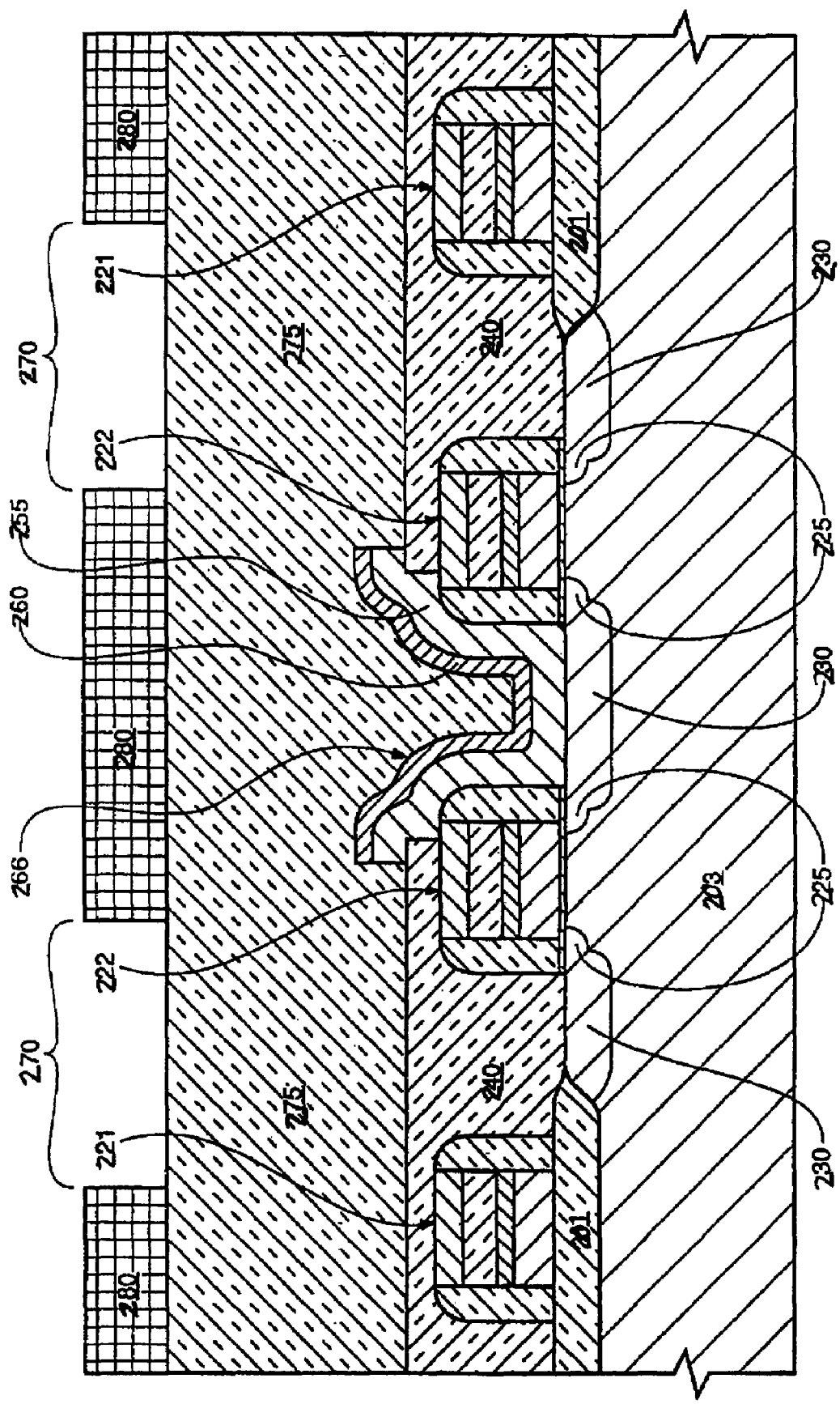
FIG. 33 is a cross-sectional view of the wafer portion of FIG. 32 following a reactive ion etch (RIE) of the deposited polysilicon and WSi.sub.x layer to form a buried digit line, the removal of the photoresist shown in FIG. 32, the deposit of a thick doped oxide layer, and masking thereof to define future contact areas for storage contact capacitors.

In FIG. 33 the unmasked polysilicon 255 and strapping material 260 are RIE etched to remove them from over the storage node areas 270 and from the top of the wordlines 221 polysilicon. The polysilicon 255 and strapping material 260 that are retained after the etch define the digit line 266. The strapping material 260 has a relatively low resistance when compared to the resistance of the polysilicon layer 255. The lower resistance of the strapping material 260 reduces the overall resistance of the digit line 266. Eventually the digit lines will be connected to periphery contacts. The periphery contacts are located at the end of the array and are capable of being in electrical communication with peripheral circuitry.

The photoresist 265 shown in FIG. 32 is removed. A thick doped layer of borophosphosilicate glass (BPSG) oxide 275 is blanket deposited to overlie the structures of FIG. 33. The thick oxide layer 275 is deposited to substantially define the desired height of a core portion of the storage capacitor. After planarization, either mechanical or chemical, the thick oxide 275 is masked with photoresist pattern 280 to define future openings in the previously fabricated structures for future storage capacitors. Planarizing the thick oxide 275 eliminates bit line stringers. The photoresist pattern 280 can also be used as a contact layer pattern for periphery contacts, thereby eliminating one mask, the buried contact mask. In this case openings would also be etched in the periphery of the DRAM device.

Figure 34:
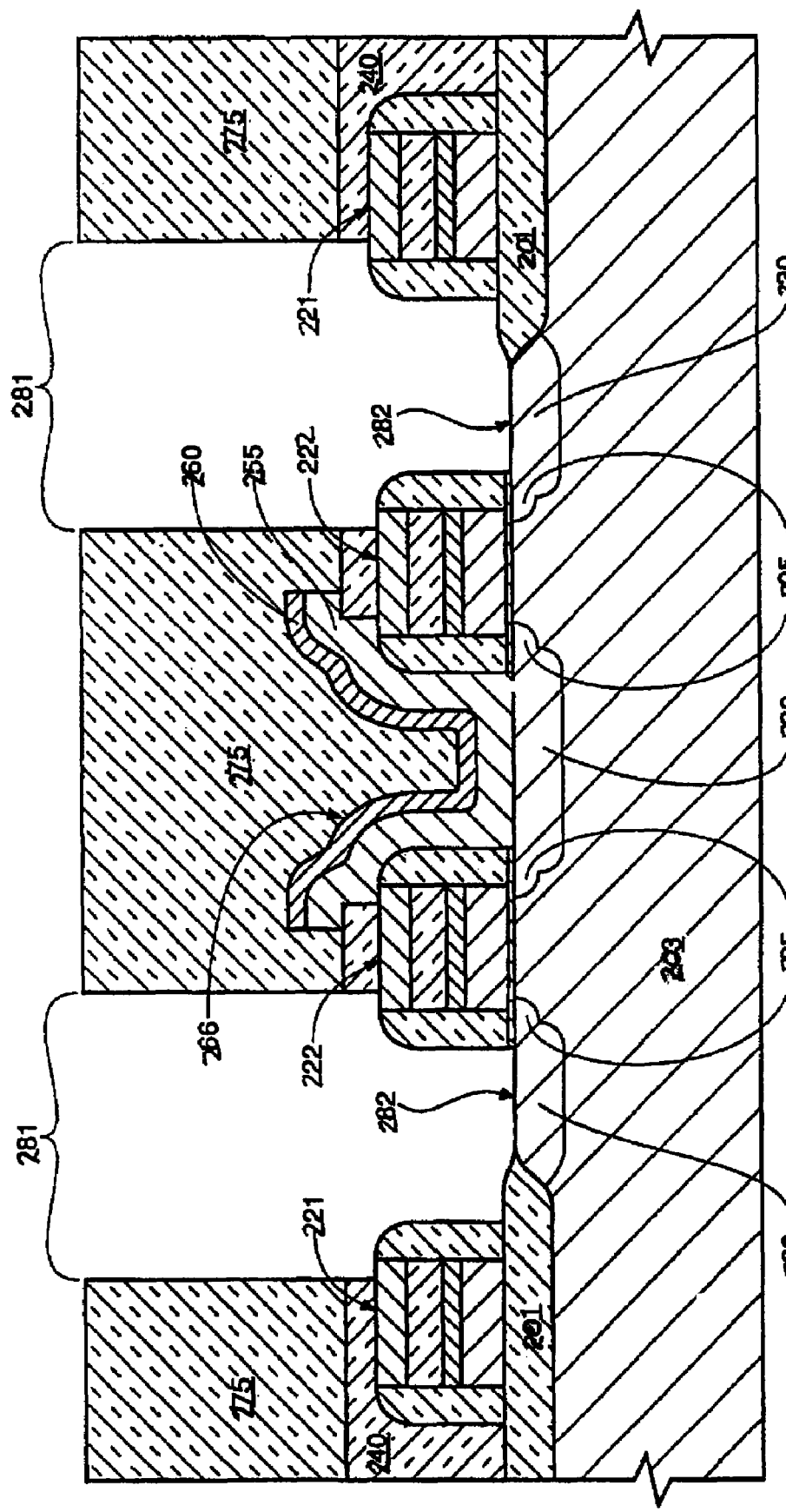
FIG. 34 is a cross-sectional view of the wafer portion of FIG. 33 following an RIE etch of the oxide layers to create openings for the lower capacitor plates as well as the contact openings for periphery contacts and following the removal of the photoresist.

In FIG. 34 the oxide layers 240 and 275 are RIE etched to form opening 281 and expose the contact areas 282 of the substrate. Following the etch, the photoresist 280 shown in FIG. 33 is removed.

Figure 35:
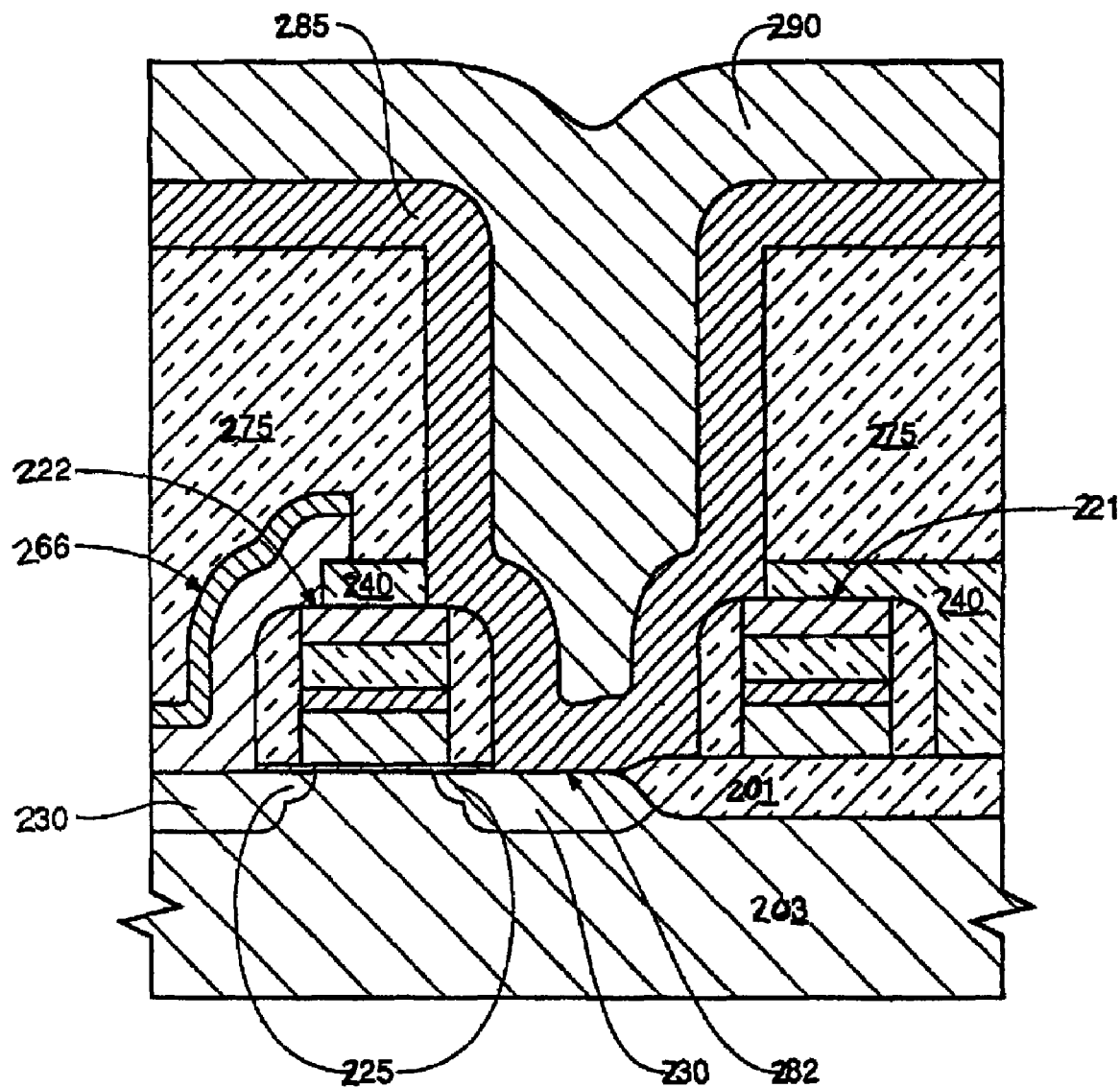
FIG. 35 is portion of the cross-sectional view of the wafer portion of FIG. 34 following the deposition of a 1KA thick TiN layer and a tungsten fill of the opening.

FIG. 35 is a portion of the wafer portion shown in FIG. 34. In FIG. 35 a TiN deposition 285 has been followed by tungsten fill deposition 290. The TiN deposition typically has a thickness equal to 1 KA. A cavity having a similar thickness is capable of accepting dielectric and cell polysilicon depositions.

TiN is a diffusion barrier metal providing a diffusion barrier between the N+ junction and the tungsten. The TiN also provides a low contact resistance without damaging the contact area of the substrate. TiN 285 is deposited first since it can be uniformally and evenly distributed to contact the previously fabricated areas and it provides a good contact medium for the subsequent tungsten fill 290. The TiN 285 also provides electrical communication between the substrate contact areas 282 and the tungsten 290. It is conceivable that TiN may be replaced with other diffusion barrier materials having similar properties.

Tungsten is a highly conductive refractory metal that can withstand high temperatures in the range of 600° C. to 900° C. This is necessary due to a subsequently deposited polysilicon layer. The polysilicon deposition is typically in the vicinity of 650° C. The tungsten can be replaced with other refractory metals comprising WSi$_x$, titanium, and titanium silicide. It is conceivable that as technology advances processing steps subsequent to the tungsten deposition may be performed at higher or lower temperatures. The temperature parameters qualify the refractory metal and are indicative of the current process. Since the temperature parameters may change as the fabrication process evolves, the refractory metals applicable to the process may change accordingly.

Figure 36:
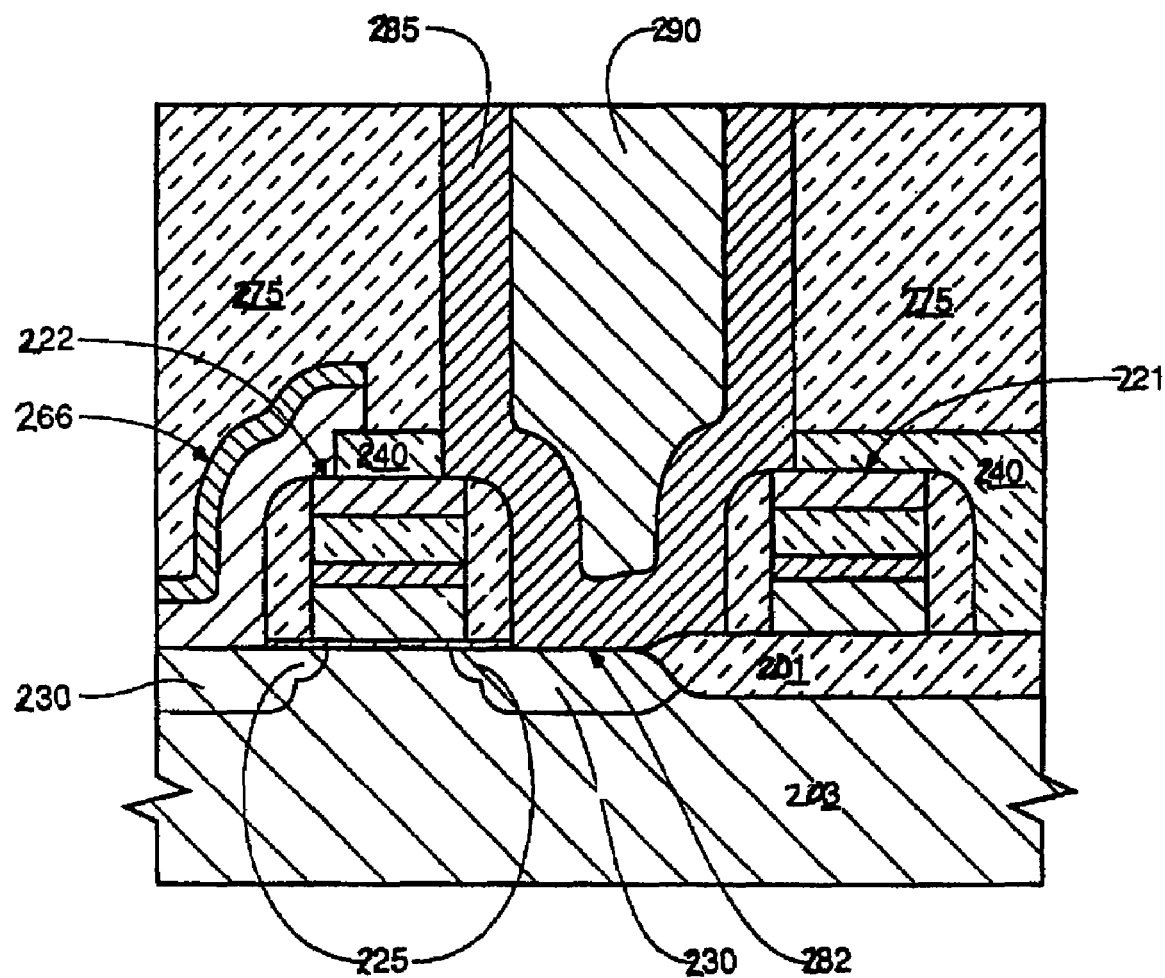
FIG. 36 is a cross-sectional view of the wafer portion of FIG. 35 following a planarization of the TiN and tungsten to form a plug.

The tungsten 290 and TiN 285 are shown in FIG. 36 after a mechanical etch to effect planarization of the tungsten 290, TiN 285 and thick oxide 275.

Figure 37:
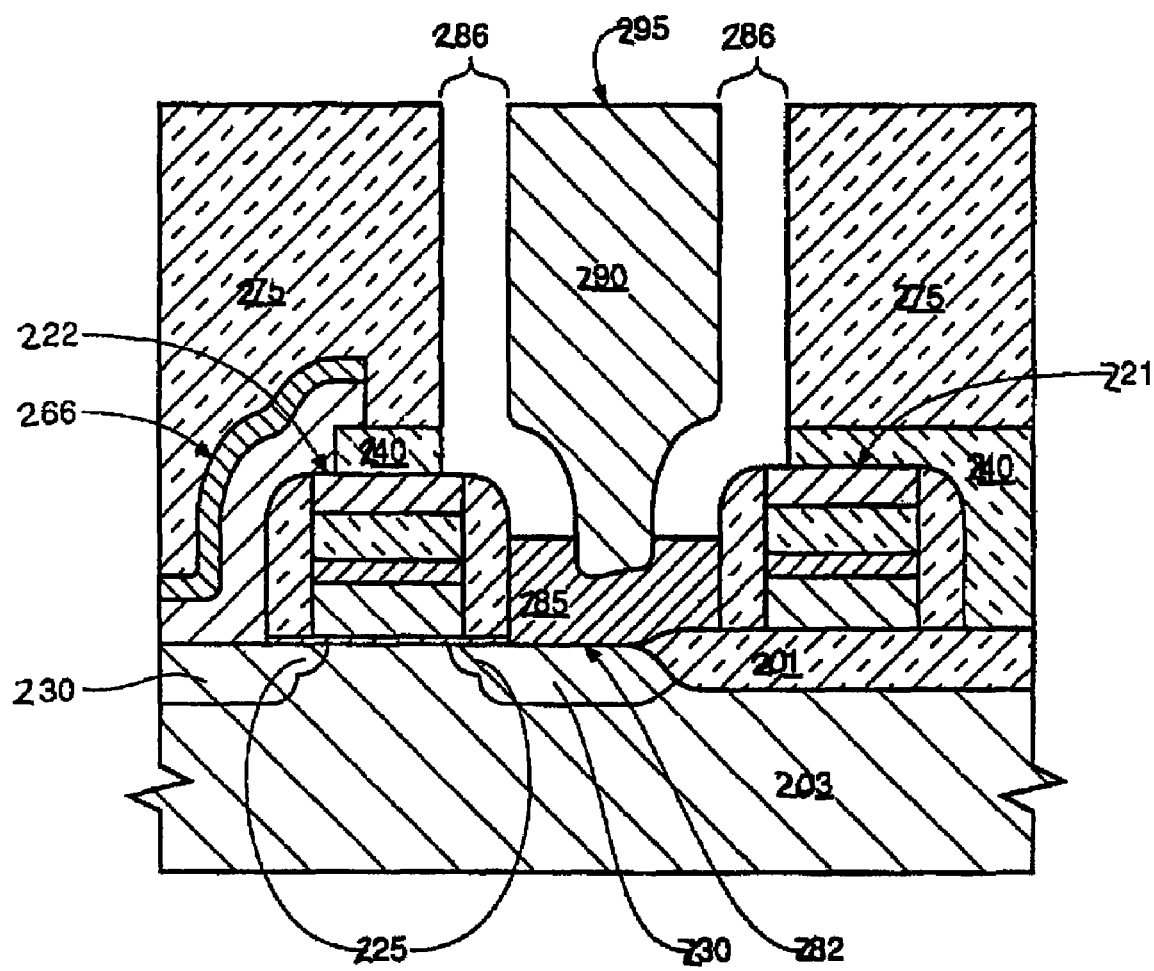
FIG. 37 is a cross-sectional view of the wafer portion of FIG. 36 following a controllable and selective TiN etch.

TiN can be selectively etched over tungsten. In FIG. 37 the TiN 285 is controllably etched by a piranha (either wet or vapor) etch method to form trenches 286 while retaining a portion of TiN 285 to contact the contact area 282 of the substrate 203. Any periphery contacts already fabricated must be protected by a mask during the piranha etch. The trenches 286 are each approximately 1 KA wide extending approximately 2 microns from the top of the tungsten. The retained portion of TiN 285 envelops a lower portion of the tungsten 290. The TiN 285 and tungsten 290 thus formed comprise the lower capacitor plate 295. The trenches 286 increase the size of the storage node plate thus increasing capacitance.

Figure 38:
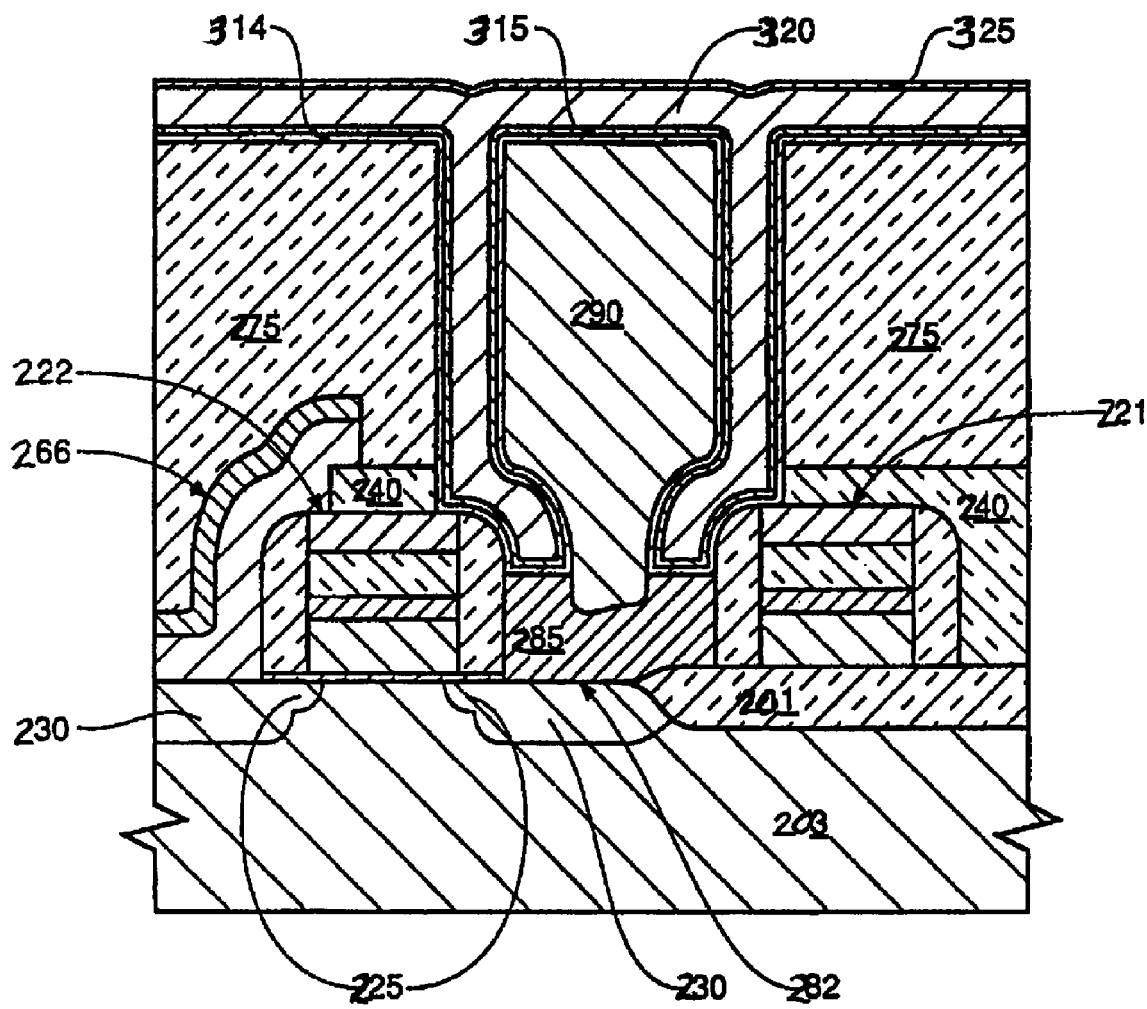
FIG. 38 is a cross-sectional view of the wafer portion of FIG. 37 following blanket depositions of a thin silicide layer and a dielectric layer and following a deposition of a cell polysilicon. A nitride layer is deposited to overlie the cell polysilicon.

In FIG. 38 a thin polysilicon layer 314 is blanket deposited to overlie exposed portions of the oxide 275, the TiN 285, and tungsten 290. The polysilicon layer 314 typically has a thickness of 50 Å (angstroms) and provides a silicon surface on which to blanket deposit a thin dielectric layer 415 typically having a thickness of 100 Å (angstroms). The dielectric layer typically comprises of silicon nitride, although other dielectric materials such as silicon dioxide are equally viable. An optional wet anneal may be performed subsequent to the silicon nitride deposition to oxidize the silicon in pinholes of the nitride. The wet anneal improves dielectric breakdown properties of the capacitor thus formed. The dielectric is typically silicon nitride. A thick cell polysilicon layer 320 is deposited to overlie the dielectric layer and completely fills in the trenches 286 previously formed. The thick cell polysilicon layer 320 is subjected to an insitu phosphorous diffusion doping to decrease its resistivity. The cell plate comprises the cell polysilicon layer 320. In order to protect the thick cell polysilicon layer 320 during subsequent oxidization steps of the fabrication process a thin layer of oxidation resistant silicon nitride 325 is blanket deposited to overlie the thick cell poly layer 320.

Figure 39:
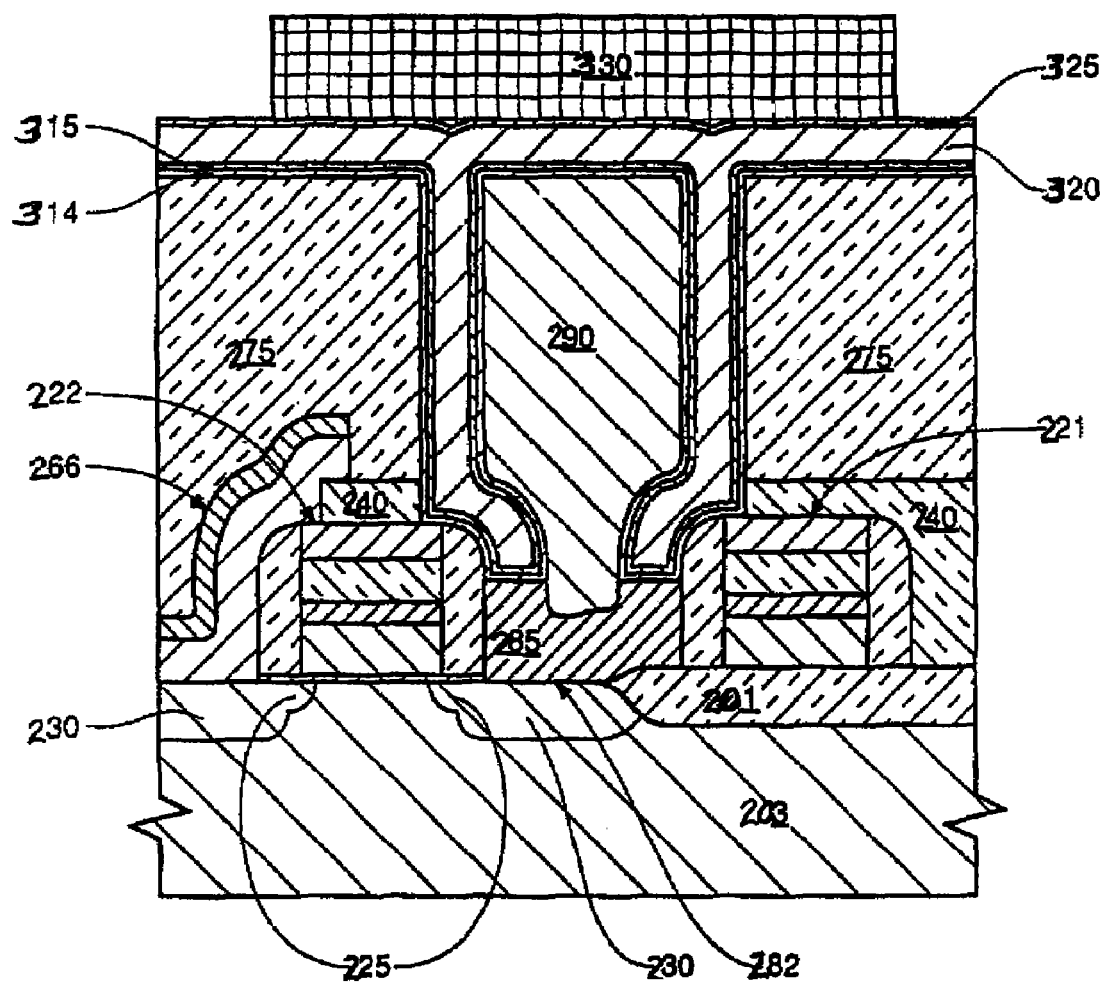
FIG. 39 is a cross-sectional view of the wafer portion of FIG. 38 following patterning of the storage capacitor with photoresist.

The cell polysilicon layer is patterned only within the storage capacitor with photoresist mask 330 as shown in FIG. 39.

Figure 40:
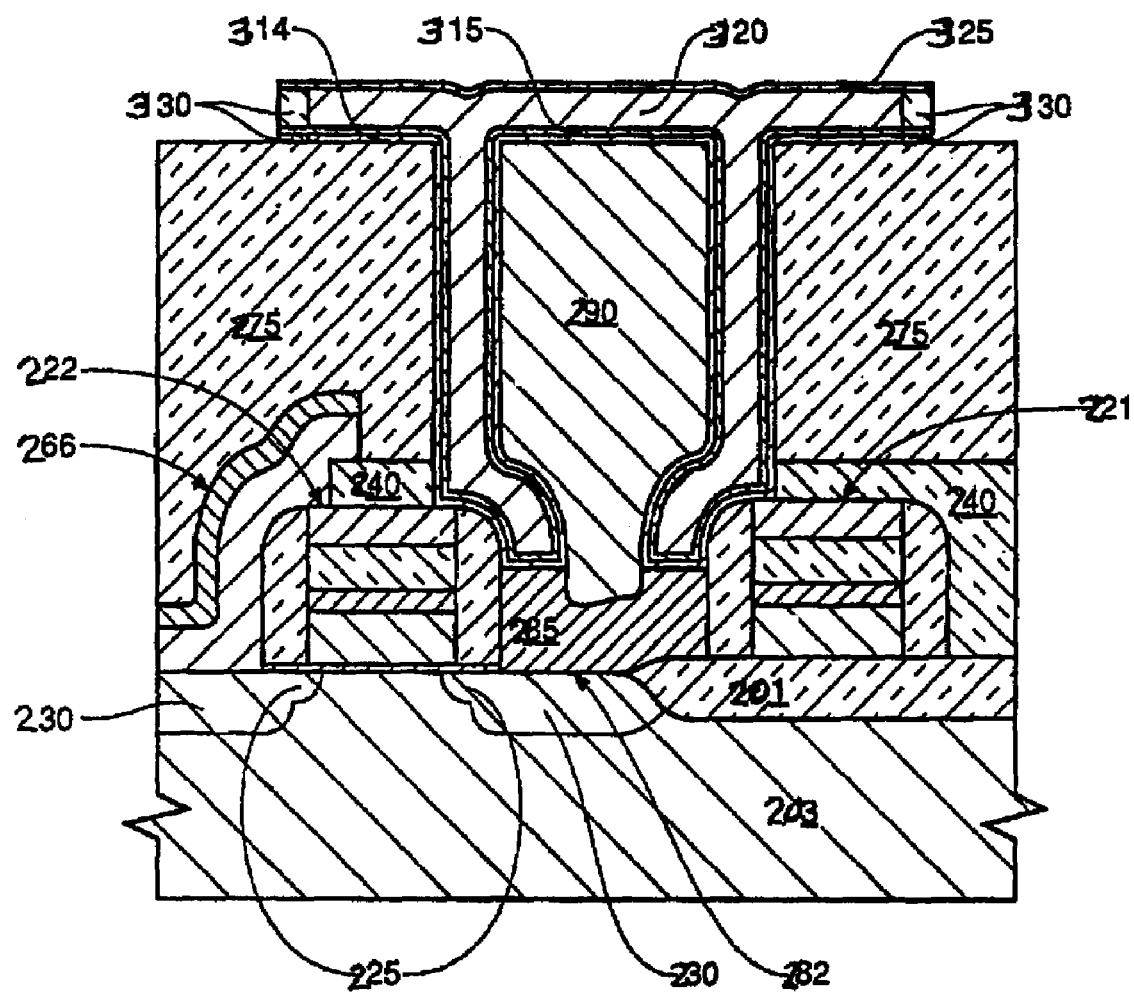
FIG. 40 is a cross-sectional view of the wafer portion of FIG. 39 following an RIE etch of the nitride layer, the cell polysilicon, the dielectric layer and the silicide layer, and following the removal of the photoresist.

In FIG. 40 polysilicon layer 314, cell polysilicon layer 320, and dielectric layer 315 and nitride layer 325 are RIE etched in the unmasked areas, and the photoresist 330 as shown in FIG. 39 is removed. Oxide 330 is grown to insulatively seal the sides of the polysilicon layers 314 and 320.

Figure 41:
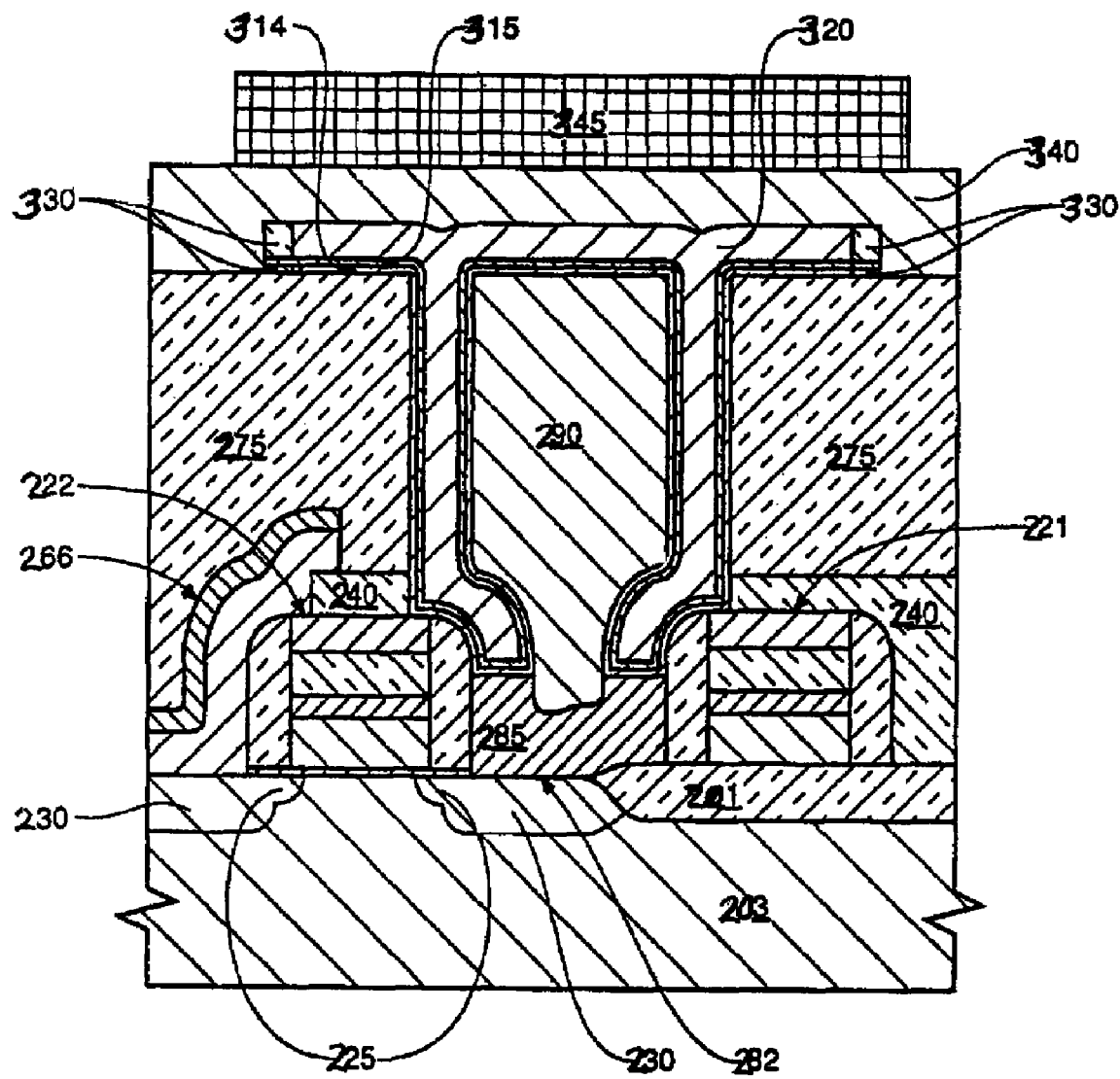
FIG. 41 is a cross-sectional view of the wafer portion of FIG. 40 following the deposition of a conductive layer and following the noncritical patterning of the cell array.

In FIG. 41 the nitride layer 325 shown in FIG. 40 is RIE etched and a layer of conductive material 340 is deposited to create a cell poly interconnect and eliminate a cell poly mask. Conductive material 340 functions as a cell polysilicon interconnect and eliminates a cell polysilicon mask. The conductive material 340 preferably comprises a metal such as aluminum, tungsten, Al/Si/Cu, or another aluminum/copper alloy. This layer of conductive material 340 is typically used throughout the circuit periphery. In order to retain the conductive material overlying and in contact with portions of cell polysilicon layer 320 the conductive material 340 is masked by photoresist 345 in a noncritical alignment pattern over the cell array in order to connect all the cell polysilicon over the storage node. Since the cell polysilicon is aligned with the storage node poly pattern, a cell polysilicon masking step is eliminated.

Figure 42:
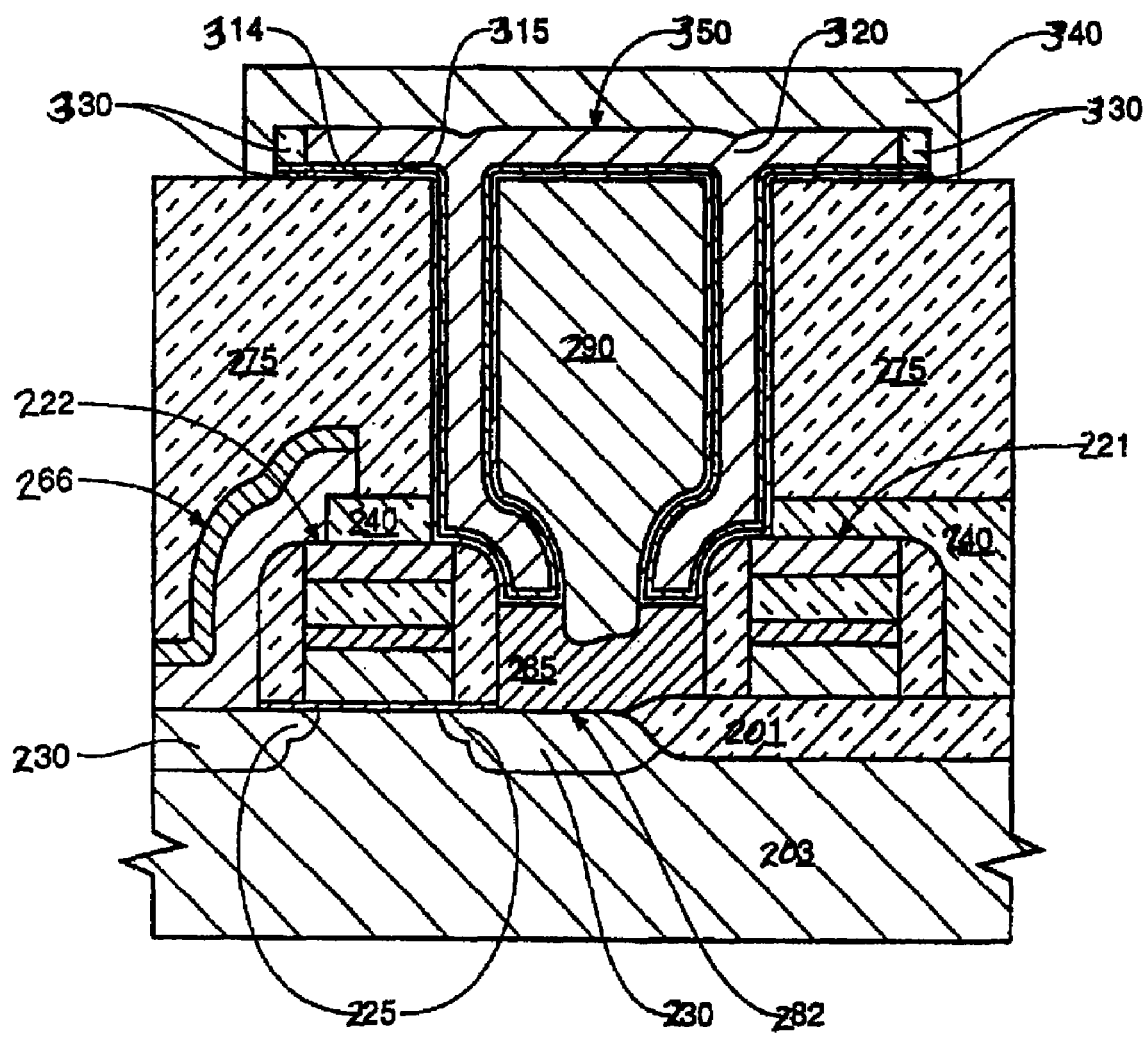
FIG. 42 is a cross-sectional view of the wafer portion of FIG. 41 following an RIE metal etch of the conductive layer and following the removal of the photoresist pattern.

In FIG. 42 the unmasked conductive material 340 has been RIE metal etched, the photoresist 345 shown in FIG. 41 has been removed and the fabrication of storage capacitors 350 is complete. The lower capacitor plate 395 of storage capacitors 350 comprise the tungsten 290 and titanium nitride 285 portions. The cell plate comprises the thick cell polysilicon layer 320. The conductive material 340 provides electrical communication between the cell plates of the capacitors 350 fabricated by the method of the first embodiment. The cell plate and storage node capacitor plate are electrically insulated from each other by the dielectric layer 345.

Figure 43:
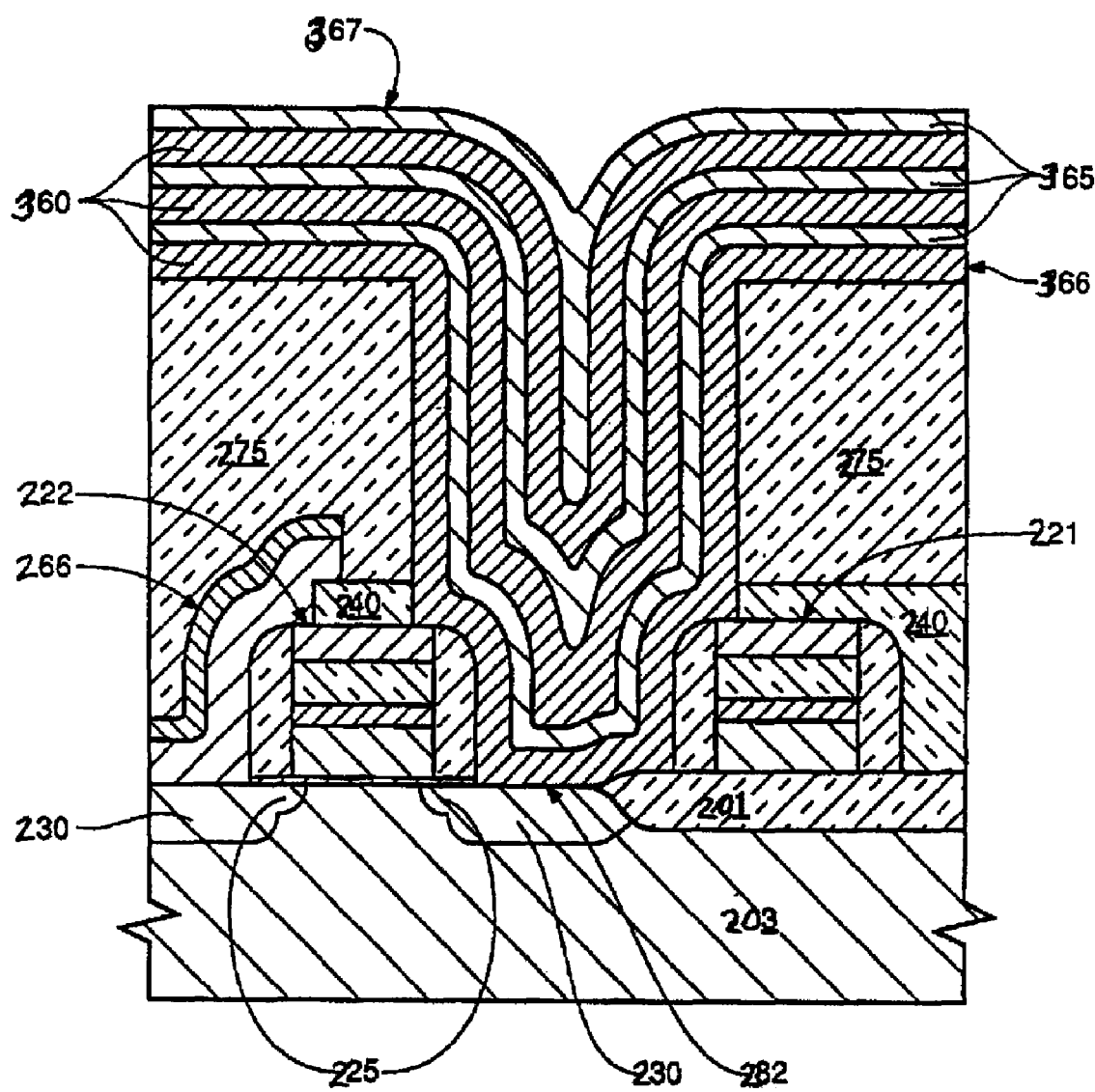
FIG. 43 is a cross-sectional view of a portion of the wafer portion of FIG. 34 following alternating depositions of TiN and Tungsten.

The process steps of the second embodiment of the invention are identical to the process steps of the first embodiment for the steps described relative to FIGS. 29-34. In the second embodiment of the invention, the openings 282 formed in FIG. 34 are deposited with alternating layers of TiN 360 and tungsten 365 as shown in FIG. 43 which is a portion of the wafer portion shown in FIG. 34. The initial deposit 366 being TiN and the final deposit 367 being tungsten. Although the total number of layers is optional at least two tungsten layers and two TiN layers are employed.

Figure 44:
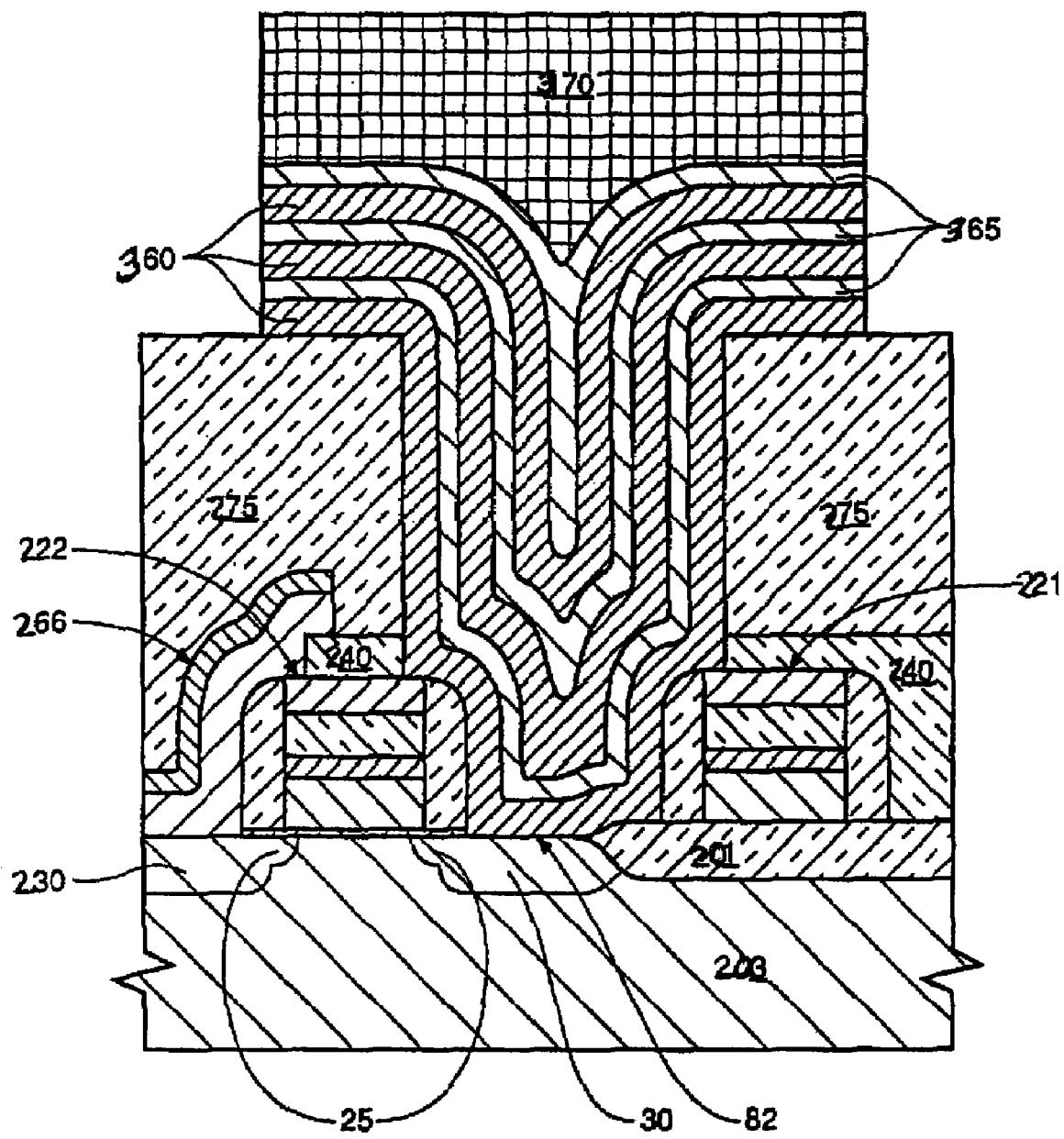
FIG. 44 is a cross-sectional view of the wafer portion of FIG. 43 following the masking and RIE etch of the alternating depositions.

In FIG. 44 the storage node is defined by masking the alternating layers with a photoresist pattern 370. The alternating layers are then RIE etched.

Figure 45:
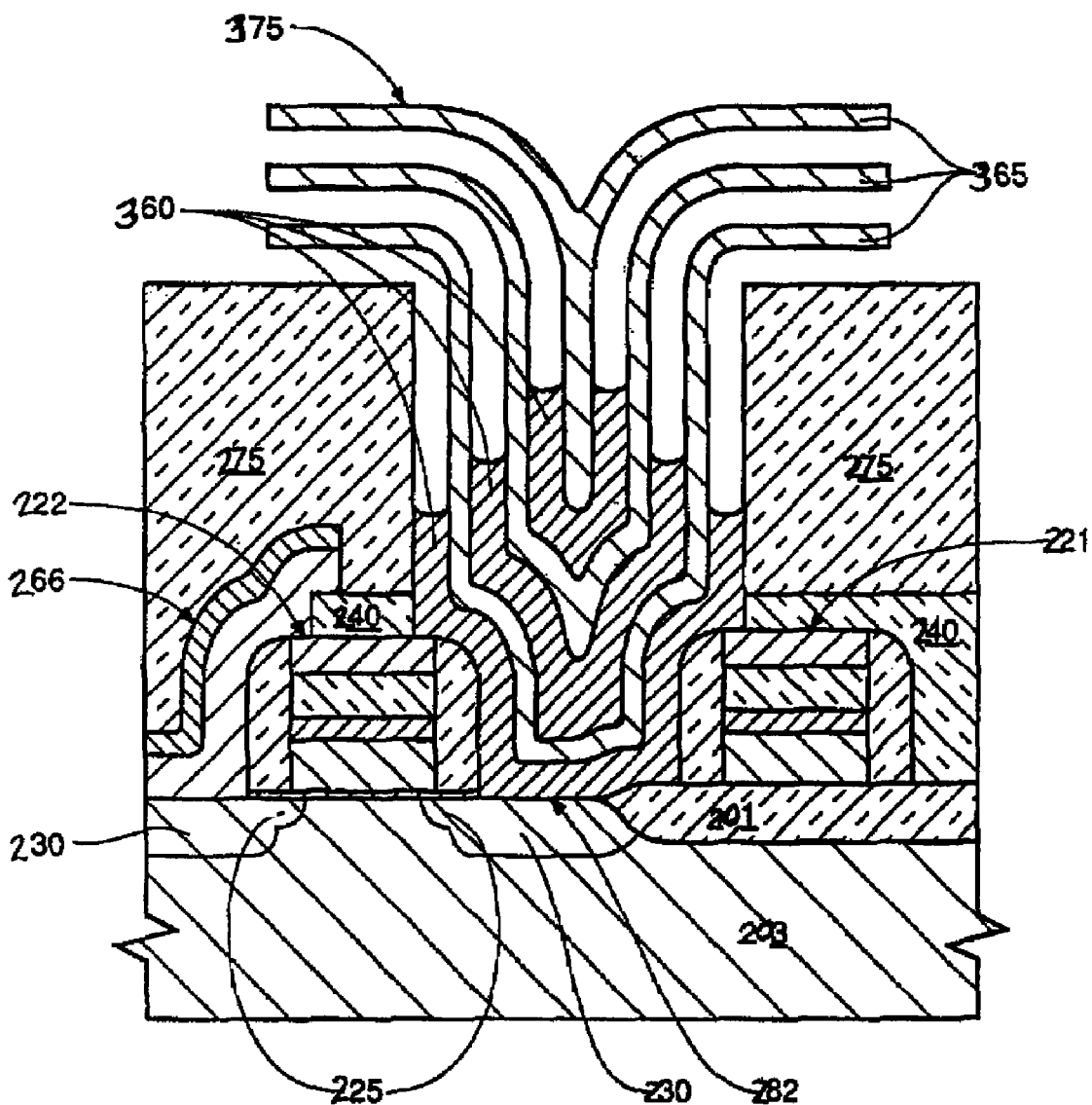
FIG. 45 is a cross-sectional view of the wafer portion of FIG. 44 following a selective and controllable etch of the TiN layers and removal of the photoresist.

In FIG. 45 the photoresist pattern 370 shown in FIG. 44 is removed and the fabrication of the storage node is completed by selectively and controllably etching the TiN by a piranha (either wet or vapor) etch method to form tungsten fingers 375 extending substantially normally from the TiN 360 retained after the etch. Any periphery contacts already fabricated must be protected by a mask during the piranha etch. A piranha etch is an etch wherein the etch solution comprises a solution of hydrogen peroxide plus sulfuric acid. The fingers diverge and are elevationally stacked in a parallel configuration over the oxide 275. The total height of the stacked portion of the storage node is dependent on the number of layers deposited and the thickness of the layers.

Figure 46:
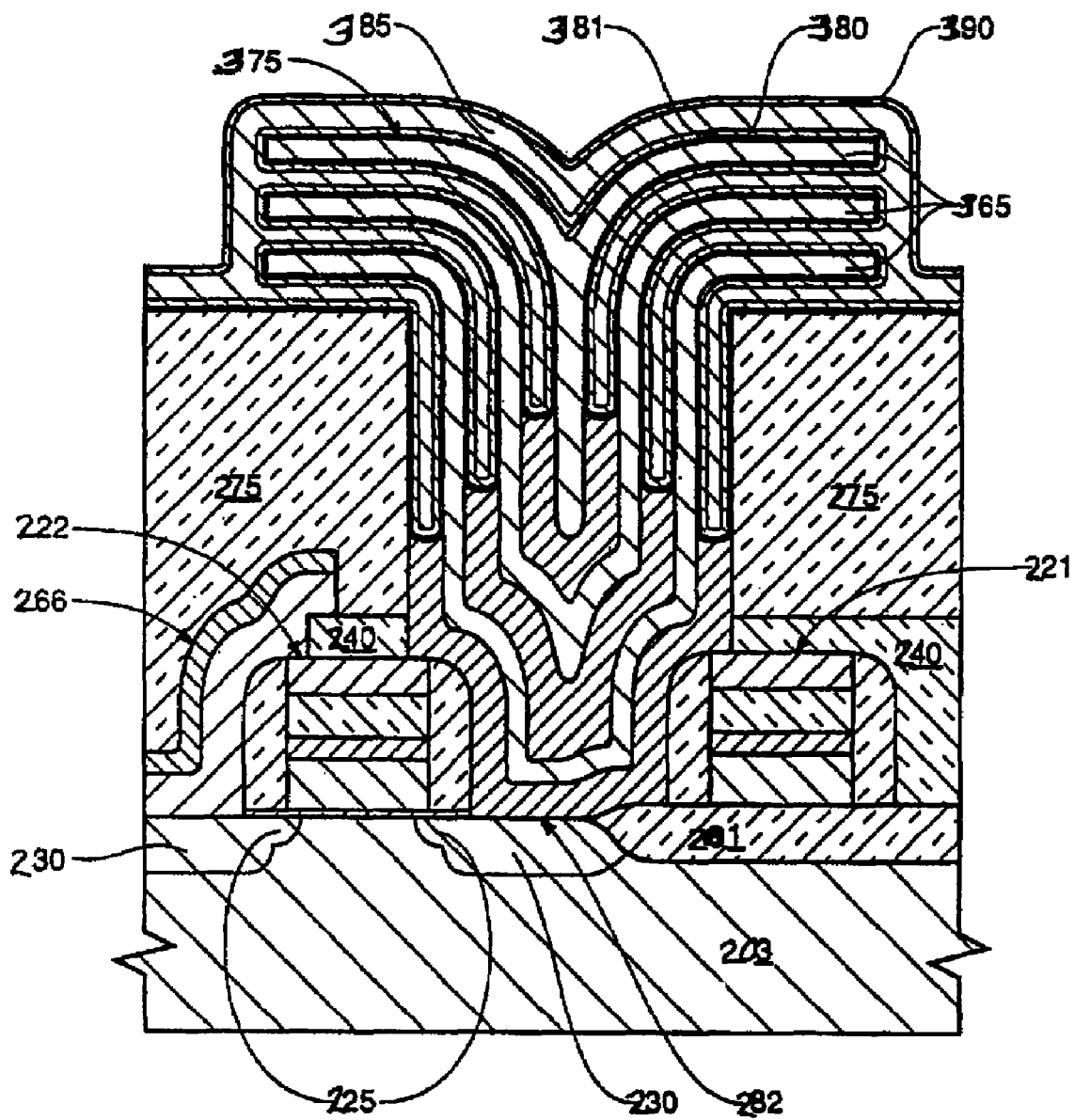
FIG. 46 is a cross-sectional view of the wafer portion of FIG. 45 following blanket depositions of a thin silicide layer and a dielectric and following a deposition of cell polysilicon. A nitride layer is deposited to overlie the cell polysilicon.

In FIG. 46 a thin polysilicon layer 380 typically having a thickness of 50 Å (angstroms) is deposited to overlie all exposed surfaces. The polysilicon layer 380 provides a silicon surface for a subsequent dielectric deposition. A thin dielectric layer 381 comprising silicon nitride is deposited to overlie the polysilicon 380. The dielectric layer 381 typically has a thickness of 100 Å (angstroms). An optional wet anneal may be performed subsequent to the deposition of the dielectric layer 381 to oxidize the silicon in pinholes of the nitride. A cell polysilicon layer 385 is deposited to overlie the dielectric layer. The cell polysilicon 385 layer is subjected to an insitu phosphorous diffusion doping to decrease its resistivity. In order to protect the thick cell polysilicon layer 385 during subsequent oxidization steps of the fabrication process a thin layer of oxidation resistant silicon nitride 390 is blanket deposited to overlie the thick cell polysilicon layer 385.

Figure 47:
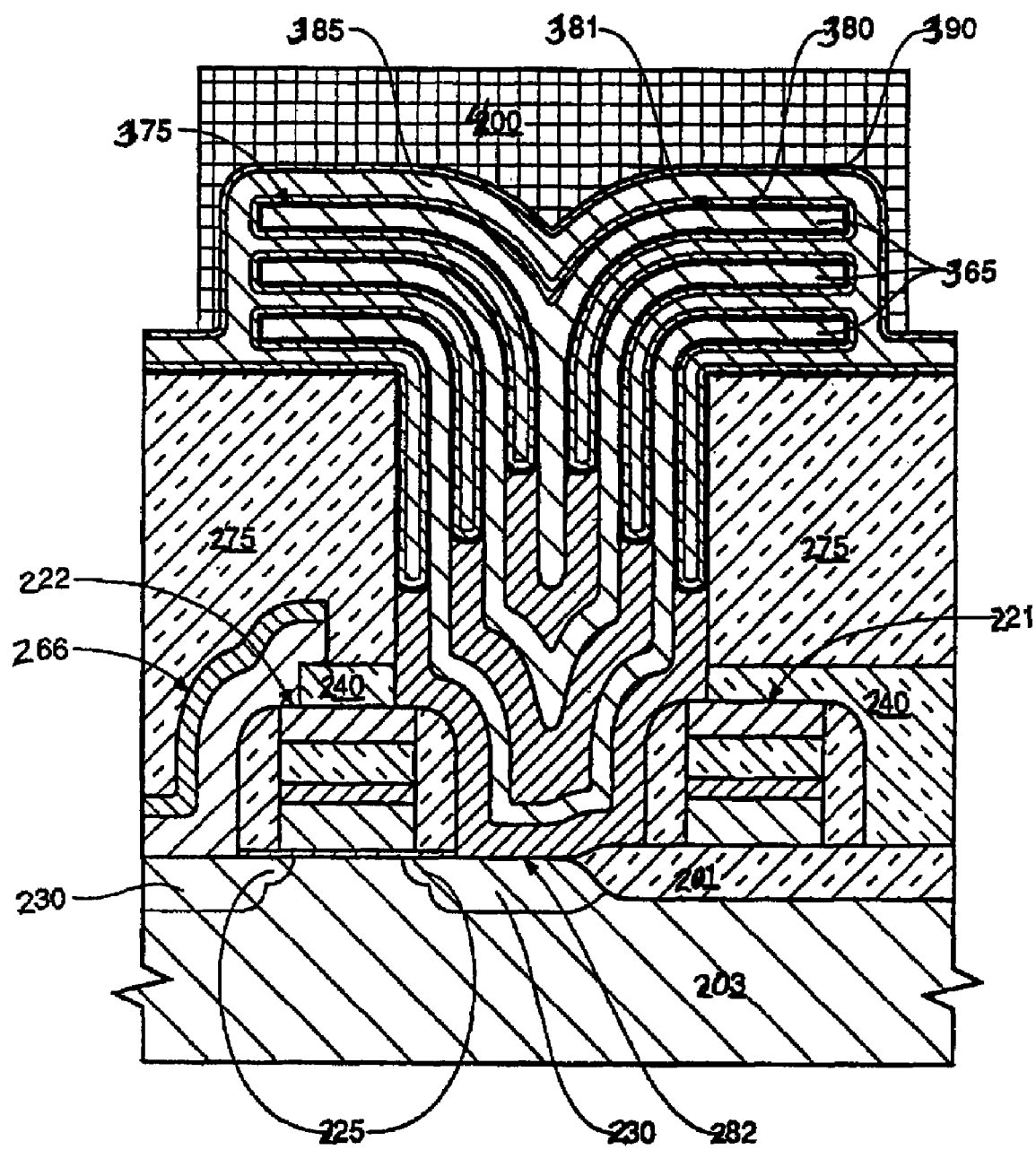
FIG. 47 is a cross-sectional view of the wafer portion of FIG. 46 following patterning of the storage capacitor with photoresist.

The cell polysilicon layer is patterned only within the storage capacitor with photoresist mask 400 as shown in FIG. 47.

Figure 48:
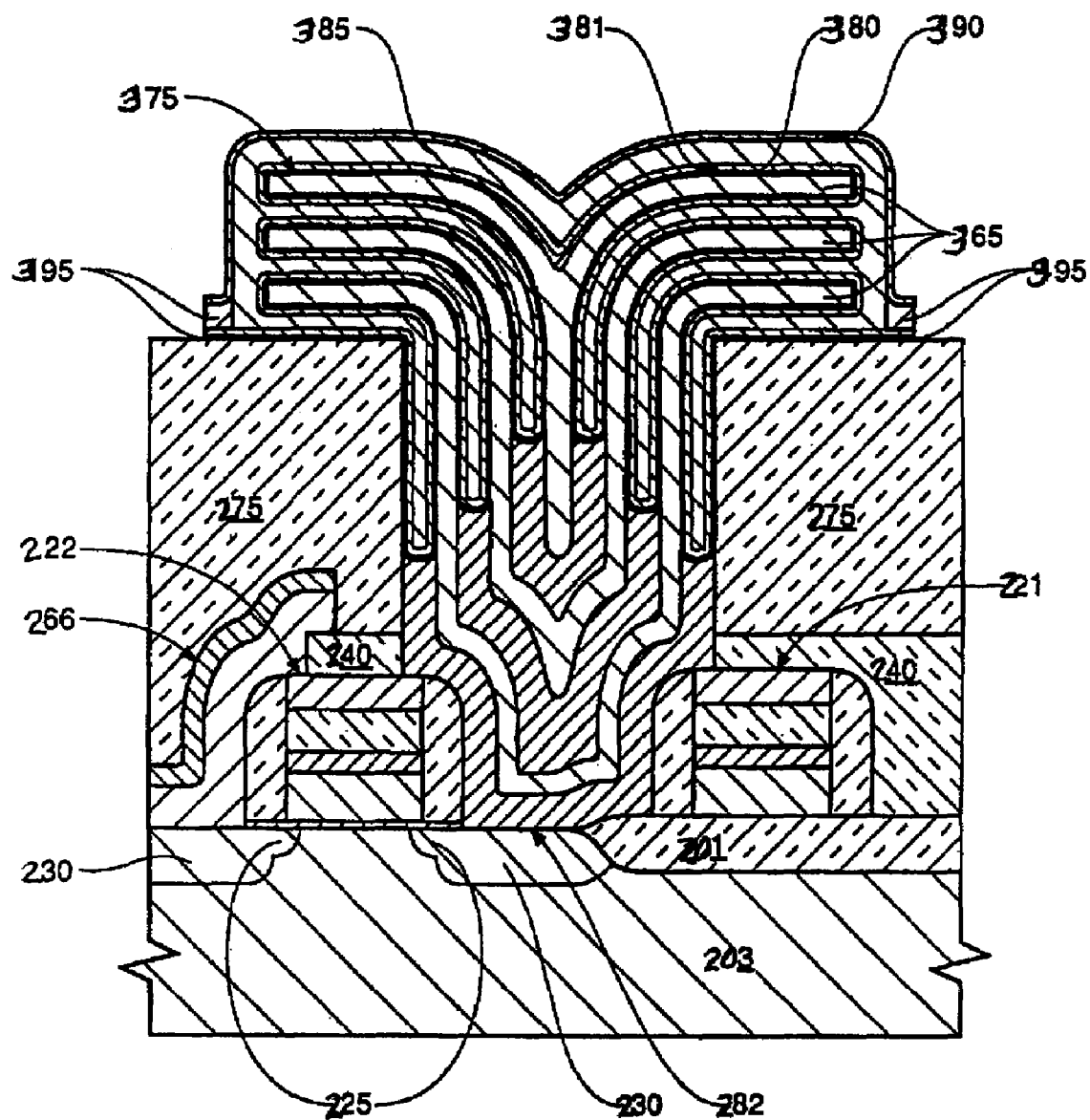
FIG. 48 is a cross-sectional view of the wafer portion of FIG. 47 following an RIE etch of the nitride layer, the cell polysilicon, the dielectric layer and the silicide layer, and following the removal of the photoresist.

In FIG. 48 polysilicon layer 380, cell polysilicon layer 385, dielectric layer 381, and nitride layer 390 are RIE etched in the unmasked areas, and the photoresist 400 as shown in FIG. 47 is removed. Oxide 395 is grown to insulatively seal the sides of the polysilicon layers 380 and 385.

Figure 49:
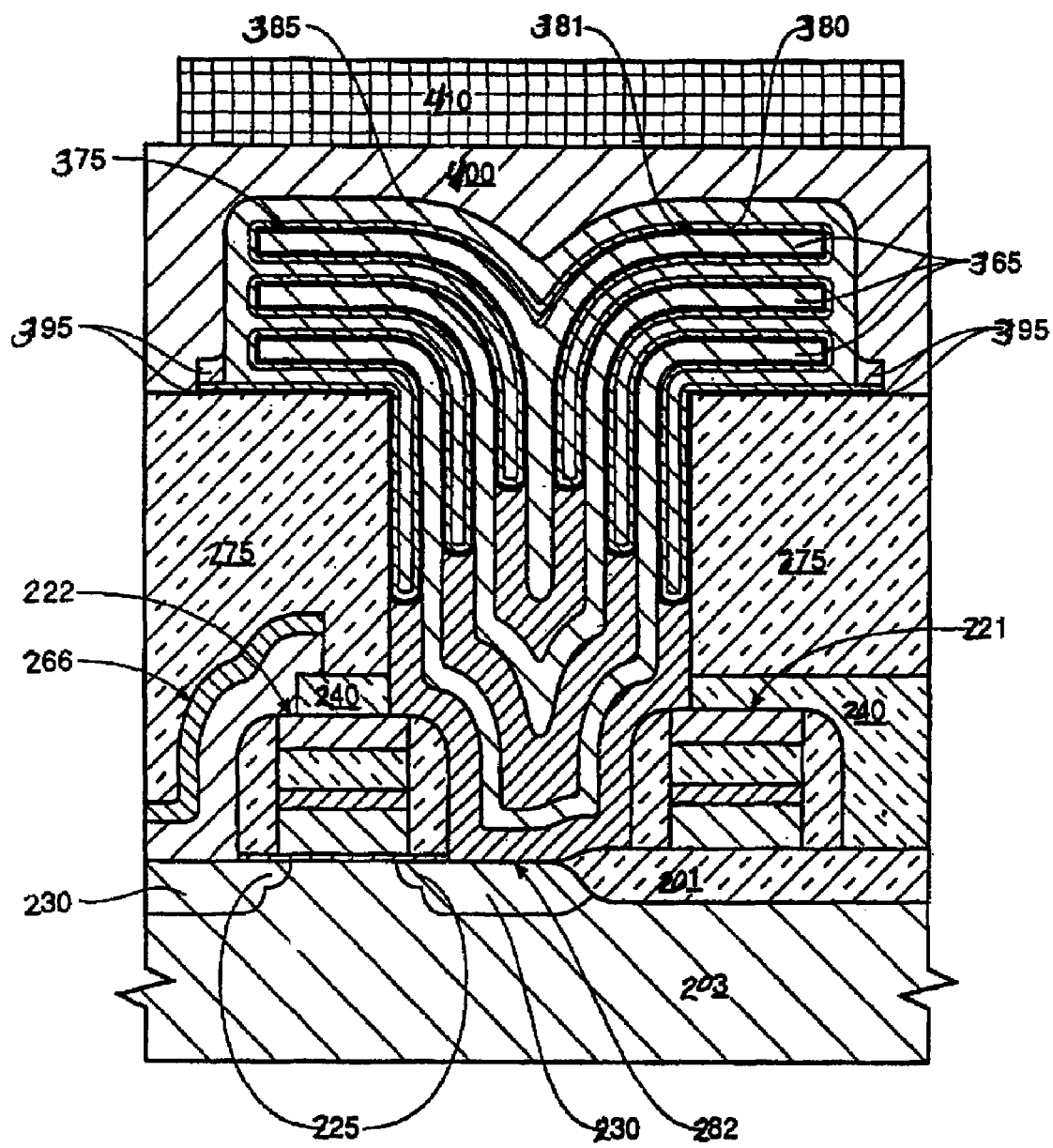
FIG. 49 is a cross-sectional view of the wafer portion of FIG. 48 following the deposition of a conductive layer and following the noncritical patterning of the cell array.

In FIG. 49 the nitride layer 390 shown in FIG. 48 is RIE etched and a layer of conductive material 400 is deposited to create a cell poly interconnect and eliminate a cell poly mask. Conductive material 400 functions as a cell polysilicon interconnect and eliminates a cell polysilicon mask. The conductive material 400 preferably comprises a metal such as aluminum, tungsten, Al/Si/Cu, or another aluminum/copper alloy. This layer of conductive material 400 is typically used throughout the circuit periphery. In order to retain the conductive material overlying and in contact with portions of cell polysilicon layer 385 the conductive material 400 is masked by photoresist 410 in a noncritical alignment pattern over the cell array in order to connect all the cell polysilicon over the storage node. Since the cell polysilicon is aligned with the storage node poly pattern, a cell polysilicon masking step is eliminated.

Figure 50:
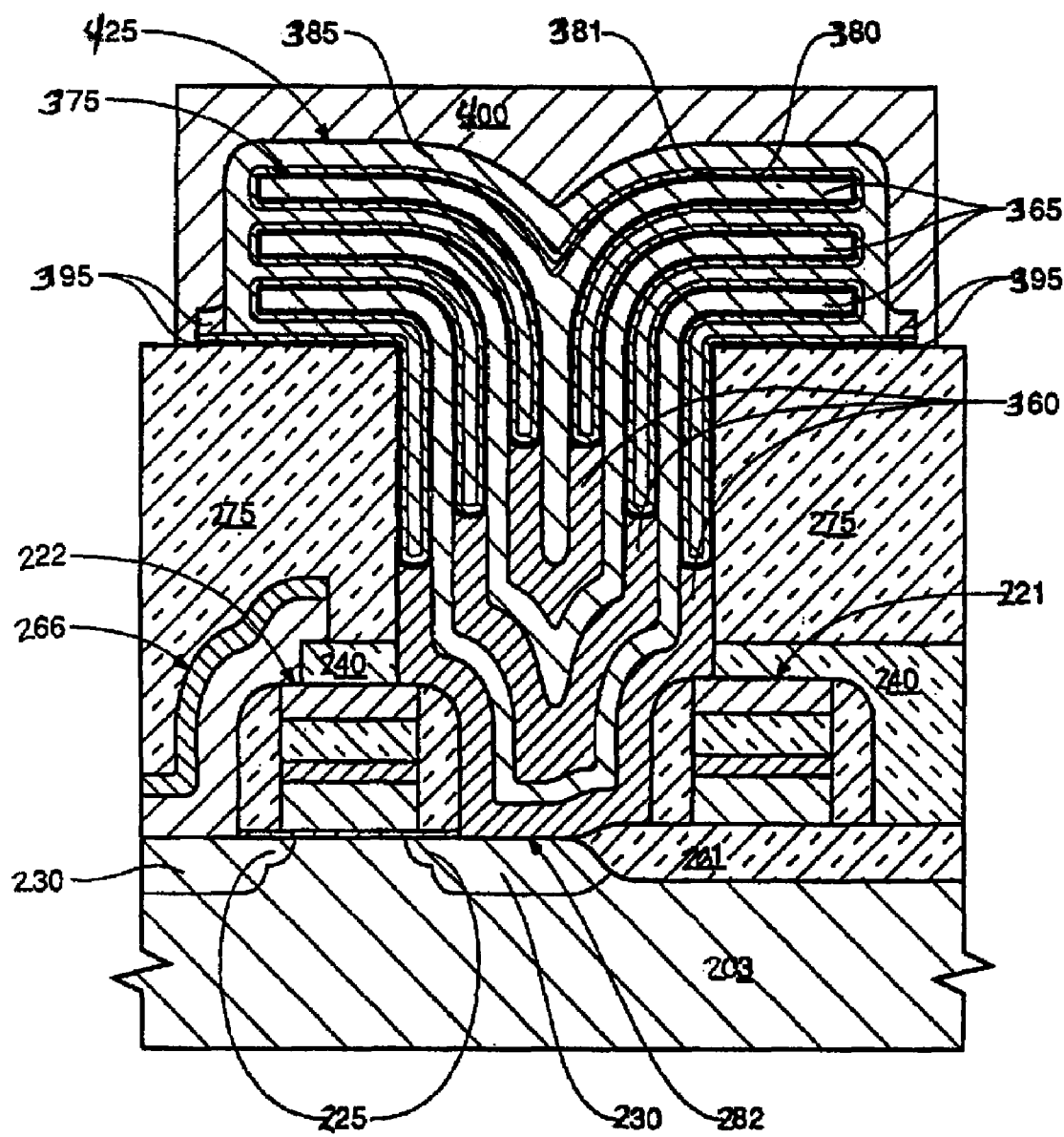
FIG. 50 is a cross-sectional view of the wafer portion of FIG. 49 following an RIE metal etch of the conductive layer and following the removal of the photoresist pattern.

In FIG. 50 the unmasked conductive material 400 has been RIE metal etched, the photoresist 410 shown in FIG. 49 has been removed and the fabrication of storage capacitors 425 is complete. The lower capacitor plate 375 of storage capacitors 425 comprise the tungsten 365 and titanium nitride 360 portions. The cell plate comprises the thick cell polysilicon layer 385. The conductive material 400 provides electrical communication between the cell plates of the capacitors 325 fabricated by the method of the first embodiment. The cell plate and storage node capacitor plate are electrically insulated from each other by the dielectric layer 381. At this juncture the cell polysilicon may be masked and etched and a conductive material may be deposited as in the first embodiment to create the cell polysilicon interconnect.

These embodiments of the invention allows the vertical portion of a DRAM device to be utilized as the storage cell thus maximizing die space in the horizontal direction, and reducing the stack capacitor height prior to contacts. Controllably etching the TiN increases capacitor area and capacitance. A mask step is eliminated over previous methods since there is no cell polysilicon mask. Thus the increase in capacitance is effected using minimal masking steps and minimal surface area of the DRAM device.

The process also facilitates the effective use of a buried digit line configuration. There are no digit line stringers, thus yield is increased.

Although as described the first embodiment is applicable to 4-megabit through 64-megabit, and the second embodiment is typically employed in DRAMs containing up to 256 megabit DRAM cells, the process is not limited to these uses.

Although polycrystalline silicon is used in the capacitor fabrication of the preferred embodiments, amorphous and monocrystalline silicon may also be used.

Embodiments of the invention are adapted to increase density of a memory device by increasing capacitance of storage cell capacitors. The storage cell capacitor features a storage node electrode having a barrier layer of tantalum or another material which experiences no oxidation during the formation of the storage cell capacitor. The barrier layer is interposed between a conductive plug and a non-oxidizing conductive material such as platinum. A dielectric layer, typically $Ba_xSr_{(1-x)}TiO_3$ [BST], is deposited on the non-oxidizing material. The barrier layer is surrounded on its sides by an insulative layer. The insulative layer protects the barrier layer from oxidizing during the deposition and anneal of the BST thereby also eliminating oxidization of the conductive plug. By eliminating oxidization of the barrier layer and the conductive plug capacitance is maximized.

Although a process has been described for forming the storage cell capacitor, it is apparent the process is equally applicable for the fabrication of other types of capacitors used in integrated circuits. It should also be apparent to one skilled in the art that changes and modifications, such as deposition depths, may be made thereto without departing from the spirit and scope of the invention as claimed.

What is claimed is:

1. An integrated circuit structure, comprising:
a buried digit line; and
an electrode operatively connected to the buried digit line, the electrode including:
a first portion formed in an insulative layer having an upper surface;
a second portion overlying the first portion, wherein said insulative layer surrounds a sidewall of said second portion and said second portion does not extend above the upper surface; and
a third portion overlying said second portion and, extending above and below said upper surface of said insulative layer, and including a recess, wherein said first portion and said second portion are different materials, wherein said first portion is a silicon contact.

2. The integrated circuit structure of claim 1, wherein the second portion and the third portion are different materials.

3. The integrated circuit structure of claim 2, wherein the first portion and the third portion are different materials.

4. The integrated circuit structure of claim 1, wherein the buried digit line includes a patterned digit line conductive layer and a patterned strapping layer.

5. The integrated circuit structure of claim 4, wherein the strapping layer is adapted to reduce an overall resistance of the digit lines.

6. The integrated circuit structure of claim 1, wherein the buried digit line includes $WSi_x$.

7. The integrated circuit structure of claim 1, wherein the buried digit line includes TiN.

8. The integrated circuit structure of claim 1, wherein the buried digit line includes doped polysilicon.

9. The integrated circuit structure of claim 1, wherein the digit lines are formed prior to the electrode.

10. An integrated circuit structure, comprising:
a buried digit line including at least one from the group consisting essentially of $WSi_x$ and TiN; and
an electrode operatively connected to the buried digit line, the electrode including:
a first portion formed in an insulative layer having an upper surface, wherein said first portion is a silicon contact;
a second portion overlying the first portion, wherein said insulative layer surrounds a sidewall of said second portion and said second portion does not extend above the upper surface, wherein the second portion and the first portion are different materials; and
a third portion overlying said second portion and, extending above and below said upper surface of said insulative layer, and including a recess, and wherein the third portion and the second portion are different materials.

11. The integrated circuit structure of claim 10, wherein the buried digit line includes a patterned digit line conductive layer and a patterned strapping layer.

12. The integrated circuit structure of claim 11, wherein the strapping layer is adapted to reduce an overall resistance of the digit lines.

13. An integrated circuit structure, comprising:
a buried digit line adapted to electrically communicate with external circuitry;
an electrode operatively connected to the buried digit line, the electrode including:
a first portion formed in an insulative layer having an upper surface;
a second portion overlying the first portion, wherein the insulative layer surrounds a sidewall of the second portion and the second portion does not extend above the upper surface; and
a third portion overlying said second portion and, extending above and below said upper surface of said insulative layer, and including a recess, wherein said first portion and said second portion are different materials, wherein said second portion is a diffusion barrier layer prohibiting diffusion of atoms between said first and said third portions.

14. The integrated circuit structure of claim 13, wherein the buried digit line includes at least one from the group consisting essentially of $WSi_x$ and TiN.

15. The integrated circuit structure of claim 13, wherein the buried digit line includes a patterned digit line conductive layer and a patterned strapping layer adapted to reduce an overall resistance of the digit line.

16. An integrated circuit structure, comprising:
a digit line;
a capacitor operatively connected to the digit line, the capacitor including an electrode having:
   a first portion formed in an insulative layer having an upper surface;
   a second portion overlying the first portion, wherein said insulative layer surrounds a sidewall of said second portion and said second portion does not extend above the upper surface; and
   a third portion overlying said second portion and, extending above and below said upper surface of said insulative layer, and including a recess, wherein said first portion and said second portion are different materials, wherein said third portion is an oxidation resistant layer.

17. The integrated circuit structure of claim 16, wherein said insulative layer surrounds a lower sidewall of said third portion.

18. The integrated circuit structure of claim 16, wherein the digit line is adapted to connected to an address producing circuit of a memory device, and wherein the capacitor is a storage device for the memory device.

19. The integrated circuit structure of claim 18, wherein the memory device is a random access memory.

20. The integrated circuit structure of claim 16, wherein the digit line includes $WSi_x$.

21. The integrated circuit structure of claim 16, wherein the digit line includes TiN.

22. The integrated circuit structure of claim 16, wherein the capacitor includes a dielectric layer overlying the third portion; and a cell plate electrode overlying the dielectric layer.

23. The integrated circuit structure of claim 16, wherein the capacitor is operatively connected to the digit line through a transistor.

24. An integrated circuit structure, comprising:
a digit line;
a capacitor operatively connected to the digit line, the capacitor including an electrode having:
   a contact formed in an insulative layer having an upper surface;
   a diffusion barrier portion overlying said contact, said insulative layer surrounding a sidewall of said diffusion barrier portion and said diffusion barrier portion not extending above said upper surface; and
   an oxidation resistant portion overlying said diffusion barrier portion and, extending above and below said upper surface of said insulative layer, and including a recess, said diffusion barrier portion configured to inhibit diffusion of atoms between said contact and said oxidation resistant portion.

25. The integrated circuit structure of claim 24, wherein the digit line includes $WSi_x$.

26. The integrated circuit structure of claim 24, wherein the digit line includes TiN.

27. The integrated circuit structure of claim 24, wherein the capacitor includes a dielectric layer overlying the third portion; and a cell plate electrode overlying the dielectric layer.

28. The integrated circuit structure of claim 27, wherein the first portion of the electrode is operatively connected to the digit line through a transistor.

29. The integrated circuit structure of claim 24, wherein the buried digit line includes a patterned digit line conductive layer and a patterned strapping layer adapted to reduce an overall resistance of the digit line.

30. An integrated circuit structure, comprising:
a digit line including at least one from the group consisting essentially of $WSi_x$ and TiN;
a capacitor operatively connected to the digit line, the capacitor including an electrode having:
   a first portion formed in an insulative layer having an upper surface;
   a second portion overlying the first portion, wherein said insulative layer surrounds a sidewall of said second portion and said second portion does not extend above the upper surface; and
   a third portion overlying said second portion, extending above and below said upper surface of said insulative layer, and including a recess, wherein said first portion and said second portion respectively consist essentially of polysilicon and tantalum.

31. The integrated circuit structure of claim 30, wherein the third portion consists essentially of platinum.

32. The integrated circuit structure of claim 11, wherein the insulative layer is a single layer.

* * * * *